United States Patent
Miyata

(10) Patent No.: US 8,912,092 B2
(45) Date of Patent: Dec. 16, 2014

(54) METHOD OF FORMING SEMICONDUCTOR DEVICE WITH A CONTACT PLUG FORMED BY CHEMICAL MECHANICAL POLISHING

(75) Inventor: Kyoko Miyata, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 378 days.

(21) Appl. No.: 13/276,781

(22) Filed: Oct. 19, 2011

(65) Prior Publication Data

US 2013/0034957 A1 Feb. 7, 2013

(30) Foreign Application Priority Data

Aug. 3, 2011 (JP) ................................. 2011-170208

(51) Int. Cl.
*H01L 21/4763* (2006.01)
*H01L 21/768* (2006.01)
*H01L 27/108* (2006.01)
*H01L 49/02* (2006.01)
*H01L 21/321* (2006.01)

(52) U.S. Cl.
CPC ...... *H01L 21/7684* (2013.01); *H01L 27/10894* (2013.01); *H01L 28/91* (2013.01); *H01L 21/3212* (2013.01); *H01L 27/10885* (2013.01); *H01L 27/10876* (2013.01); *H01L 27/10855* (2013.01); *H01L 27/10814* (2013.01)
USPC ........... 438/633; 438/622; 438/626; 438/631; 438/637; 257/E21.244; 257/E21.304; 257/E21.579; 257/E21.584

(58) Field of Classification Search
CPC ................... H01L 21/76807; H01L 21/76836; H01L 21/7684; H01L 21/76877; H01L 21/76819; H01L 21/3212; H01L 21/76802; H01L 21/76843

USPC .......................... 438/637, 622, 626, 631, 633
See application file for complete search history.

(56) References Cited

U.S. PATENT DOCUMENTS

| | | | |
|---|---|---|---|
| 6,191,027 B1 * | 2/2001 | Omura | 438/627 |
| 6,744,089 B2 * | 6/2004 | Wu | 257/301 |
| 7,196,010 B2 | 3/2007 | Park et al. | |
| 7,407,886 B2 * | 8/2008 | Che | 438/672 |
| 7,723,234 B2 * | 5/2010 | Babu et al. | 438/693 |
| 2004/0266166 A1 * | 12/2004 | Song | 438/618 |
| 2006/0108326 A1 * | 5/2006 | Dysard et al. | 216/88 |
| 2009/0280724 A1 * | 11/2009 | Bian | 451/41 |

FOREIGN PATENT DOCUMENTS

| | | |
|---|---|---|
| JP | 2002-305167 | 10/2002 |
| JP | 2005072238 | 3/2005 |

* cited by examiner

*Primary Examiner* — Thao X Le
*Assistant Examiner* — Eric Jones
(74) *Attorney, Agent, or Firm* — Young & Thompson

(57) ABSTRACT

A method of forming a semiconductor device may include, but is not limited to, the following processes. A multi-layered structure is prepared over a semiconductor substrate. The multi-layered structure may include, but is not limited to, first and second patterns of a first insulating film, a second insulating film covering the first pattern of the first insulating film, and a first conductive film covering the second pattern of the first insulating film. The second insulating film and the first conductive film are polished under conditions that the first and second insulating films are greater in polishing rate than the first conductive film, to expose the first and second patterns of the first insulating film.

20 Claims, 94 Drawing Sheets

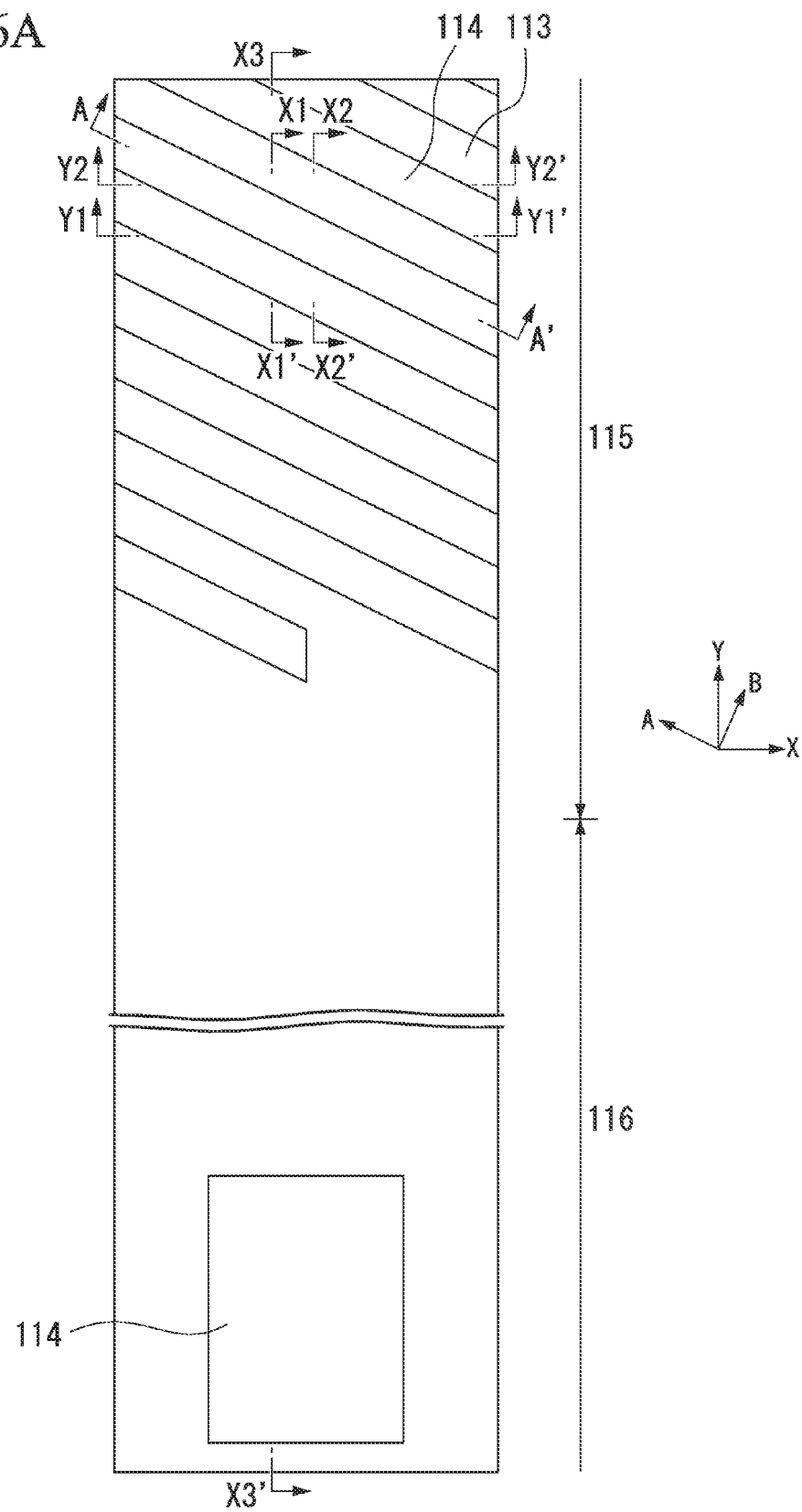

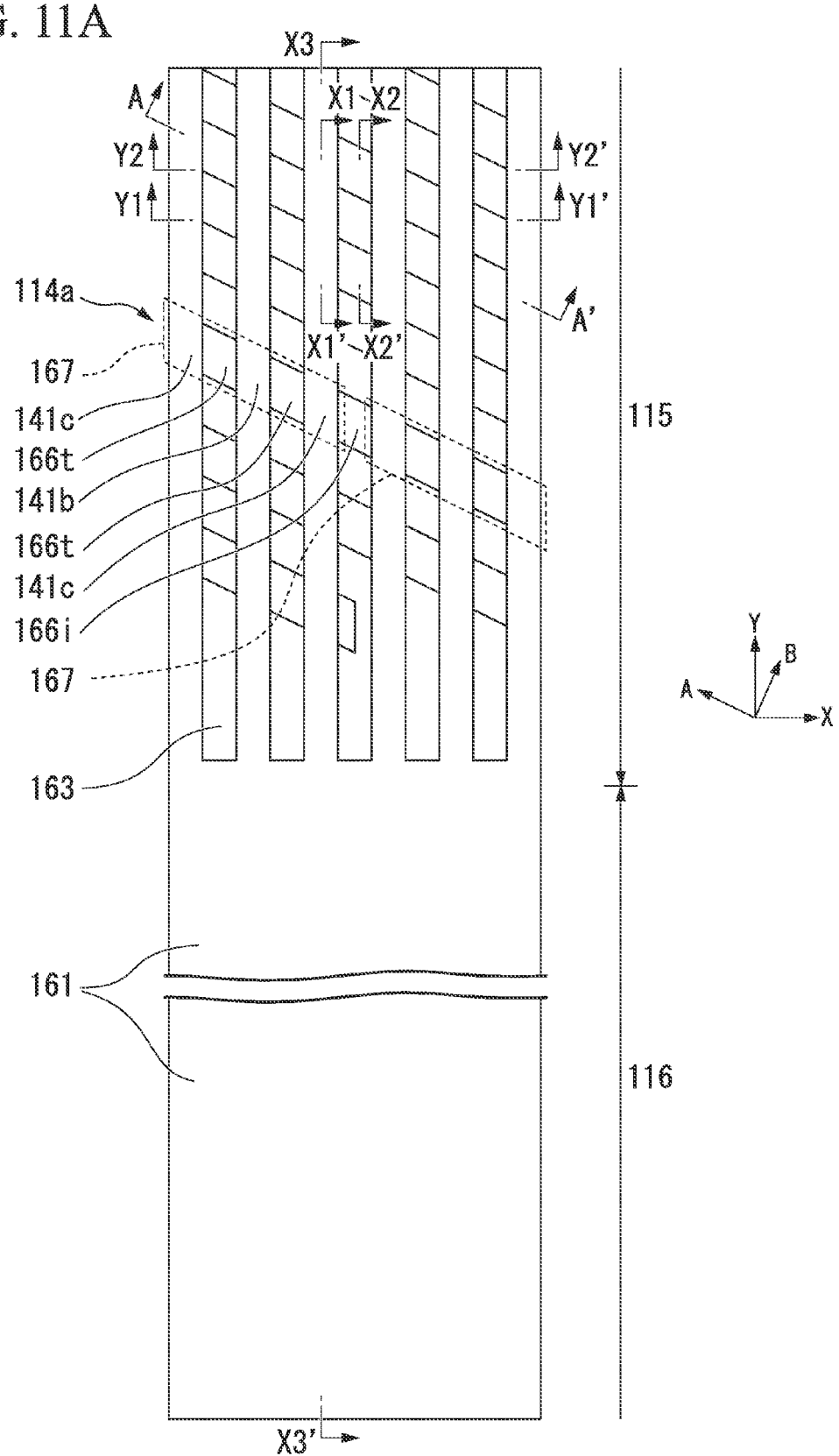

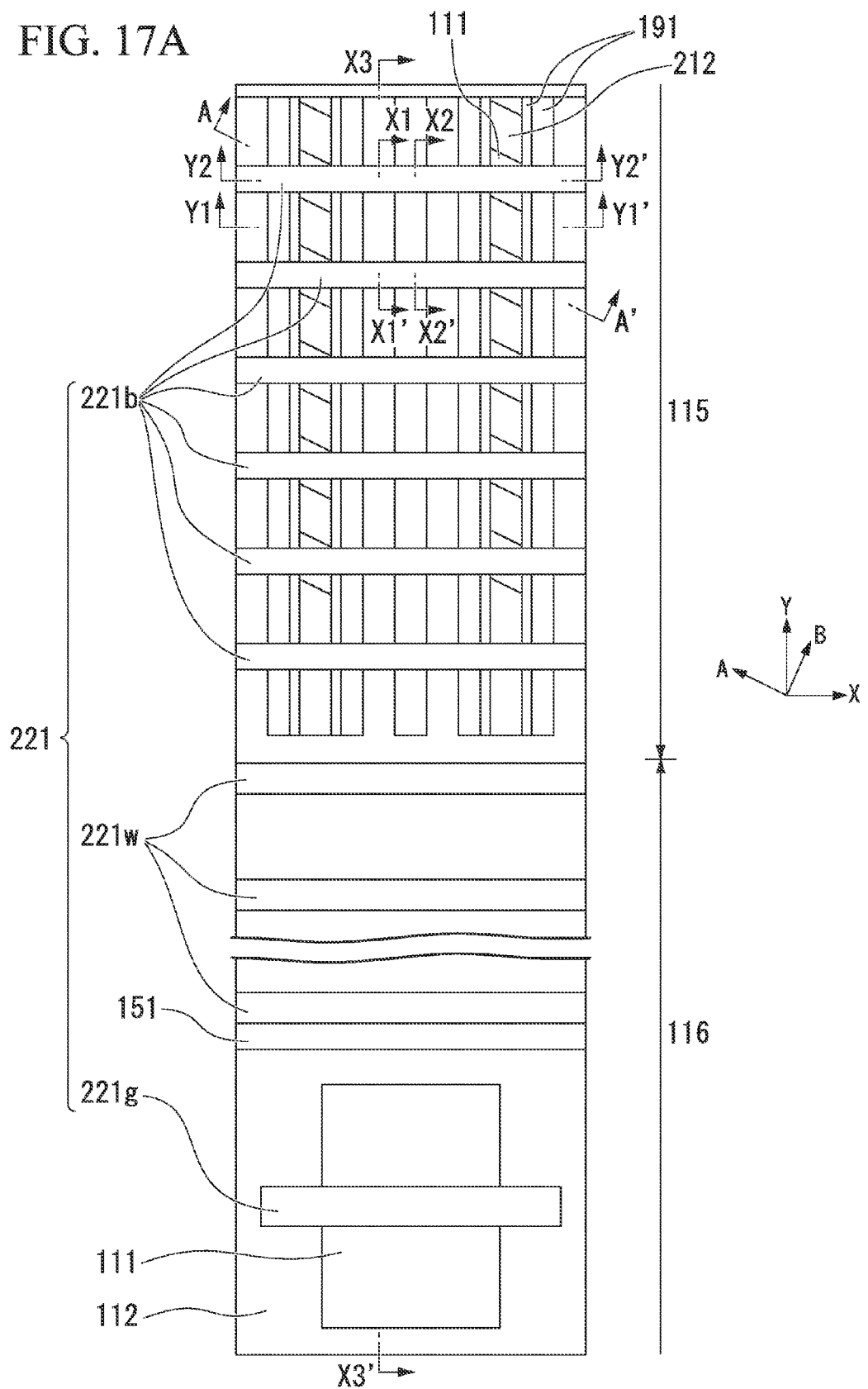

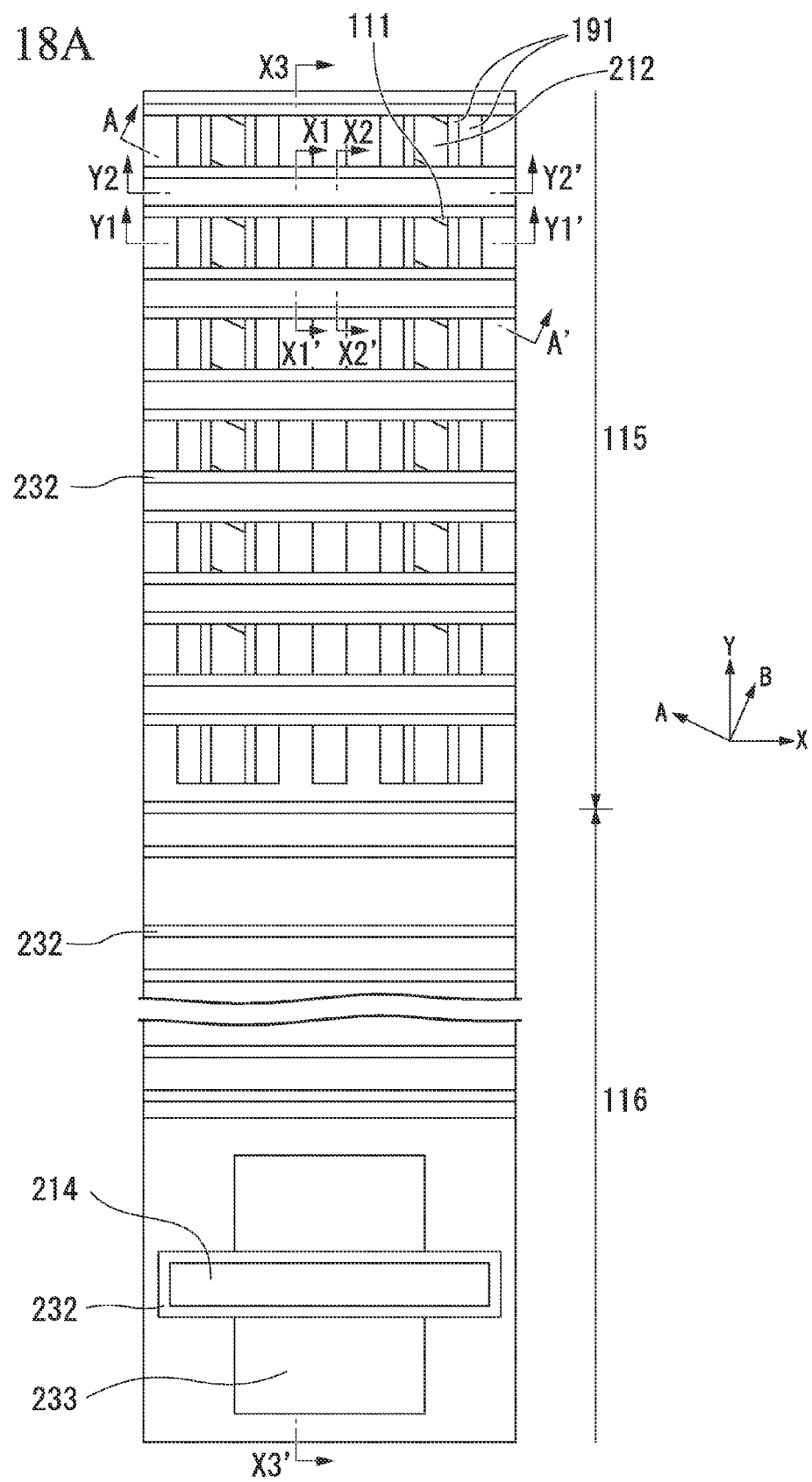

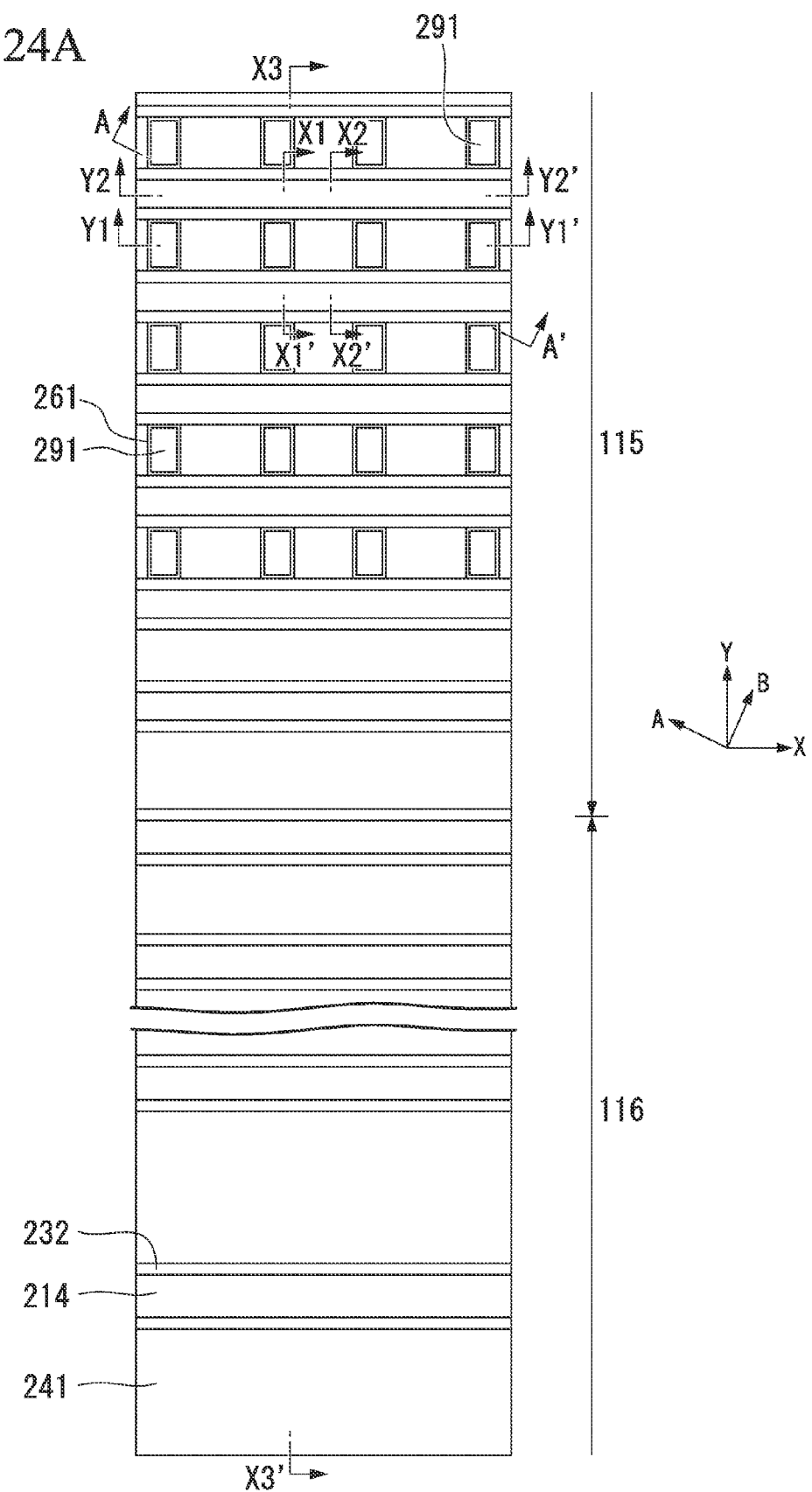

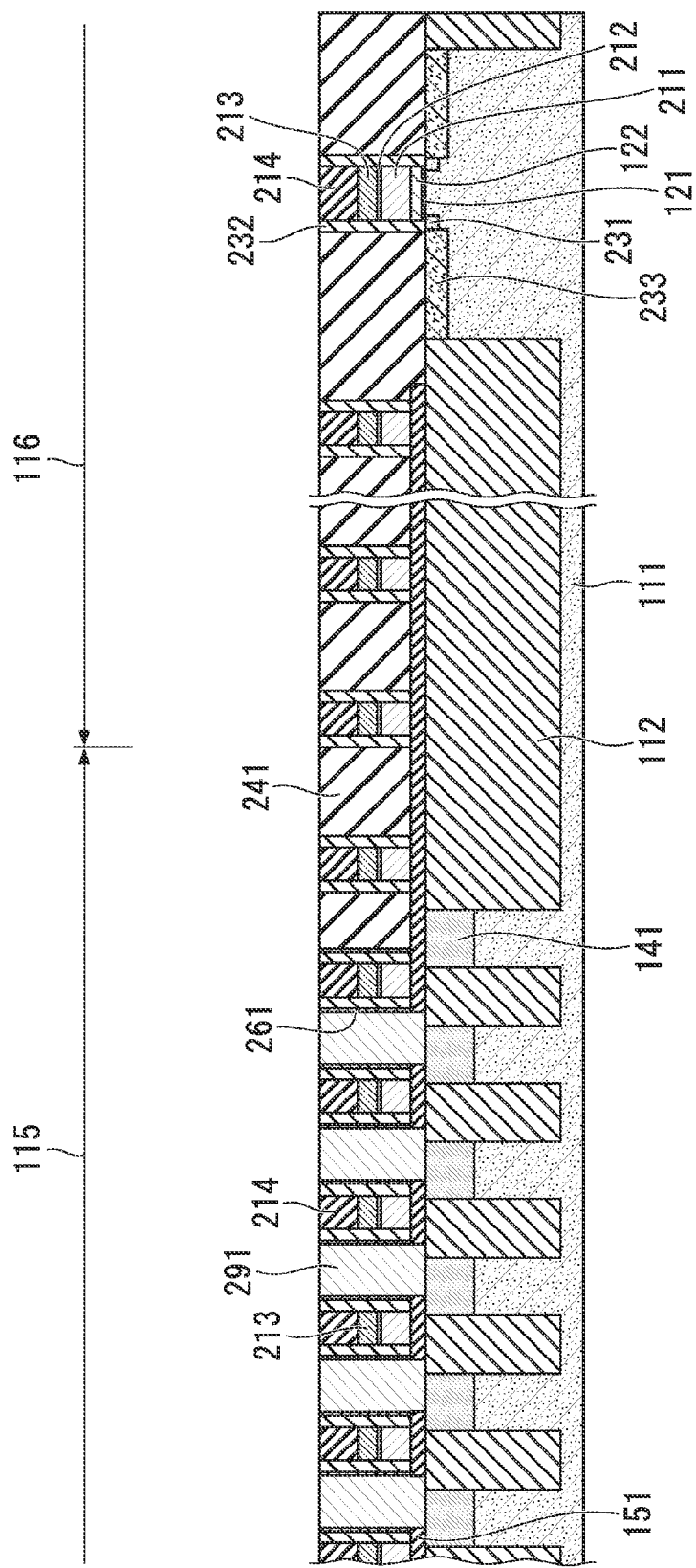

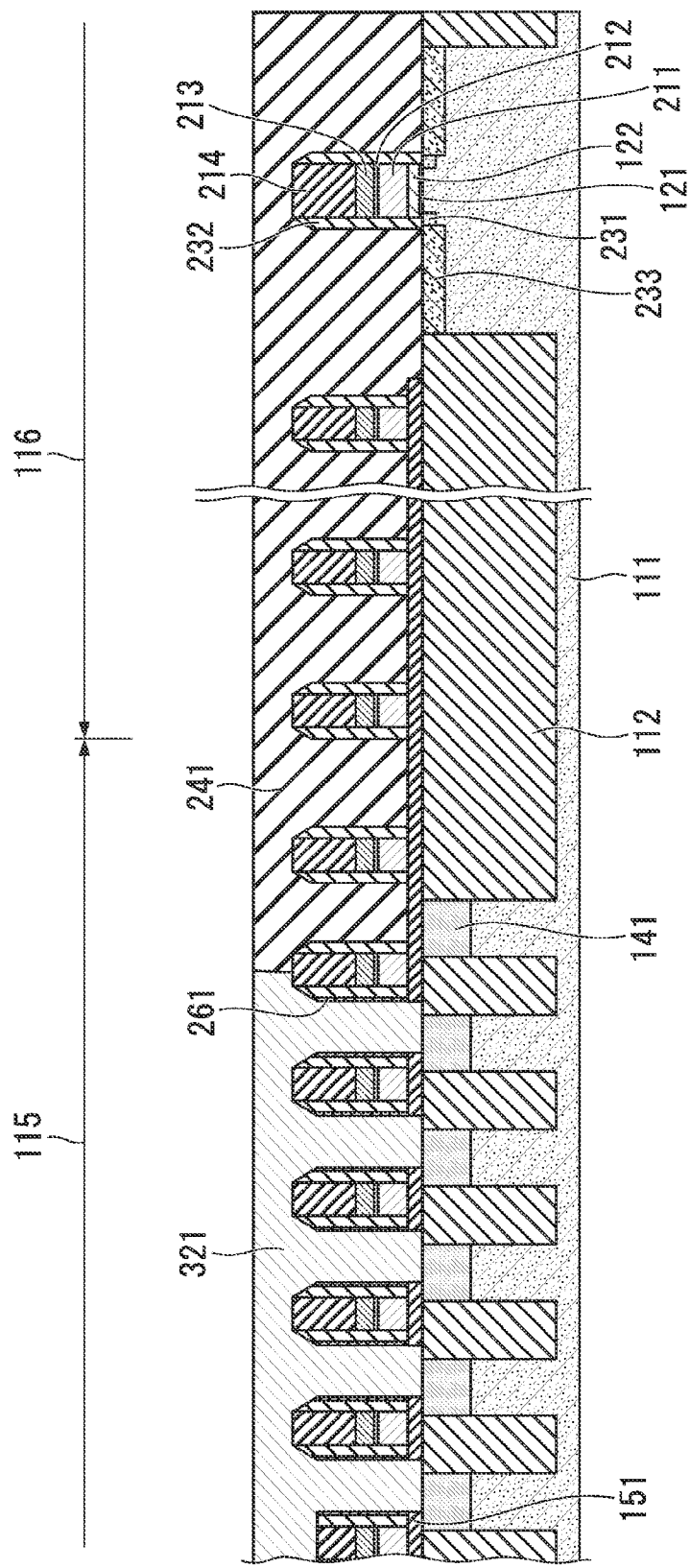

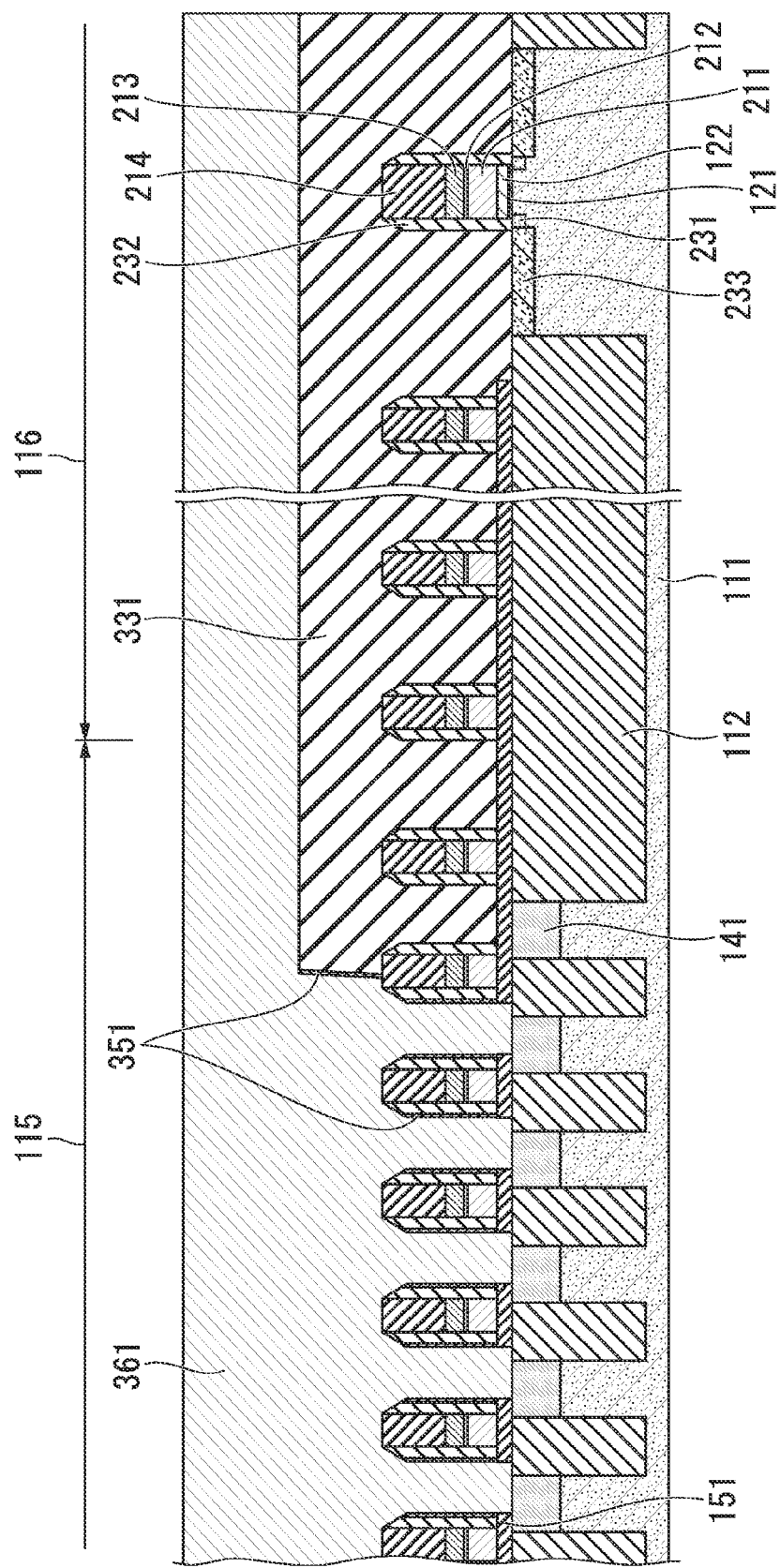

METHOD OF FORMING SEMICONDUCTOR DEVICE WITH A CONTACT PLUG FORMED BY CHEMICAL MECHANICAL POLISHING

BACKGROUND OF THE INVENTION

1. Field of the Invention

The present invention generally relates to a method of forming a semiconductor device. More specifically, the present invention relates to a method for manufacturing a semiconductor device that includes a step of forming a contact plug by chemical mechanical polishing (CMP).

Priority is claimed on Japanese Patent Application No. 2011-170208, filed Aug. 3, 2011, the content of which is incorporated herein by reference.

2. Description of the Related Art

A transistor is a typical semiconductor device, and planar structured transistors use the surface of a semiconductor substrate as a channel. In recent years, however, with the shrinking of semiconductor devices, it has become difficult to suppress the short channel effect in planar structured transistors, making it impossible to obtain the target transistor characteristics. Trench gate type transistors that use the surface of a trench formed within the semiconductor substrate have been widely used recently to solve the problem of the short channel effect.

Trench gate transistors are used also in DRAMs (dynamic random access memories). A trench gate transistor used in a DRAM (hereinafter DRAM transistor) is constituted by a memory cell region (hereinafter a cell region) and a peripheral circuit region. The cell region is partitioned into a plurality of cells by gate electrodes that function as word lines and bit lines formed in a direction that intersects the word lines. A contact plug that connects the semiconductor substrate with the upper interconnects is formed at each cell. Interconnects such as the word lines and bit lines and the contact plugs are formed, with respect to the minimum process dimension F of the semiconductor manufacturing equipment, with a size of approximately F, an integral multiple of F, or an integral fraction of F. A peripheral circuit region is provided in the area surrounding the cell region of a DRAM transistor. Circuitry to select a specific word line and bit line, and circuitry to control the voltages applied to the word lines and bit lines are built in the peripheral circuit region.

The minimum process dimension F of semiconductor manufacturing equipment is shrinking with the passage of time, and the density of the contact plugs in DRAM transistors is increasing. One method of forming densely spaced contact plugs is that of forming a hole-shaped aperture mask in the drain diffusion layer by a lithography process step, and forming an aperture part in an interlayer film over the drain diffusion layer by an etching step. Next, a conductive film of polysilicon or the like is filled into the aperture part, and CMP is used to polish the interlayer film and the conductive film.

Several proposals have already been made for such a semiconductor device surface polishing method that uses CMP.

Japanese Patent Application Publication No. JPA 2005-722238 discloses a polishing method whereby the polishing rates of an insulating film of the semiconductor device and polysilicon are controlled by fumed silica, ammonium hydroxide, and potassium hydroxide. According to this polishing method, even if damage occurs to the insulating film of the transistor during polishing, it is possible to suppress the occurrence of shorts and the like, and to form capacitor plugs that have uniform heights.

Japanese Patent Application Publication No. JPA 2002-305167 discloses a slurry and a polishing method wherein, the rate of removal of a silicon oxide film and a silicon nitride film is made smaller than with respect to the polysilicon of the semiconductor substrate, or the rate of removal of a silicon nitride film is made higher than that of the silicon oxide film. By using this polishing liquid, it is possible, while maintaining a high rate of removal of the polysilicon layer, to reduce the polishing rate of the silicon oxide film and silicon nitride film that are removed together with the polysilicon film.

U.S. Pat. No. 7,196,010 discloses a polishing method using a slurry that improves the selectivity ratio by making the silicon oxide film surface hydrophilic and making the polysilicon surface hydrophobic. According to the polishing method using this slurry, there is a great improvement in the selectivity ratio between the oxide film and the polysilicon film during polishing, and it is easy to achieve planarization within the cell.

SUMMARY

In an embodiment, a method of forming a semiconductor device may include, but is not limited to, the following processes. A first interconnect structure is formed over a semiconductor substrate. The first interconnect structure may include, but is not limited to, a first interconnect and a first insulating film. The first insulating film covers the first interconnect. A second insulating film is formed which covers the first interconnect structure and the semiconductor substrate. A first opening is formed in the second insulating film. The opening exposes the first interconnect structure and the semiconductor substrate. A first conductive film is formed in the first opening and over the second insulating film. A chemical mechanical polishing process is carried out, to form a first contact plug in the first opening, under condition that a first polishing rate of the first insulating film is greater than a second polishing rate of the first conductive film, and that a third polishing rate of the second insulating film is greater than the second polishing rate of the first conductive film.

In another embodiment, a method of forming a semiconductor device may include, but is not limited to, the following processes. A multi-layered structure is prepared over a semiconductor substrate. The multi-layered structure may include, but is not limited to, first and second patterns of a first insulating film, a second insulating film covering the first pattern of the first insulating film, and a first conductive film covering the second pattern of the first insulating film. The second insulating film and the first conductive film are polished under conditions that the first and second insulating films are greater in polishing rate than the first conductive film, to expose the first and second patterns of the first insulating film.

In still another embodiment, a method of forming a semiconductor device may include, but is not limited to, the following processes. First and second interconnect structures are formed in a memory cell region and a peripheral region respectively of a semiconductor substrate. The first interconnect structure may include, but is not limited to, a first interconnect and a first pattern of a first insulating film. The first pattern of the first insulating film covers the first interconnect. The second interconnect structure may include, but is not limited to, a second interconnect and a second pattern of the first insulating film. The second pattern of the first insulating film covers the second interconnect. A second insulating film is formed over the first and second interconnect structures and over the semiconductor substrate. A first opening is formed in the second insulating film. The first opening exposes the first interconnect structure and a part of the semiconductor substrate. A first conductive film is formed in the first opening and over the second insulating film. The first conductive film is etched to remove the first conductive film over the second insulating film and to have the first conductive film remain in the first opening, so that a top surface of the first conductive film is higher than top surfaces of the first and second interconnect structures and lower than a top surface of the second insulating film. A third insulating film is formed over the first conductive film and over the second insulating film. The third insulating film is etched back to form side walls of the third insulating film on side wall surfaces of the second insulating film. The first conductive film is selectively removed by using the side walls of the third insulating film as masks to have the first conductive film remain on side wall surfaces of the second insulating film to expose a part of the semiconductor substrate and to form a second opening in the first conductive film. A fourth insulating film is formed in the second opening and over the second insulating film. A chemical mechanical polishing process is carried out to polish the second, third and fourth insulating films and the first conductive film to expose the first and second patterns of the first insulating films, to form a contact plug in the first opening. The chemical mechanical polishing process is carried out under conditions that the first, second, third and fourth insulating films are greater in polishing rate than the first conductive film.

BRIEF DESCRIPTION OF THE DRAWINGS

The above features and advantages of the present invention will be more apparent from the following description of certain preferred embodiments taken in conjunction with the accompanying drawings, in which:

FIG. 6A is a fragmentary plain view of a step involved in a method of forming a semiconductor device of FIGS. 1-5, in accordance with a first preferred embodiment of the present invention;

FIG. 11A is a fragmentary plain view of a step, subsequent to the step of FIG. 10, involved in the method of forming the semiconductor device of FIGS. 1-5, in accordance with the first preferred embodiment of the present invention;

FIG. 17A is a fragmentary plain view of a step, subsequent to the step of FIGS. 16A through 16C, involved in the method of forming a semiconductor device of FIGS. 1-5, in accordance with the first preferred embodiment of the present invention;

FIG. 18A is a fragmentary plain view of a step, subsequent to the step of FIGS. 17A through 17C, involved in the method of forming a semiconductor device of FIGS. 1-5, in accordance with the first preferred embodiment of the present invention;

FIG. 24A is a fragmentary plain view of a step, subsequent to the step of FIGS. 23A through 23C, involved in the method of forming a semiconductor device of FIGS. 1-5, in accordance with the first preferred embodiment of the present invention;

FIG. 24D is a fragmentary cross sectional elevation view of the same step as in FIG. 24A, in accordance with the first preferred embodiment of the present invention;

FIG. 26C is a fragmentary cross sectional elevation view of the same step as in FIG. 26A, in accordance with the second preferred embodiment of the present invention;

FIG. 31C is a fragmentary cross sectional elevation view of the same step as in FIG. 31A, in accordance with the second preferred embodiment of the present invention;

FIG. 38E is a fragmentary cross sectional elevation view of the same step as in FIG. 38A, in accordance with the third preferred embodiment of the present invention;

FIG. 39A is a fragmentary plain view of a step, subsequent to the step of FIGS. 38A through 38E, involved in the method of forming the semiconductor device, in accordance with the third preferred embodiment of the present invention;

FIG. 39B is a fragmentary cross sectional elevation view of the same step as in FIG. 39A, taken along an Y1-Y1' line of FIG. 39A, in accordance with the third preferred embodiment of the present invention;

FIG. 39C is a fragmentary cross sectional elevation view of the same step as in FIG. 39A, taken along an X1-X1' line of FIG. 39A, in accordance with the third preferred embodiment of the present invention; and FIG. 40 is a graph showing steps at different positions over a wafer in Example 1 of the present invention and a Comparative Example 1.

DETAILED DESCRIPTION OF THE PREFERRED EMBODIMENTS

Figure 1:
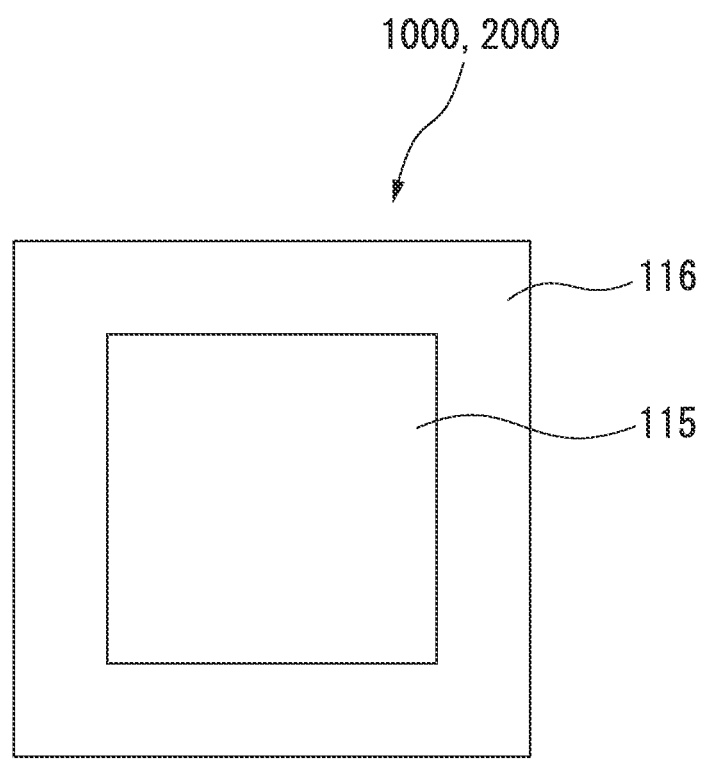
FIG. 1 is a plan view of a semiconductor device in accordance with a first preferred embodiment of the present invention.

Before describing the present invention, the related art will be explained, in order to facilitate the understanding of the present invention.

In manufacturing a DRAM transistor, the planarization of the cell region and the peripheral circuit region by a polishing step that uses CMP is important. This is because, if a step occurs between the cell region and the peripheral circuit region, when a thin film is subsequently formed, there are problems such as localized partial thinness of the thin film, a tendency for the occurrence of shorts or opens of interconnects or in locations at which the insulation is poor, or localized lens out-of-focus parts in the optics system used for lithographic exposure.

If contact plugs are formed using the above-described conventional polishing methods, in the case in which the polishing rate of the conductive film forming the contact plug is higher than the polishing rate of the parts other than the conductive film (interlayer films, capacitor films, and the like), erosion occurs of the cell region, causing it to sink with respect to the flat surface (hereinafter, the flat surface part) in which mainly peripheral circuit region contact plugs are not formed.

The occurrence of this erosion phenomenon is thought to be caused by the polishing rate of the interlayer film, capacitor film, and the like in the area surrounding the apertures for formation of contact plugs in which a conductive film is buried being larger than the polishing rate of the interlayer film, capacitor film, and the like in the flat surface part in which contact plug apertures are not formed, so that the overall cell region in which contact plugs are formed is rapidly polished.

In the manufacturing of a transistor, which is a semiconductor device, if erosion occurs and the cell region takes on a sunken shape with respect to the flat surface part, in an interconnect formation process step performed after a CMP polishing process step, when performing patterning by lithography, the focal point depth of the lens of the exposure optical system is different between the cell region and the peripheral circuit region. As a result, there is the problem of difficulty in forming micropatterns in the cell region.

Also, the sinking depth of the cell region becomes large in the central region of the cell region, and is small at the edge part of the cell region. Under such conditions, if an appropriate amount of polishing is done at the edge parts of the cell region in order to separate the conductive film that will become the contact plugs into individual conductive films, the amount of polishing done at the central part of the cell region is excessive. As a result, there is the problem of exposure of the bit lines and the like at the surface of the semiconductor device.

None of the above described patent publications disclose the occurrence of erosion with polishing by such as CMP, nor do they indicate a solution for the problem.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In an embodiment, a method of forming a semiconductor device may include, but is not limited to, the following processes. A first interconnect structure is formed over a semiconductor substrate. The first interconnect structure may include, but is not limited to, a first interconnect and a first insulating film. The first insulating film covers the first interconnect. A second insulating film is formed which covers the first interconnect structure and the semiconductor substrate. A first opening is formed in the second insulating film. The opening exposes the first interconnect structure and the semiconductor substrate. A first conductive film is formed in the first opening and over the second insulating film. A chemical mechanical polishing process is carried out, to form a first contact plug in the first opening, under condition that a first polishing rate of the first insulating film is greater than a second polishing rate of the first conductive film, and that a third polishing rate of the second insulating film is greater than the second polishing rate of the first conductive film.

In some cases, the first interconnect may include, but is not limited to, a first bit line. The first interconnect structure further may include, but is not limited to, a second bit line adjacent to the first bit line. The first opening is positioned between the first and second bit lines.

In some cases, the first polishing rate may be substantially the same as the third polishing rate.

In some cases, carrying out the chemical mechanical polishing process may include, but is not limited to, carrying out first and second chemical mechanical polishing processes. The first chemical mechanical polishing process is carried out to polish the second insulating film and the first conductive film to expose the first insulating film. The first chemical mechanical polishing process is carried out under condition that the third polishing rate of the second insulating film is greater than the second polishing rate of the first conductive film. The second chemical mechanical polishing process is carried out, after carrying out the first chemical mechanical polishing process. The second chemical mechanical polishing process is carried out to polish the first and second insulating films and the first conductive film. The second chemical mechanical polishing process is carried out under condition that the first polishing rate of the first insulating film is greater than the second polishing rate of the first conductive film, and that the third polishing rate of the second insulating film is greater than the second polishing rate of the first conductive film.

In some cases, the method may further include, but is not limited to, etching back the first conductive film so that a top surface of the first conductive film is higher than a top surface of the first insulating film and lower than a top surface of the second insulating film. The etching back is carried out before carrying out the chemical mechanical polishing process.

In some cases, the chemical mechanical polishing process is carried out using a polishing agent which includes at least one of polishing particles, a polymer compound, and an inorganic acid.

In some cases, the polishing particles may further include, but is not limited to, at last one of silica particles, alumina particles, and colloidal particles.

In some cases, the inorganic acid includes one of a nitric acid and a phosphoric acid, and the inorganic acid is in a range of pH from 2 to 3.

In some cases, the first insulating film may include, but is not limited to, a silicon nitride film.

In some cases, the second insulating film may include, but is not limited to, one of a silicon oxide film and a BPSG film.

In some cases, the silicon oxide film may be formed by a chemical vapor deposition method.

In some cases, the silicon oxide film can be formed by a spin-on-dielectric method.

In some cases, the method may further include, but is not limited to, the following processes. The first conductive film is etched back so that a top surface of the first conductive film is higher than a top surface of the first insulating film and lower than a top surface of the second insulating film. A third insulating film is formed over the first conductive film and the second insulating film. The third insulating film is etched back to form side walls of the third insulating film on side surfaces of the second insulating film. A second opening is formed in the first conductive film to have the first conductive film remain on side walls of the second insulating film. The second opening exposes the semiconductor substrate. A fourth insulating film is formed in the second opening and over the second insulating film and the side walls of the third insulating film.

In some cases, carrying out the chemical mechanical polishing process to form the contact plug may further include, but is not limited to, carrying out the chemical mechanical polishing process for polishing the second, third and fourth insulating films and the first conductive film to expose the first insulating film. The chemical mechanical polishing process is carried out under conditions that the first polishing rate of the first insulating film, the third polishing rate of the second insulating film, a fourth polishing rate of the third insulating film and a fifth polishing rate of the fourth insulating film are greater than the second polishing rate of the first conductive film.

In another embodiment, a method of forming a semiconductor device may include, but is not limited to, the following processes. A multi-layered structure is prepared over a semiconductor substrate. The multi-layered structure may include, but is not limited to, first and second patterns of a first insulating film, a second insulating film covering the first pattern of the first insulating film, and a first conductive film covering the second pattern of the first insulating film. The second insulating film and the first conductive film are polished under conditions that the first and second insulating films are greater in polishing rate than the first conductive film, to expose the first and second patterns of the first insulating film.

In some cases, polishing the second insulating film and the first conductive film may include, but is not limited to, first and second chemical mechanical polishing processes. The first chemical mechanical polishing process is carried out to polish the second insulating film and the first conductive film under condition that the second insulating film is greater in polishing rate than the first conductive film. The second chemical mechanical polishing process is carried out after carrying out the first chemical mechanical polishing process. The second chemical mechanical polishing process is carried out to polish the first and second insulating films and the first conductive film under condition that the first and second insulating films are greater in polishing rate than the first conductive film.

In some cases, the method may further include, but is not limited to, etching back the first conductive film so that a top surface of the first conductive film is higher than top surfaces of the first and second patterns of the first insulating film and is lower than a top surface of the second insulating film. Etching back the first conductive film is carried out before polishing the second insulating film and the first conductive film.

In some cases, preparing the multi-layered structure may further include, but is not limited to, the following processes. First and second interconnect patterns are formed over the semiconductor substrate. The first interconnect pattern includes a first interconnect and the first pattern of the first insulating film. The second interconnect pattern includes a second interconnect and the second pattern of the first insulating film. The first and second patterns of the first insulating film cover the first and second interconnects, respectively. The second insulating film is formed over the first and second interconnect patterns and over the semiconductor substrate. A first opening is formed in the second insulating film. The first opening exposes the second interconnect pattern. The first conductive film is formed in the first opening. The first conductive film covers the second interconnect pattern.

In some cases, the first insulating film may include, but is not limited to, a silicon nitride film, and the second insulating film may include, but is not limited to, one of a silicon oxide film and a BPSG film.

In still another embodiment, a method of forming a semiconductor device may include, but is not limited to, the following processes. First and second interconnect structures are formed in a memory cell region and a peripheral region respectively of a semiconductor substrate. The first interconnect structure may include, but is not limited to, a first interconnect and a first pattern of a first insulating film. The first pattern of the first insulating film covers the first interconnect. The second interconnect structure may include, but is not limited to, a second interconnect and a second pattern of the first insulating film. The second pattern of the first insulating film covers the second interconnect. A second insulating film is formed over the first and second interconnect structures and over the semiconductor substrate. A first opening is formed in the second insulating film. The first opening exposes the first interconnect structure and a part of the semiconductor substrate. A first conductive film is formed in the first opening and over the second insulating film. The first conductive film is etched to remove the first conductive film over the second insulating film and to have the first conductive film remain in the first opening, so that a top surface of the first conductive film is higher than top surfaces of the first and second interconnect structures and lower than a top surface of the second insulating film. A third insulating film is formed over the first conductive film and over the second insulating film. The third insulating film is etched back to form side walls of the third insulating film on side wall surfaces of the second insulating film. The first conductive film is selectively removed by using the side walls of the third insulating film as masks to have the first conductive film remain on side wall surfaces of the second insulating film to expose a part of the semiconductor substrate and to form a second opening in the first conductive film. A fourth insulating film is formed in the second opening and over the second insulating film. A chemical mechanical polishing process is carried out to polish the second, third and fourth insulating films and the first conductive film to expose the first and second patterns of the first insulating films, to form a contact plug in the first opening. The chemical mechanical polishing process is carried out under conditions that the first, second, third and fourth insulating films are greater in polishing rate than the first conductive film.

Embodiments of the present invention applied to a DRAM, as an example of a semiconductor device, is described in detail below, with references made to the drawings. The dimensional ratios of the constituent elements are not necessary the same as in actuality.

Both the DRAM 1000 and 2000 in the first to third embodiments are constituted by a cell region 115 and a peripheral circuit region 116 surrounding the same as shown in FIG. 1. Memory cells that are collections of unit storage cells are formed in the cell region 115. Peripheral circuits that, for example, appropriately select word lines and bit lines of each DRAM are formed in the peripheral circuit region 116.

First Embodiment

Figure 2:
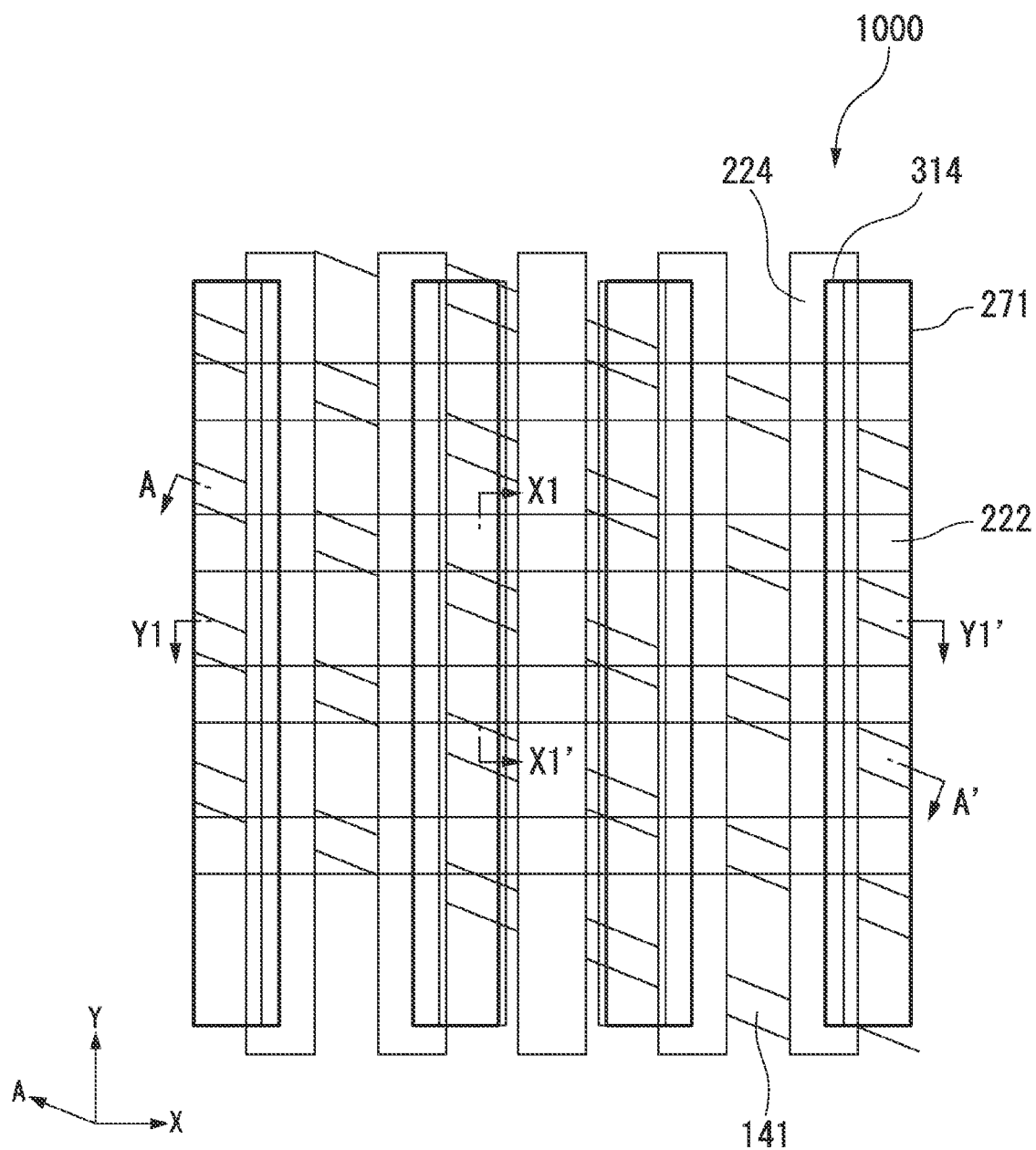
FIG. 2 is a fragmentary plan view of a semiconductor device in accordance with a first preferred embodiment of the present invention.

The constitution of the DRAM 1000, which is an embodiment to which the present invention is applied, will now be described. FIG. 2 shows the main interconnect configuration of the cell region of the DRAM 1000 shown in FIG. 1. Note, however, that FIG. 2 does not show each interconnect capacitor film, separation film, and insulation films such as the interlayer insulating film and the secondary interconnects.

The basic constituent elements of the transistor in DRAM 1000 are a bit line 222 functioning as a word line, a gate electrode 224, a diffusion layer 141 that serves as the source diffusion layer and the drain diffusion layer, a capacitor contact (contact plug) 271, and a capacitor 314.

Figure 3:
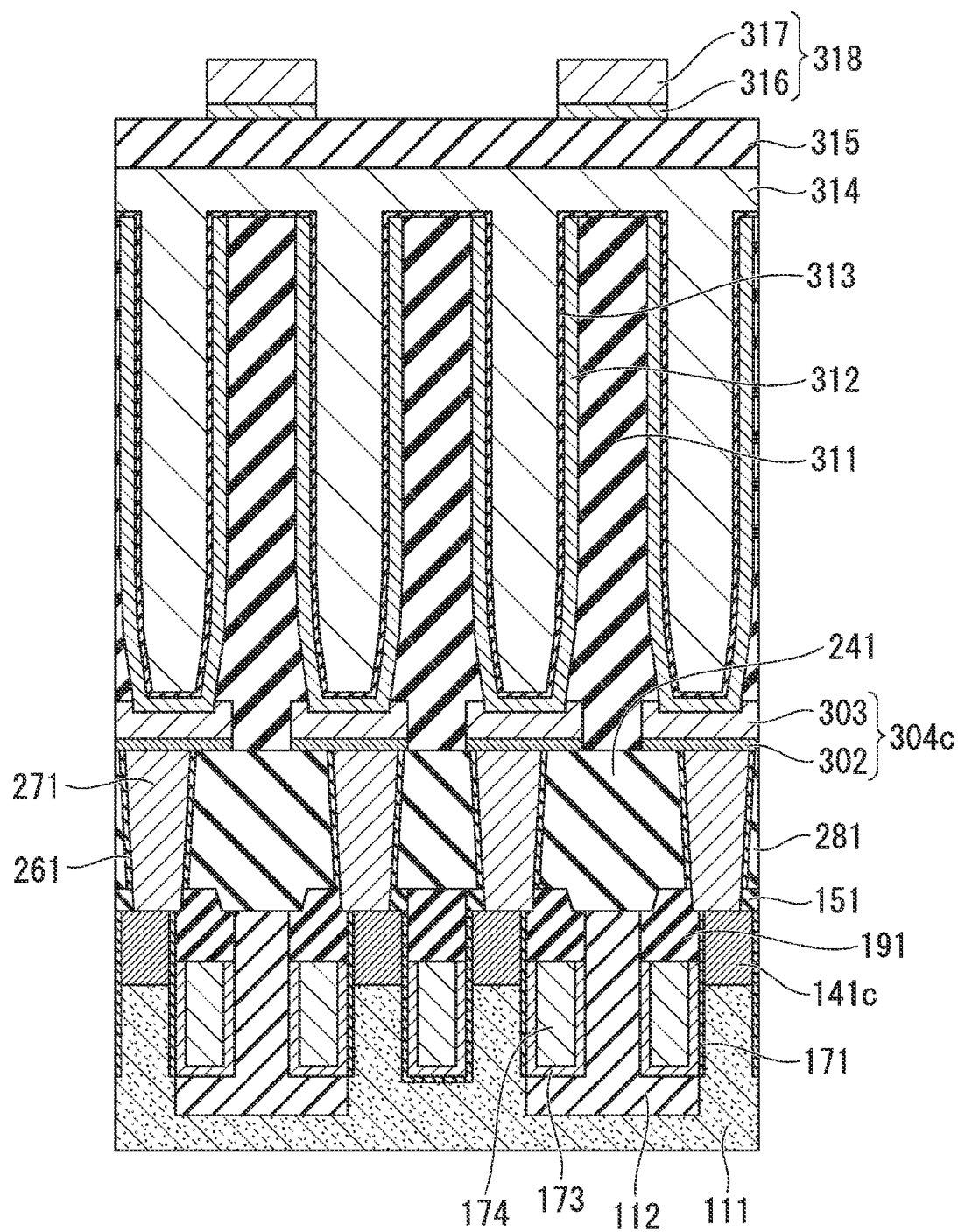
FIG. 3 is a fragmentary cross sectional elevation view, taken along an Y1-Y1' line of FIG. 2, of a semiconductor device in accordance with a first preferred embodiment of the present invention.
Figure 4:
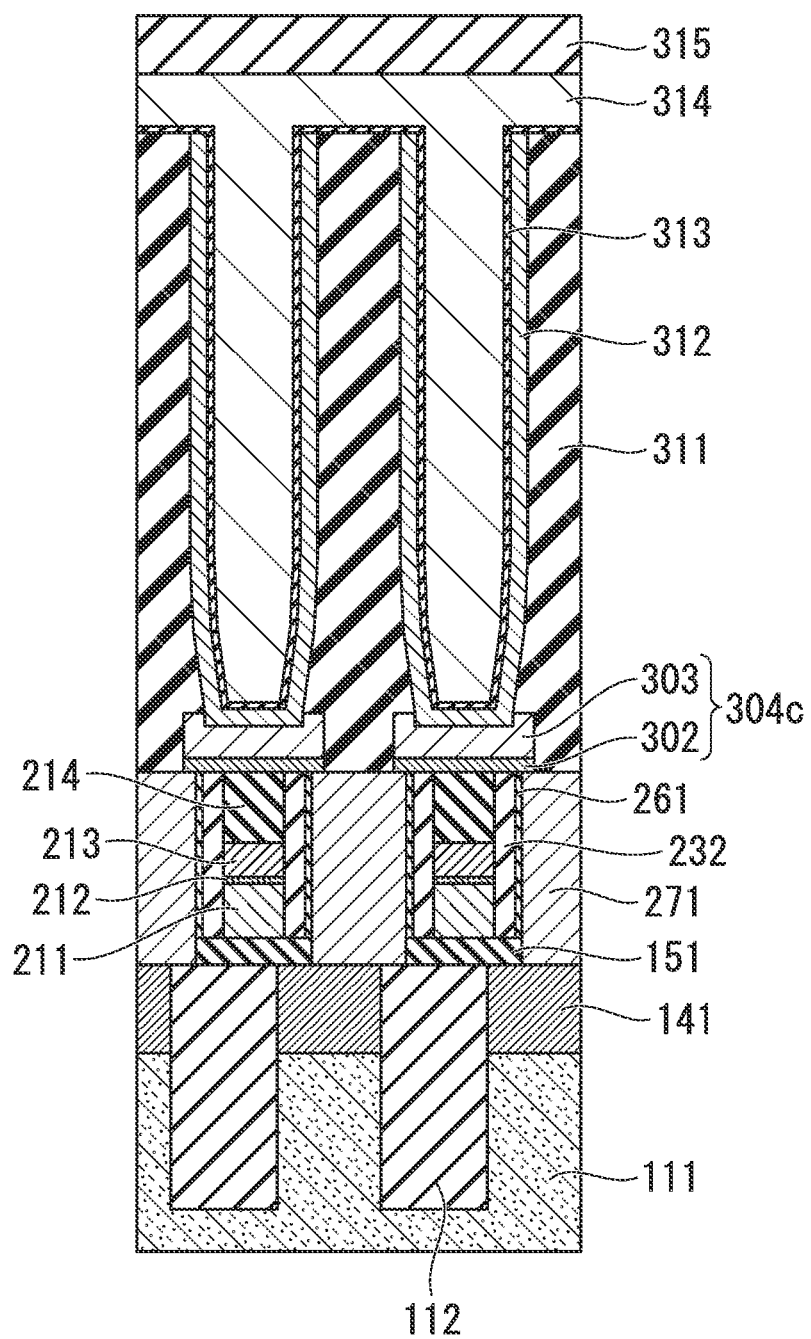
FIG. 4 is a fragmentary cross sectional elevation view, taken along an X1-X1' line of FIG. 2, of a semiconductor device in accordance with a first preferred embodiment of the present invention.
Figure 5:
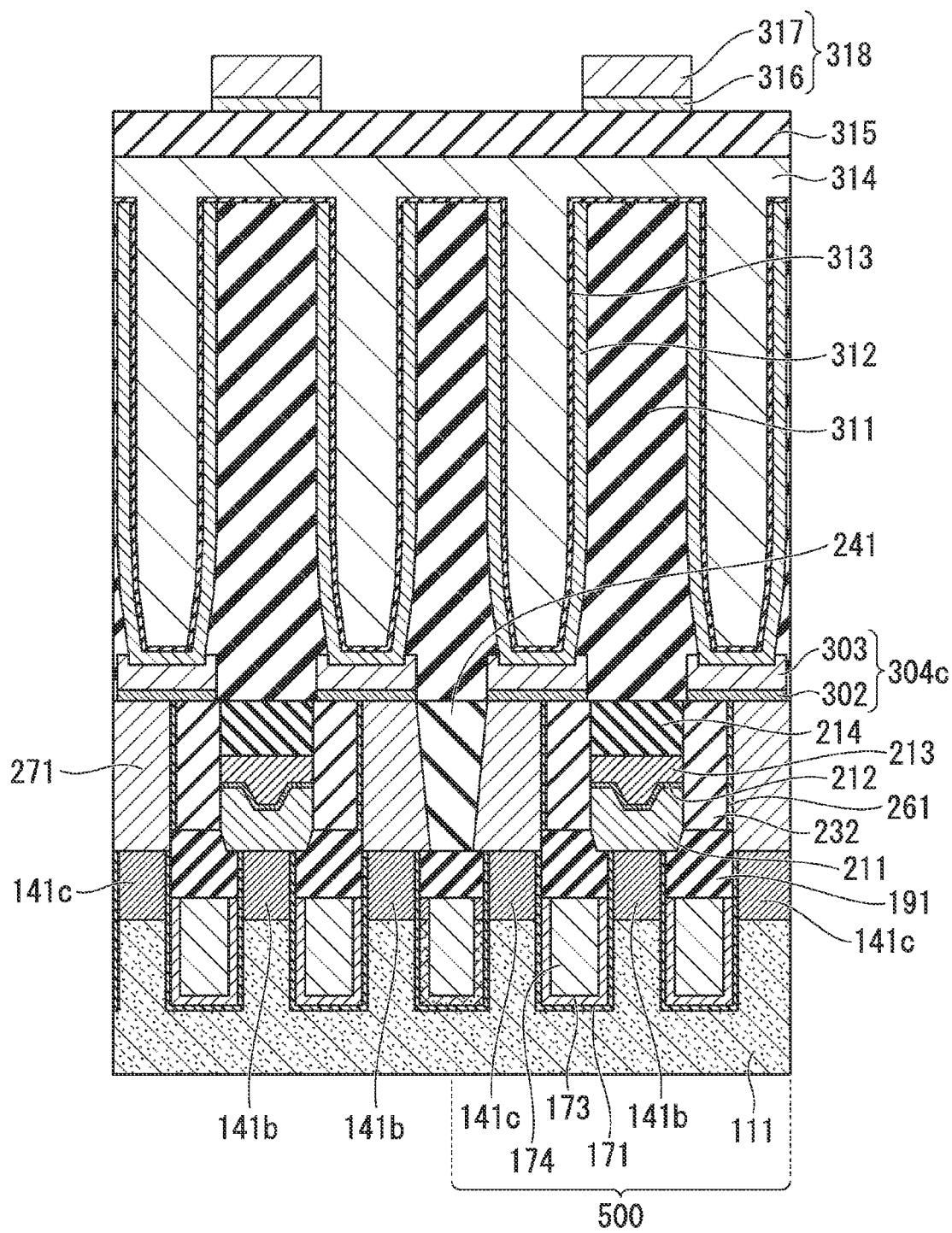
FIG. 5 is a fragmentary cross sectional elevation view, taken along an A-A' line of FIG. 2, of a semiconductor device in accordance with a first preferred embodiment of the present invention.

The cross-sectional structure of the DRAM 1000 along the lines Y1-Y', X1-X1', and A-A' shown in FIG. 2 are shown in FIG. 3, FIG. 4, and FIG. 5, respectively. The main structure of the cell region of the DRAM 1000 will now be described, with reference made to FIG. 5.

FIG. 5 is a cross-sectional view of a region that includes the two active regions 500. A source diffusion layer 141b is formed at the center of each of the active regions 500 over the semiconductor substrate 111. The source diffusion regions 141b is connected to the bit line 222. The bit line 222 is constituted by a silicon film 211 and a bit line tungsten film 213 formed over the silicon film 211. A bit line capacitor film (first insulating film) 214 is formed over the bit line 222. A cell transistor trench is formed on both sides of the source diffusion layers 141b, and a drain diffusion layer 141c is formed on both sides on the outside of the cell transistor trench. A gate titanium nitride film 173 and a gate tungsten film 174 that become the gate electrode 224 are buried within the cell transistor trench with an intervening gate insulating film 171. The gate electrode 224 functions as the word line in the DRAM 1000. An element separation gate trench is formed between the two active regions. The two active regions are separated by an insulating film that is buried in the element separation gate trench. Additionally, drain diffusion layer 141c is connected to a pillar shaped capacitor 314 made of a conductive film via a plug-shaped capacitor contact (contact plug) 271 and a capacitor pad second interconnect 304c. The capacitor contact 271 is separated by a first interlayer film (second insulating film) 241. The DRAM 1000 memory cell is constituted so as to include the gate electrode 224 extending in the X direction, the capacitor 314 extending in the Y direction, and the bit line 222 extending in the Y direction.

Information is stored in the DRAM 1000 by switching of whether or not an electrical charge is stored in the memory cell capacitor 314. The information in each memory cell is "1" if an electrical charge is stored in the capacitor 314, and "0" if an electrical charge is not stored in the capacitor 314.

During a write operation into the DRAM 1000, to write a "1" into a memory cell, with the voltage on the gate electrode 224 (word line) raised from the peripheral circuit region, the voltage on the bit line 222 is raised and the capacitor 314 is charged. The charging and storage of a charge in the capacitor 314 from the bit line via the source diffusion layer 141b, the drain diffusion layer 141c, and the capacitor contact 271 are done to write a "1" although there is no change if it had already been written. To write a "0", with the voltage on the gate electrode 222 raised, the bit line 224 voltage is made zero, and the electrical charge that was stored in the capacitor 314 is discharged via the source diffusion layer 141b, the drain diffusion layer 141c, and the capacitor contact 271.

During an operation to read information stored in the memory cell, the instantaneous potential on the bit line 222 when the voltage of the gate electrode 224 of the memory cell is raised is detected and distinguished by a detection circuit.

If the instantaneous potential on the bit line is raised, "1" is distinguished, and if the potential does not change, "0" is distinguished.

The method of manufacturing the DRAM 1000 will be described in detail, with references made to the drawings.

As shown in FIG. 6A to FIG. 6G, an element separation region 113 made of an element separation film 112 is formed on the surface region of the semiconductor substrate 111. A p-type silicon substrate can be used as the semiconductor substrate 111. A silicon oxide film can be used as the element separation film.

The element formation region 114 is established by the element separation region 113. The element separation region 113 has a shape that extends in the A direction at an inclination from the X direction seen in plan view, and is repeatedly arranged at a prescribed interval in the B direction.

Hereinafter, the region in which memory cells are formed will be referred to as the cell region 115, and the region outside of the cell region 115, in which mainly peripheral circuits and the like are formed, will be referred to as the peripheral circuit region 116.

The element separation region 113 formed in the cell region 115 and the element formation region 114 are formed to a size that the B-direction width is close to the minimum process dimension F of the semiconductor device manufacturing equipment. For example, it is preferable that the widths of the element separation region 113 and the element formation region 114 both be made approximately 40 nm.

Figure 6B:
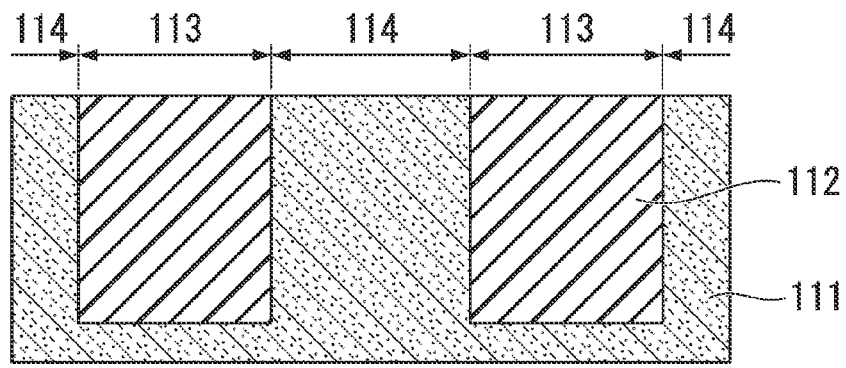
FIG. 6B is a fragmentary cross sectional elevation view of the same step as in FIG. 6A, taken along an Y1-Y1' line of FIG. 6A, in accordance with a first preferred embodiment of the present invention.
Figure 6C:
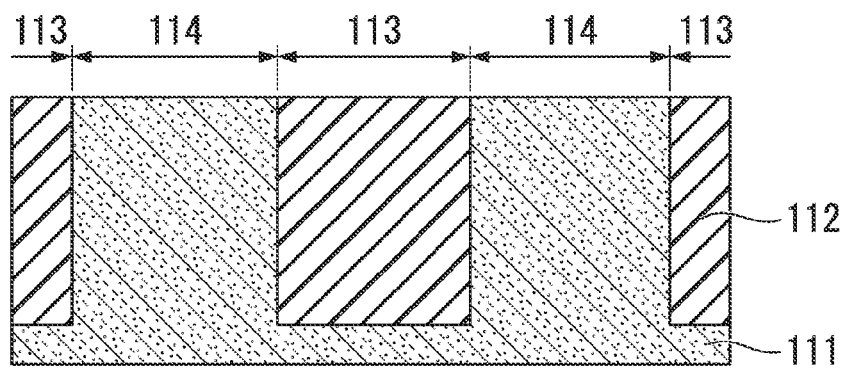
FIG. 6C is a fragmentary cross sectional elevation view of the same step as in FIG. 6A, taken along an Y2-Y2' line of FIG. 6A, in accordance with a first preferred embodiment of the present invention.
Figure 6D:
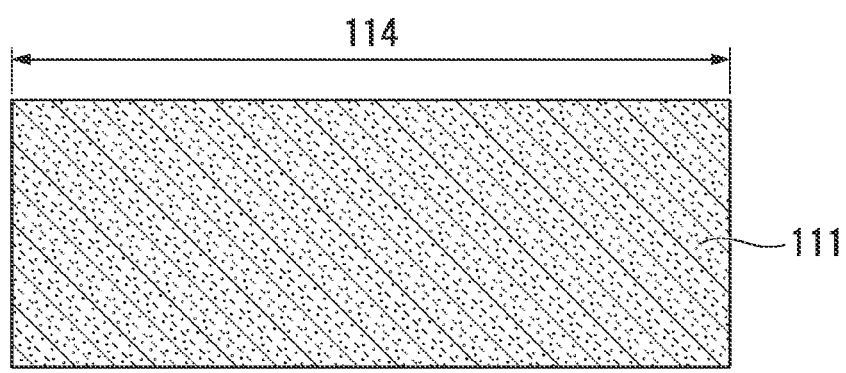
FIG. 6D is a fragmentary cross sectional elevation view of the same step as in FIG. 6A, taken along an A-A' line of FIG. 6A, in accordance with a first preferred embodiment of the present invention.
Figure 6E:
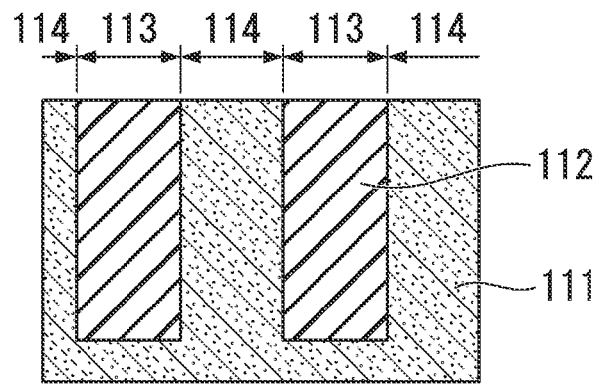
FIG. 6E is a fragmentary cross sectional elevation view of the same step as in FIG. 6A, taken along an X1-X1' line of FIG. 6A, in accordance with a first preferred embodiment of the present invention.
Figure 6F:
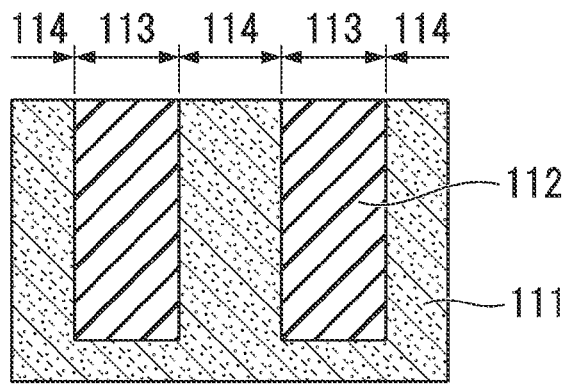
FIG. 6F is a fragmentary cross sectional elevation view of the same step as in FIG. 6A, taken along an X2-X2' line of FIG. 6A, in accordance with a first preferred embodiment of the present invention.
Figure 6G:
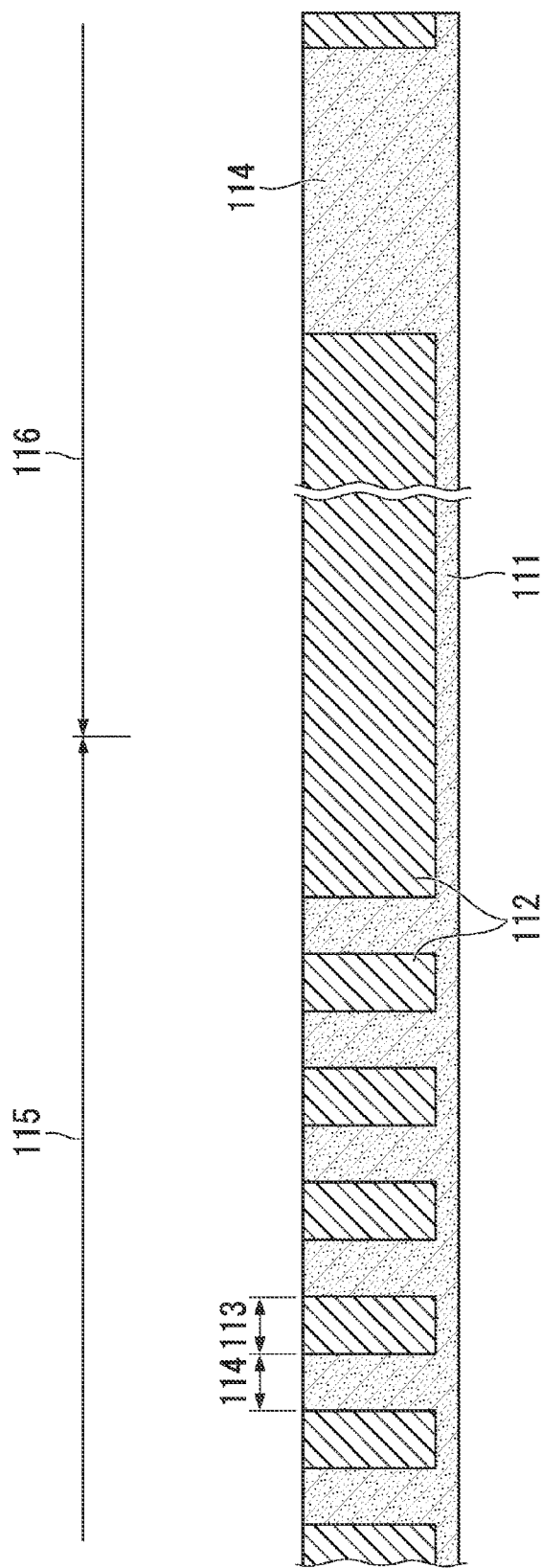
FIG. 6G is a fragmentary cross sectional elevation view of the same step as in FIG. 6A, in accordance with a first preferred embodiment of the present invention.

It is also preferable that the depth of the element separation film 112 be made approximately 300 nm. As shown in FIG. 6G, a semiconductor substrate 114 that serves as the element formation region for forming the peripheral transistors is formed in the peripheral circuit region 116.

The element formation region 114 formed in the cell region 115 will be referred to as the cell region element formation region 114, and the element formation region 114 formed in the peripheral circuit region 116 will be referred to as the peripheral circuit region element formation region 114.

Figure 7:
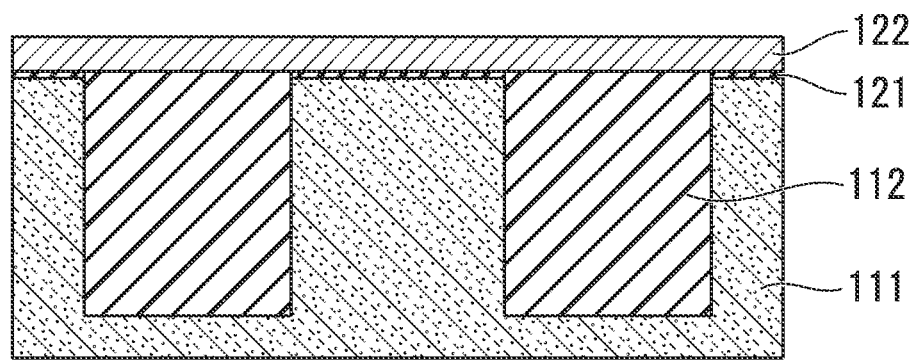
FIG. 7 is a fragmentary cross sectional elevation view of a step, subsequent to the step of FIGS. 6A through 6G, taken along the Y1-Y1' line of FIG. 6A, in accordance with a first preferred embodiment of the present invention.

As shown in FIG. 7, a gate insulating film 121 is formed on the surface of the element formation region 114. A first silicon film 122 is formed on the gate insulating film 121. The first silicon film 122 functions as the main part of the gate line of the DRAM 1000.

Figure 8A:
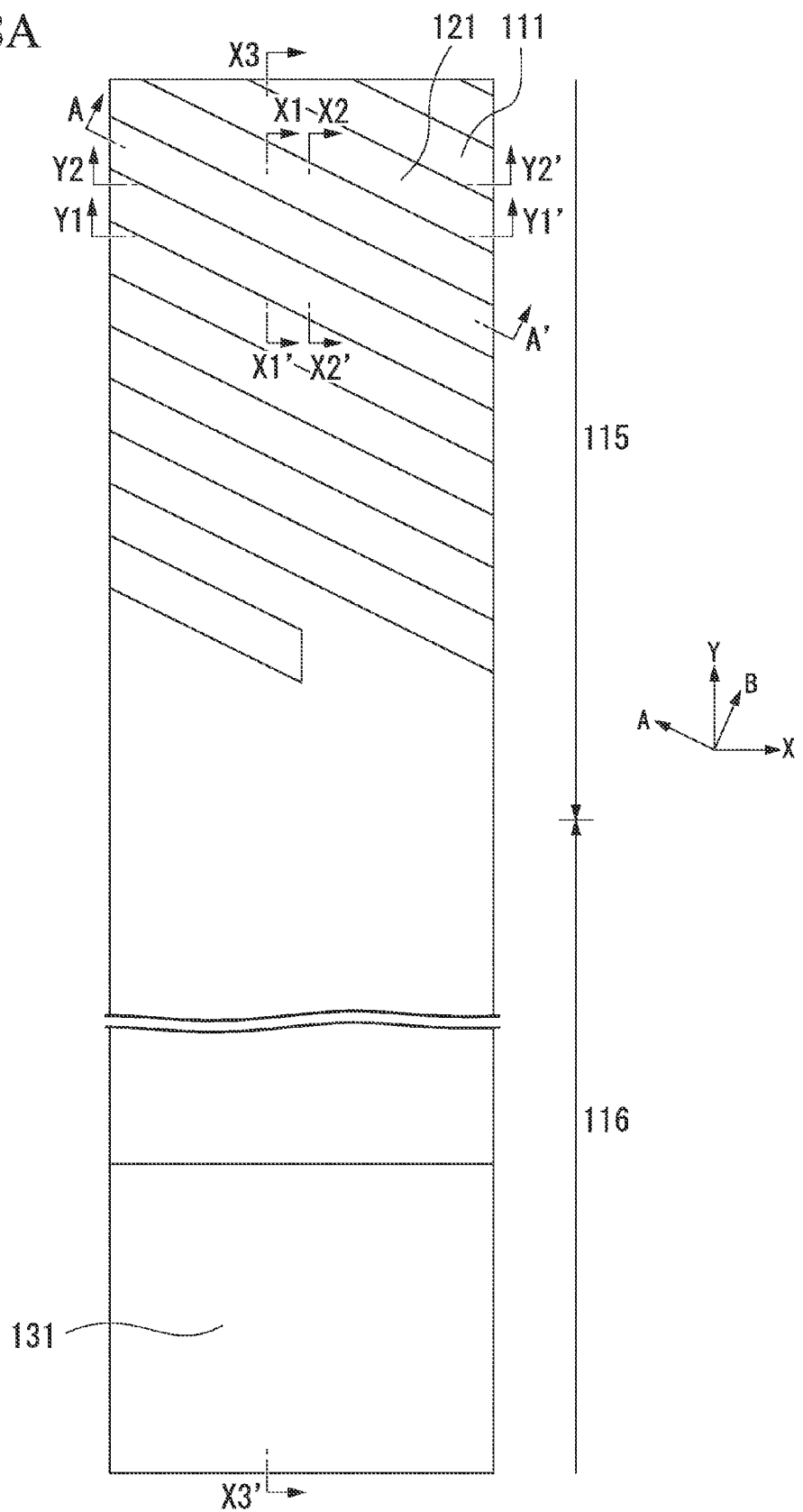
FIG. 8A is a fragmentary plain view of a step, subsequent to the step of FIG. 7, involved in the method of forming the semiconductor device of FIGS. 1-5, in accordance with the first preferred embodiment of the present invention.
Figure 8B:
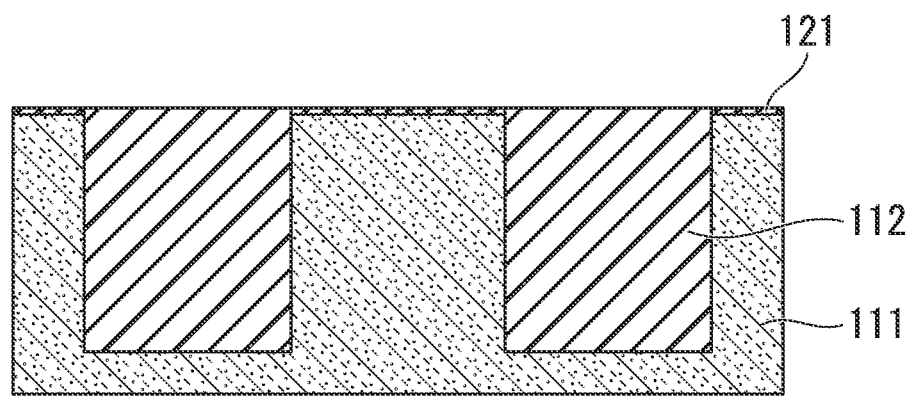
FIG. 8B is a fragmentary cross sectional elevation view of the same step as in FIG. 8A, taken along an Y1-Y1' line of FIG. 8A, in accordance with the first preferred embodiment of the present invention.
Figure 8C:
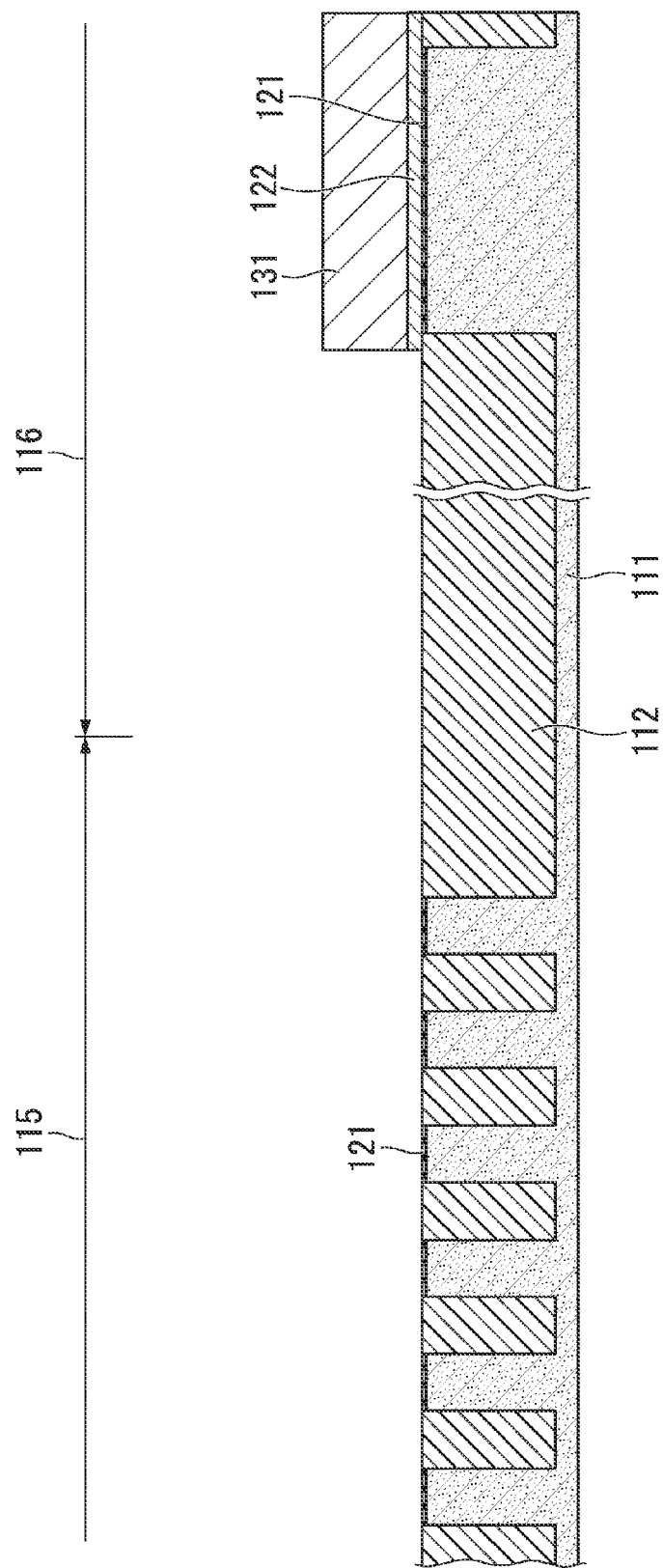
FIG. 8C is a fragmentary cross sectional elevation view of the same step as in FIG. 8A, in accordance with the first preferred embodiment of the present invention.

As shown in FIG. 8A to FIG. 8C, in the peripheral circuit region 116 a first mask 131 that covers the peripheral circuit region element formation region 114 and that opens the cell region element formation region 114 is formed on the first silicon film 122. The first mask 131 is formed on a region in which the peripheral transistor gate electrode is formed.

Using the first mask 131, the first silicon film 122 is etched, so as to expose the top of the semiconductor substrate 111 in the cell region element formation region 114. By this processing, of the region of the peripheral circuit region 116, a pattern made of the first silicon film 122 and the gate insulating film 121 is formed in the region covered by the first mask 131.

Figure 9A:
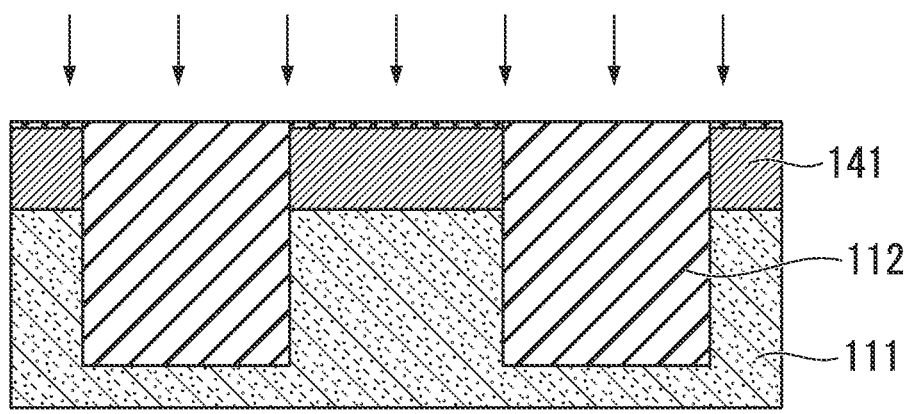
FIG. 9A is a fragmentary cross sectional elevation view of a step, subsequent to the step of FIG. 8B, taken along an Y1-Y1' line of FIG. 8A, in accordance with the first preferred embodiment of the present invention.
Figure 9B:
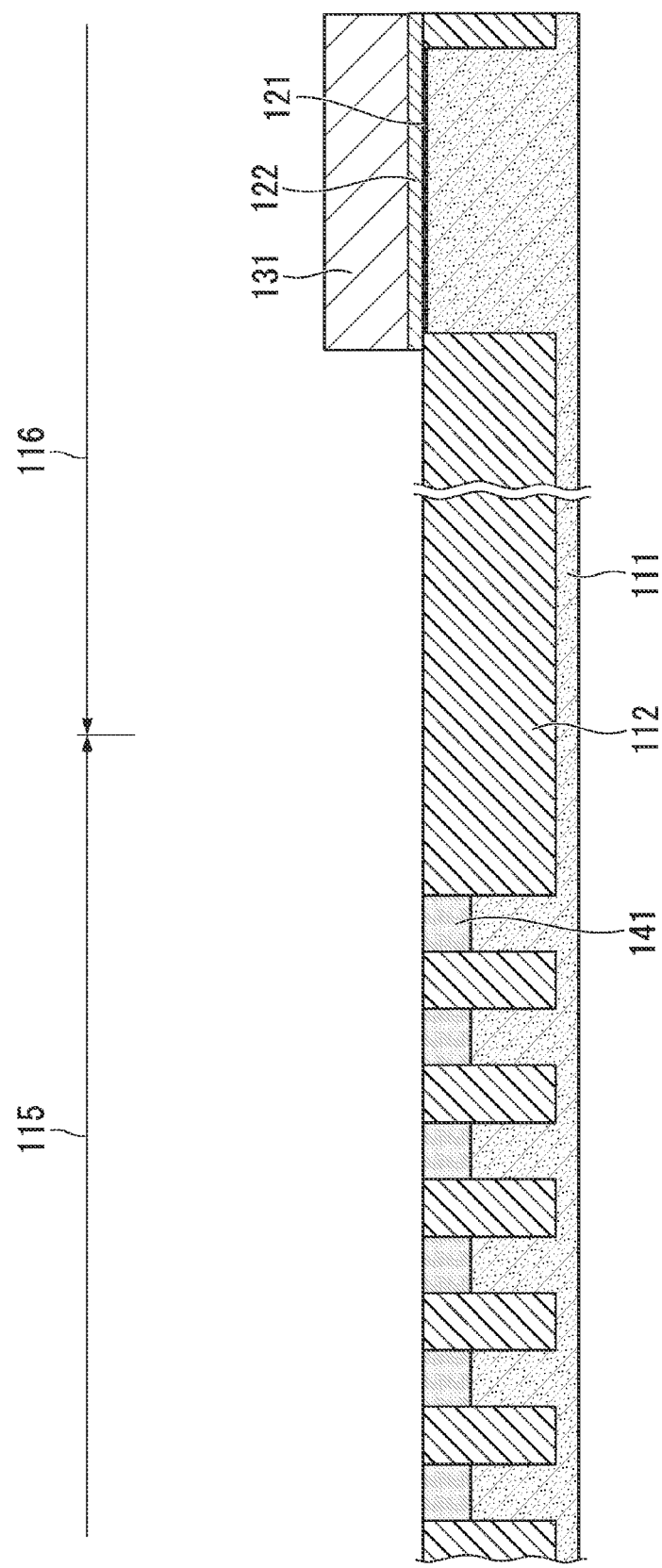
FIG. 9B is a fragmentary cross sectional elevation view of the same step as in FIG. 9A, in accordance with the first preferred embodiment of the present invention.

As shown in FIG. 9A, using the first mask 131, an impurity is introduced into the surface region of the semiconductor substrate 111 at the cell region element formation region 114, so as to form the cell transistor diffusion layer 141. Phosphorus can be used as the impurity. The introduction of the impurity is preferably done by ion implantation, under conditions of an energy of 30 keV and a dose of $2\times10^{13}$ atoms/cm$^2$. By this processing, the structure shown in FIG. 9B is manufactured.

Figure 10A:
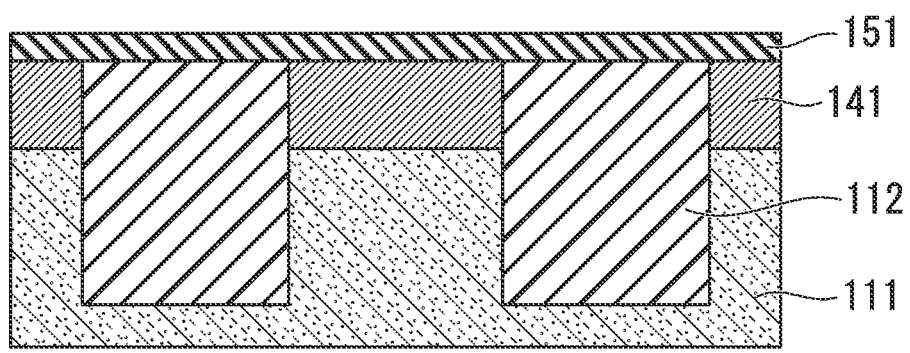
FIG. 10A is a fragmentary cross sectional elevation view of a step, subsequent to the step of FIG. 9B, taken along an Y1-Y1' line of FIG. 9A, in accordance with the first preferred embodiment of the present invention.
Figure 10B:
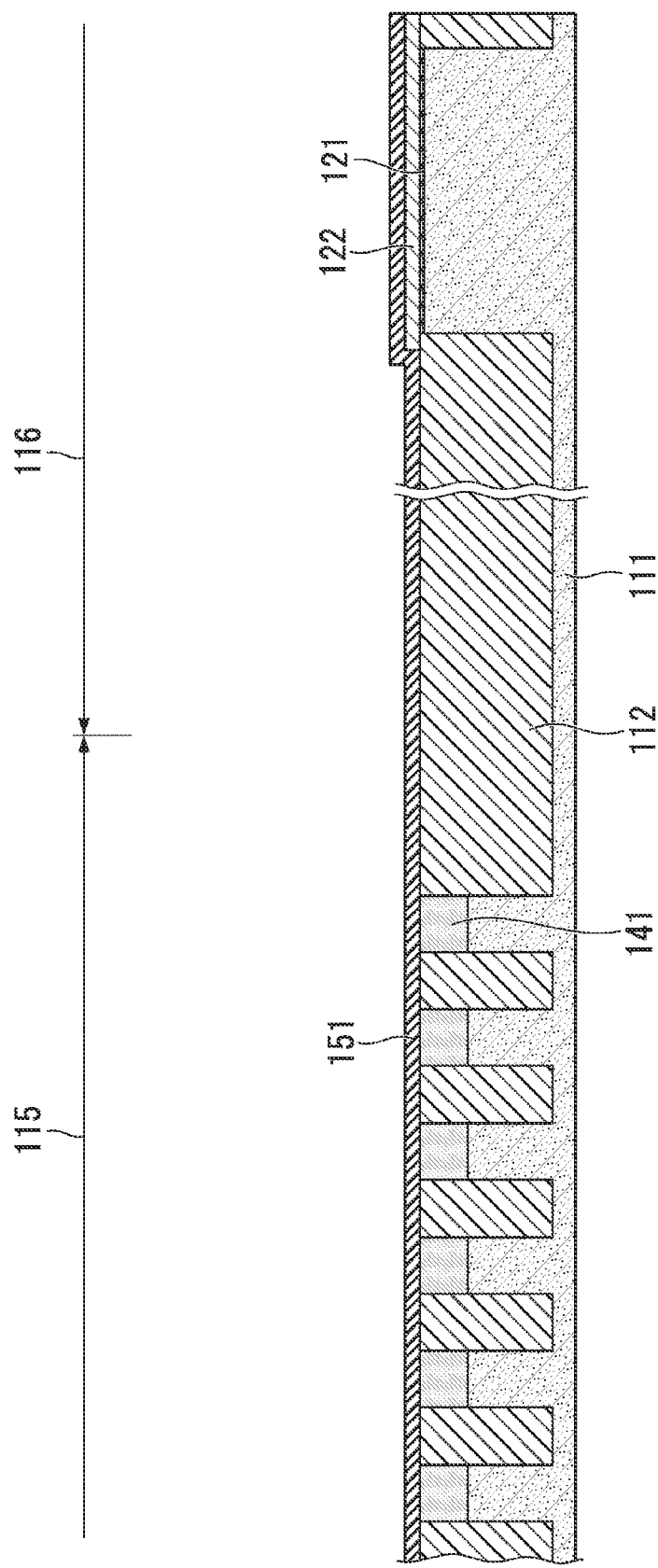
FIG. 10B is a fragmentary cross sectional elevation view of the same step as in FIG. 10A, in accordance with the first preferred embodiment of the present invention.

As shown in FIG. 10A and FIG. 10B, the first mask 131 is removed, and the mask insulating film 151 is formed on the semiconductor substrate 111. A silicon oxide film can be used as the material for the mask insulating film 151. The film thickness of the mask insulating film 151 is preferably approximately 50 nm.

Figure 11B:
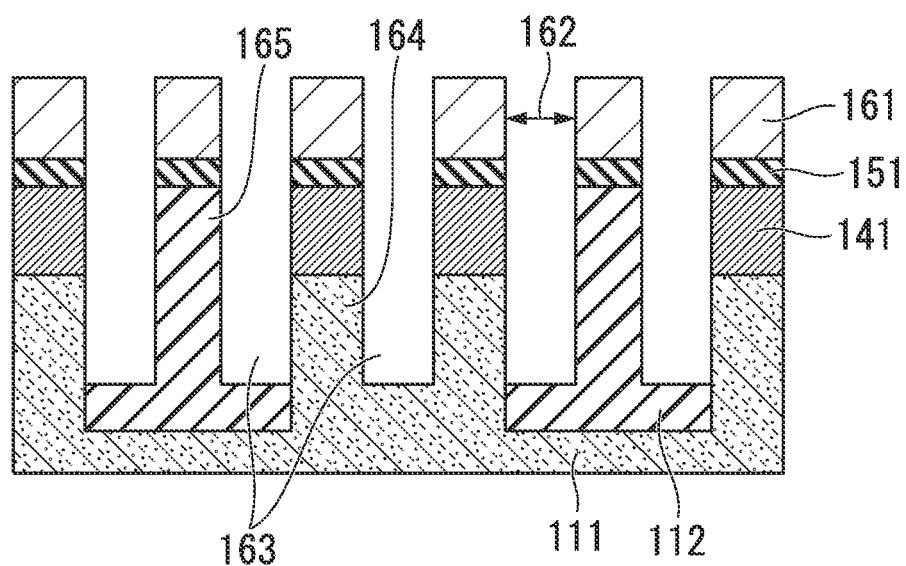
FIG. 11B is a fragmentary cross sectional elevation view of the same step as in FIG. 11A, taken along an Y1-Y1' line of FIG. 11A, in accordance with the first preferred embodiment of the present invention.

As shown in FIG. 11A and FIG. 11B, a second mask 161 for forming a gate trench is formed in the cell region 115. The second mask 161 has an aperture in the gate drain formation part. This aperture is referred to as the second mask aperture 162. The pattern of the second mask aperture 162 preferably has an aperture width that is the minimum process dimension F in the X direction (for example, 40 nm). As shown in FIG. 11A, the pattern of the second mask aperture 162 extends in the Y direction, and preferably has a pitch in the X direction of 80 nm (two times the minimum process dimension F). The second mask 161 in the method for manufacturing a semiconductor device according to the present embodiment is a line-and-space pattern having a width and spacing that are the minimum process dimension F.

The mask insulating film 151 is etched, using the second mask 161. The semiconductor substrate 111 in the cell region element formation region 114 and the element separation film 112 in the element separation region 113 are exposed. Next, the exposed semiconductor substrate 111 and element separation film 112 are etched to form gate trenches 163.

The gate trench 163 is formed with the shape of a trench that extends in the Y direction. Of the gate trenches 163, the part formed in the semiconductor substrate 111, and the part that is formed in the element separation film 112 are formed to have mutually the same substantial depth. This depth is preferably approximately 200 nm from the main surface of the semiconductor substrate 111.

As shown in FIG. 11A, the semiconductor substrate 111 of the cell region element formation regions 114 formed to extend in the A direction is separated in the X direction by the gate trench, to form parallelogram shapes when seen in plan view, being separated into pillar-shaped semiconductors upright in the direction perpendicular to the substrate. These separated semiconductor parts will be referred to as the semiconductor pillars 164. In the same manner, the element separation regions 113 formed so as to extend in the A direction are separated in the X direction by the gate trench 163, to form parallelogram shapes when seen in plan view, being separated into pillar-shaped insulating films upright in the direction perpendicular to the substrate. These separated insulating films will be referred to as the insulating pillars 165.

The semiconductor pillars 164 and the insulating pillars 165 are formed to be aligned in rows and alternate in the Y direction. A diffusion layer 141 is formed on the upper part of the semiconductor pillars 164. The diffusion layer 141, as will be described later, functions as either a source diffusion layer or a drain diffusion layer, depending on its disposition.

The gate trenches 163 and diffusion layers 141 are formed alternately on the cell region element formation region 114.

Focusing on the cell region element formation region 114a, the active regions 167 of the DRAM 1000 will now be described. In FIG. 11A, two active regions 167, adjacent in the A direction, are shown. A source diffusion layer 141b is disposed in the center of each active region. Gate trenches 163 for filling with gate line material of the cell transistor are formed on both sides of the source diffusion layer 141b. The gate trench 163 will be referred to as the cell transistor trench 166t. Drain diffusion layers 141c to which a capacitor is connected are disposed on each side on the outside of the cell transistor trench 166t.

An active region such as this is constituted by one source diffusion layer, two cell transistor trenches, and two drain diffusion layers. A plurality of the active regions are provided in a row on the cell region element formation region 114a. As shown in FIG. 11B, gate trenches 163 are formed between adjacent active regions, this functioning as an element separation region that separates the adjacent active regions. This gate trench 163 will be referred to as the element separation gate trench 166i.

The gate trenches 163 that are arranged in a row in the X direction function as cell transistor trenches or element separation gate trenches. From the left to the right in FIG. 11A, a cell transistor trench, a cell transistor trench, an element separation trench, a cell transistor trench, a cell transistor trench, and an element separation trench and so on are formed on the cell region element formation region 114a.

The diffusion layers 141 that are arranged in a row in the X direction function as source diffusion layers or drain diffusion layers. From the left to right in FIG. 11A, a drain diffusion layer, a source diffusion layer, a drain diffusion layer, a drain diffusion layer, a source diffusion layer, a drain diffusion layer, and so on are formed on the cell region element formation region 114a.

In FIG. 11A, the condition shown is that in which the first resist mask 161 is formed on the upper surface. The source diffusion layer 141b and drain diffusion layer 141c are formed on the semiconductor pillar 164 below the first resist mask 161.

The second mask 161 is removed, and a gate insulating film 171 is formed on the surface of the semiconductor substrate 111 exposed in the gate trench 163. A silicon oxide film, a silicon nitride film, a high-dielectric film, or the like can be used as the gate insulating film 171. The gate insulating film 171 is preferably formed by thermal oxidation to a thickness of approximately 5 nm, and the method of formation is not restricted to thermal oxidation, and CVD (chemical vapor deposition) or ALD (atomic layer deposition) and the like are also usable.

Figure 12:
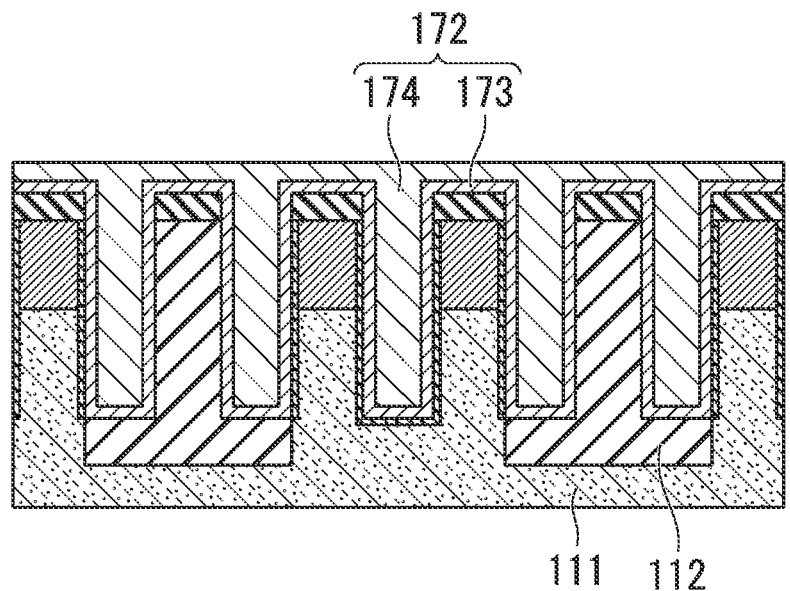
FIG. 12 is a fragmentary cross sectional elevation view of a step, subsequent to the step of FIG. 11B, taken along an Y1-Y1' line of FIG. 11A, in accordance with the first preferred embodiment of the present invention.

A gate electrode film 172 is deposited. The gate electrode film 172 is a film laminate made of, as shown in FIG. 12, two types of films 173 and 174. A titanium nitride film and a tungsten film can be used as the two types of films 173 and 174. In the method for manufacturing a semiconductor device according to the present embodiment, the titanium nitride film is referred to as the gate titanium nitride film 173, and the tungsten film is referred to as the gate tungsten film 174. The film thickness of the gate titanium nitride film 173 and the gate tungsten film 174 is preferably approximately 5 nm and 60 nm, respectively. The material of the gate electrode film 172 is not restricted to being titanium nitride and tungsten, and may be a doped silicon film or some other high-melting point metal film, or a laminated film thereof.

Figure 13:
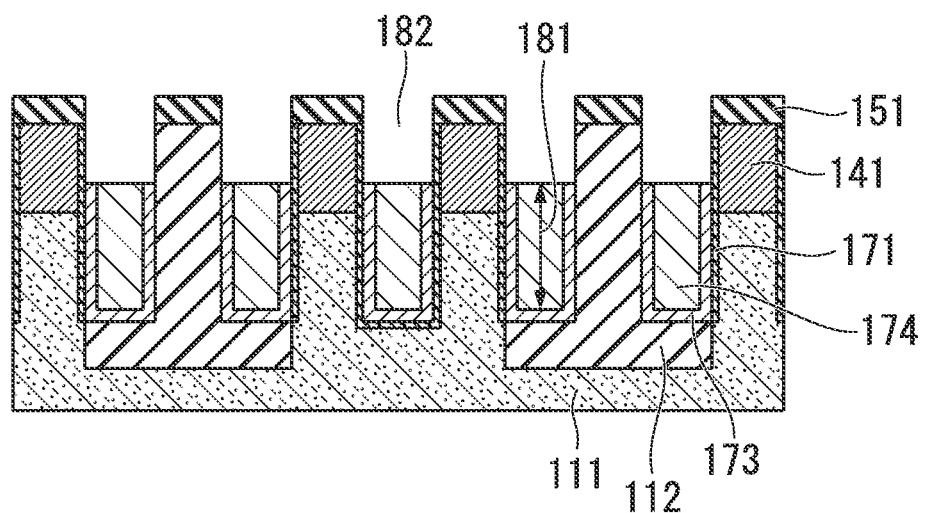
FIG. 13 is a fragmentary cross sectional elevation view of a step, subsequent to the step of FIG. 12, taken along an Y1-Y1' line of FIG. 11A, in accordance with the first preferred embodiment of the present invention.
Figure 14A:
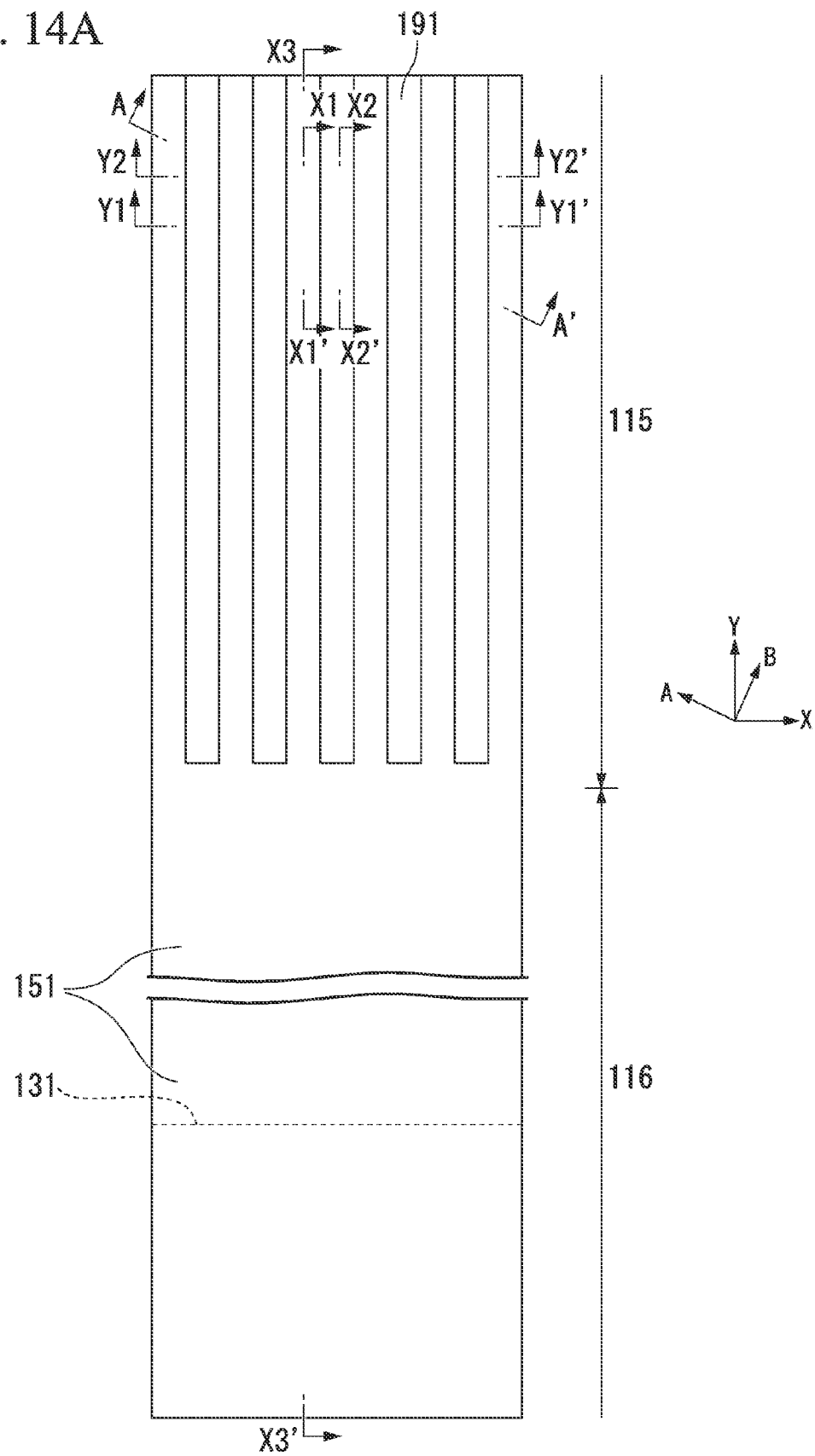
FIG. 14A is a fragmentary plain view of a step, subsequent to the step of FIG. 13, involved in the method of forming a semiconductor device of FIGS. 1-5, in accordance with the first preferred embodiment of the present invention.
Figure 14B:
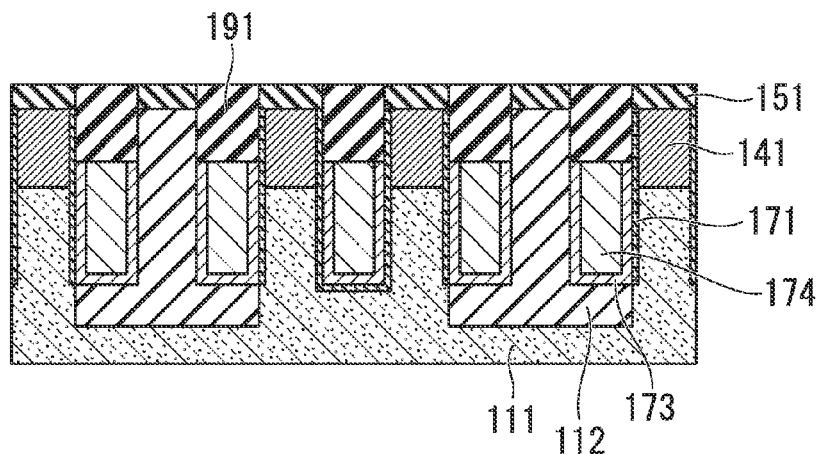
FIG. 14B is a fragmentary cross sectional elevation view of the same step as in FIG. 14A, taken along an Y1-Y1' line of FIG. 14A, in accordance with the first preferred embodiment of the present invention.
Figure 14C:
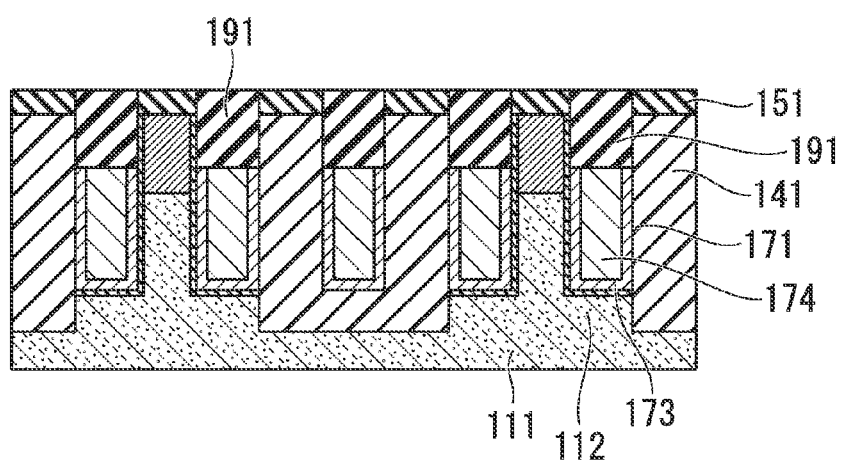
FIG. 14C is a fragmentary cross sectional elevation view of the same step as in FIG. 14A, taken along an Y2-Y2' line of FIG. 14A, in accordance with the first preferred embodiment of the present invention.
Figure 14D:
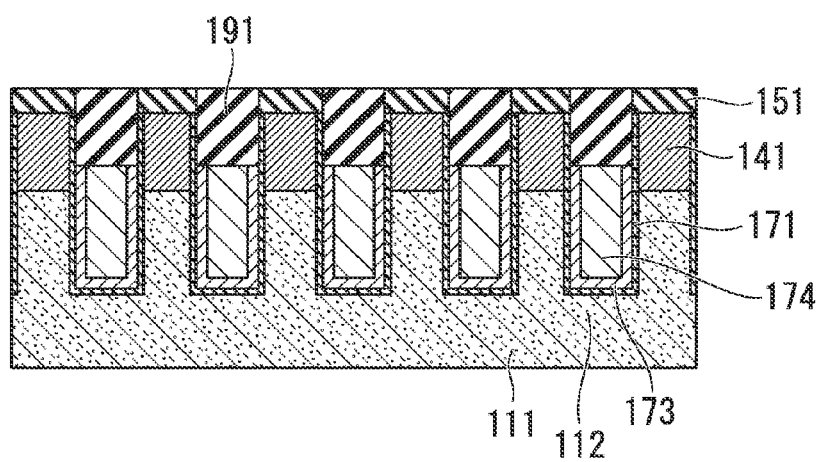
FIG. 14D is a fragmentary cross sectional elevation view of the same step as in FIG. 14A, taken along an A-A' line of FIG. 14A, in accordance with the first preferred embodiment of the present invention.
Figure 14E:
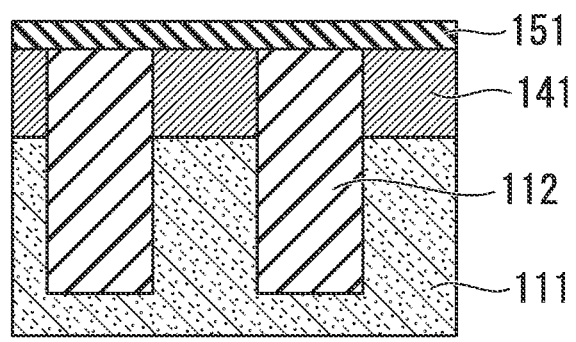
FIG. 14E is a fragmentary cross sectional elevation view of the same step as in FIG. 14A, taken along an X1-X1' line of FIG. 14A, in accordance with the first preferred embodiment of the present invention.
Figure 14F:
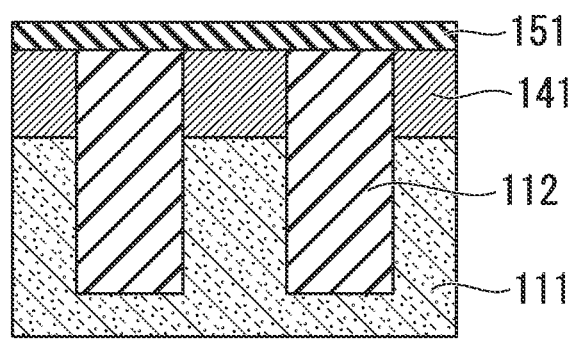
FIG. 14F is a fragmentary cross sectional elevation view of the same step as in FIG. 14A, taken along an X2-X2' line of FIG. 14A, in accordance with the first preferred embodiment of the present invention.

The gate electrode film 172 is etched back so as to form a buried gate electrode 181 within the gate trench 163, as shown in FIG. 13. The etching back is performed so that the positions of the upper surface of the gate tungsten film 174 and the upper surface of the gate titanium nitride film 173 are recessed. The space formed at the top of the buried gate 181 will be referred to as the recess part 182. The height of the buried gate electrode 181 from the bottom of the gate trench 163 is preferably approximately 100 nm.

As shown FIG. 14A to FIG. 14F, a gate capacitor layer 191 is buried into the recess part 182, and a buried gate capacitor film is formed so as to cover over the mask insulating film 15.

The film thickness of the buried gate capacitor film is preferably approximately 50 nm.

As shown in FIG. 15A to FIG. 15D, an aperture is formed over the source diffusion layer 141b of the cell region 115. Simultaneously, a third mask 201 that opens over the first silicon film 122 formed on the peripheral circuit region 116 is formed. In the cell region 115, the aperture part of the third mask 201 is a long, narrow pattern extending in the Y direction. The width of the aperture pattern of the third mask 201 in the X direction is preferably approximately 60 nm. In the manufacturing of the DRAM 1000, one aperture part opens over the source diffusion layers 141b formed in a row in the Y direction.

Figure 15A:
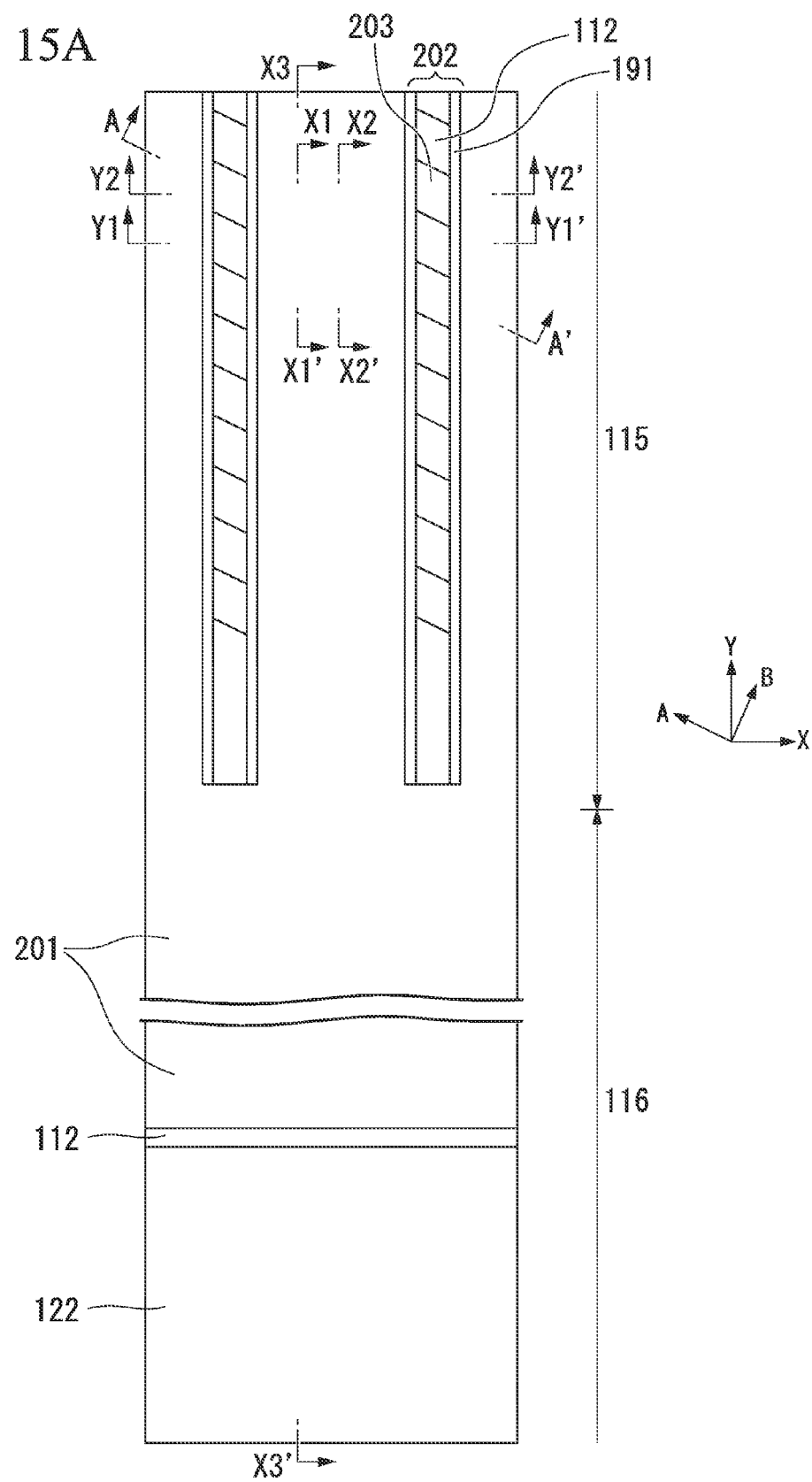
FIG. 15A is a fragmentary plain view of a step, subsequent to the step of FIGS. 14A through 14F, involved in the method of forming a semiconductor device of FIGS. 1-5, in accordance with the first preferred embodiment of the present invention.
Figure 15B:
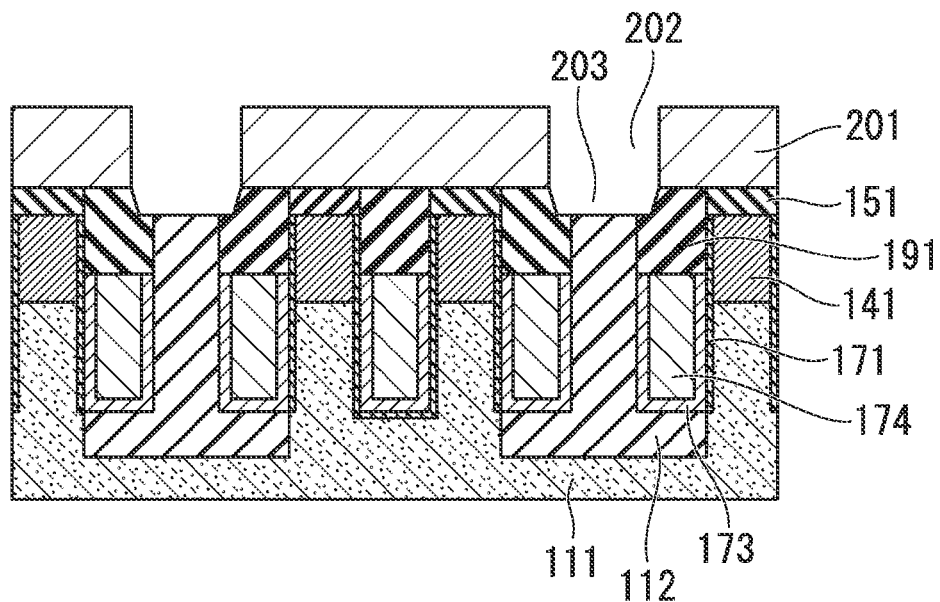
FIG. 15B is a fragmentary cross sectional elevation view of the same step as in FIG. 15A, taken along an Y1-Y1' line of FIG. 15A, in accordance with the first preferred embodiment of the present invention.
Figure 15C:
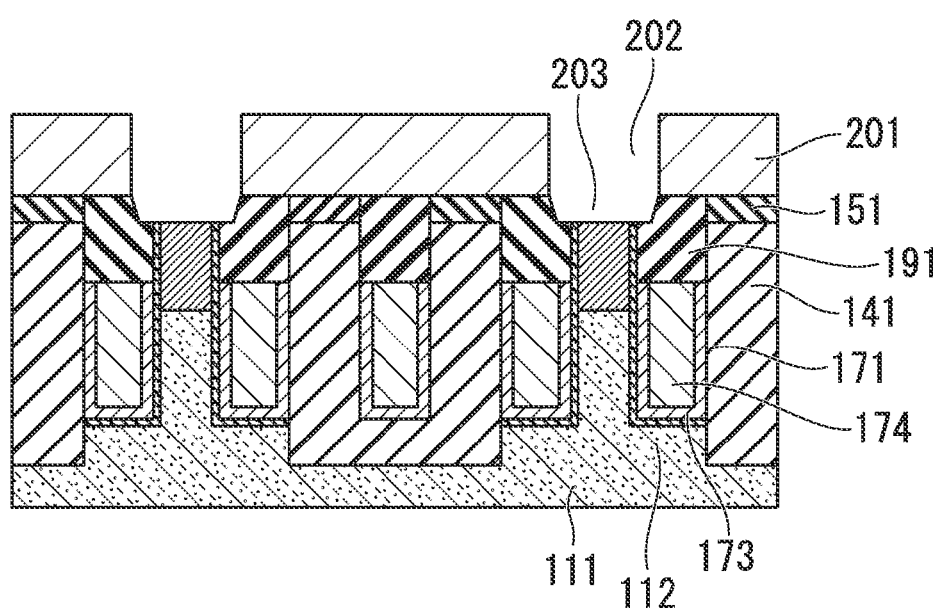
FIG. 15C is a fragmentary cross sectional elevation view of the same step as in FIG. 15A, taken along an Y2-Y2' line of FIG. 15A, in accordance with the first preferred embodiment of the present invention.
Figure 15D:
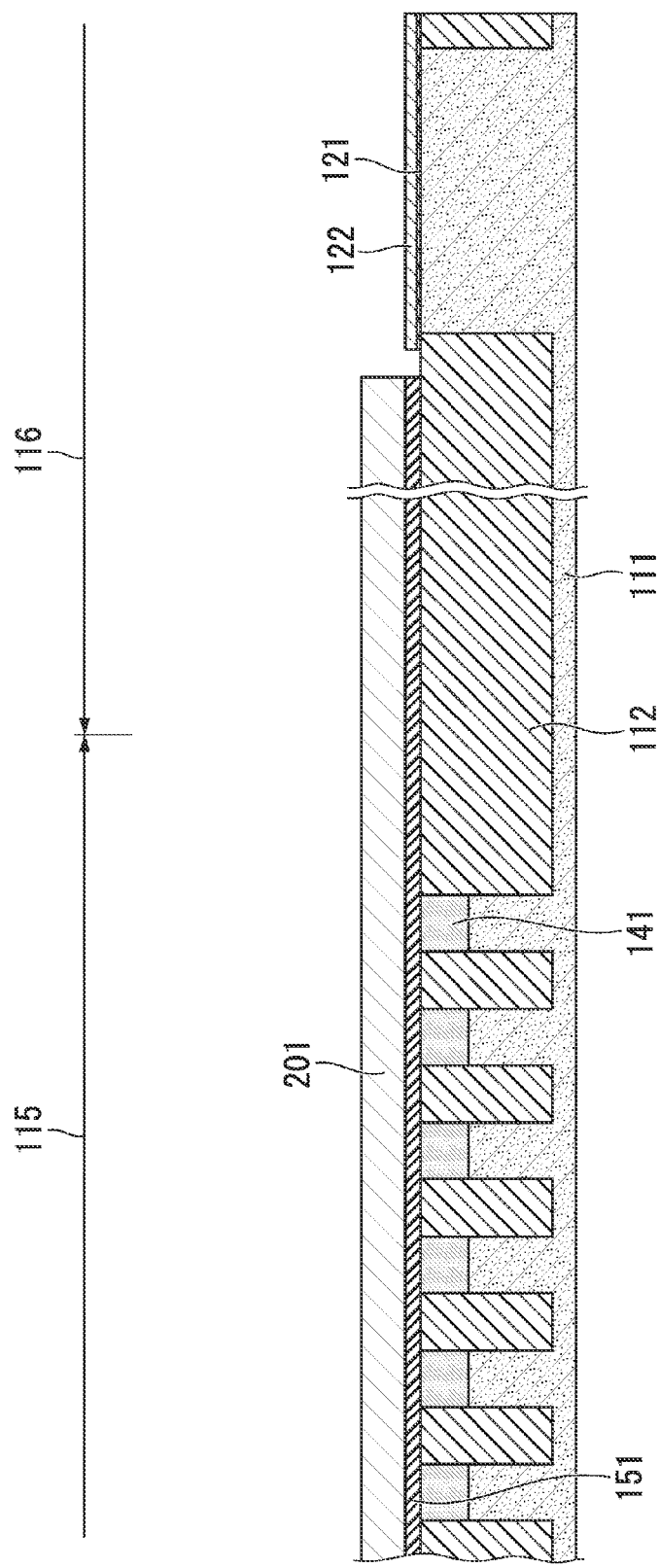
FIG. 15D is a fragmentary cross sectional elevation view of the same step as in FIG. 15A, in accordance with the first preferred embodiment of the present invention.

The mask insulating film 151 is etched, using the third mask 201. By this etching, the upper surface of the source diffusion layer 141b and the upper surface of the element separation film 112 in the cell region 115 are exposed, and the upper surface of the first silicon film 122 is exposed in the peripheral circuit region 116. As shown in FIG. 15B and FIG. 15C, the opening that is made by opening up of the upper surface of the source diffusion layer 141b of the cell region 115 will be referred to as the bit line contact apertures 203.

The etching of the mask insulating film 151 is performed with substantially the same etching rate as the etching of the gate capacitor layer (silicon nitride film) 191 and the element separation film (silicon oxide film) 112. In addition to the etching of the mask insulating film 151, as shown in FIG. 15C, the buried capacitor layer 191 exposed at a third mask aperture part 202 is etched away, so that the bottom surface of the third mask aperture part 202 and the upper surface of the source diffusion layer 141b are substantially the same height.

Figure 16A:
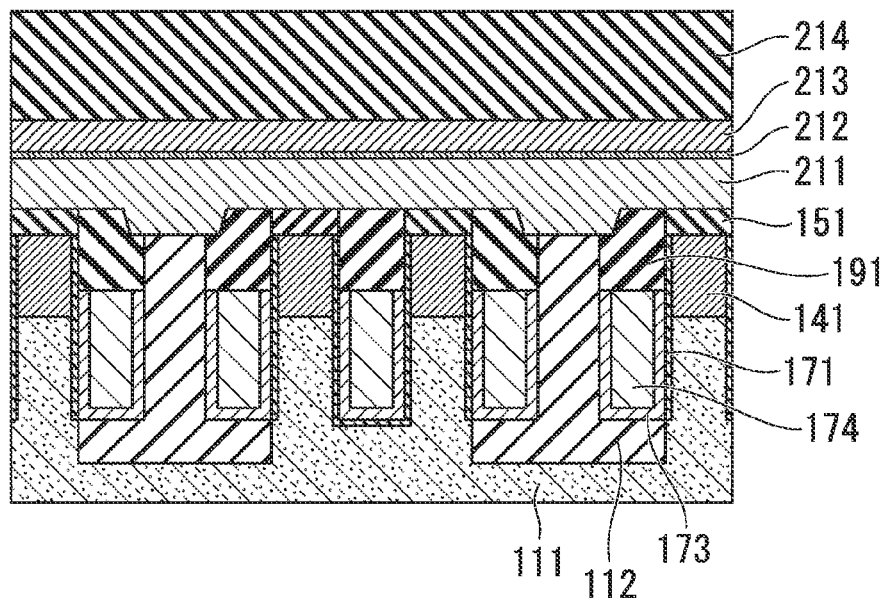
FIG. 16A is a fragmentary cross sectional elevation view of a step, subsequent to the step of FIGS. 15A through 15D, involved in the method of forming a semiconductor device of FIGS. 1-5, taken along an Y1-Y1' line of FIG. 15A, in accordance with the first preferred embodiment of the present invention.
Figure 16B:
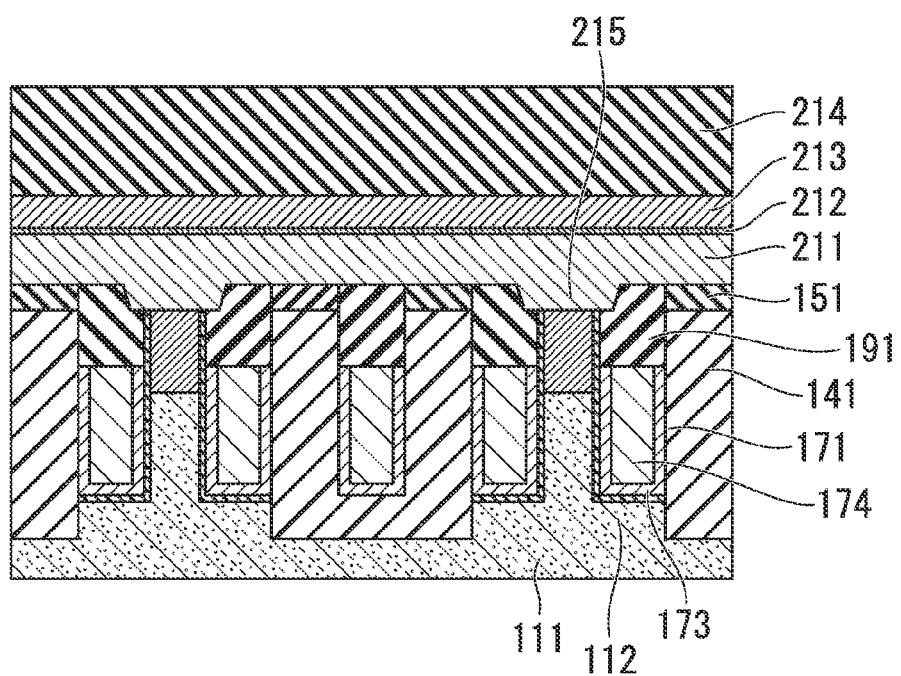
FIG. 16B is a fragmentary cross sectional elevation view of the same step as in FIG. 16A, taken along an Y2-Y2' line of FIG. 16A, in accordance with the first preferred embodiment of the present invention.
Figure 16C:
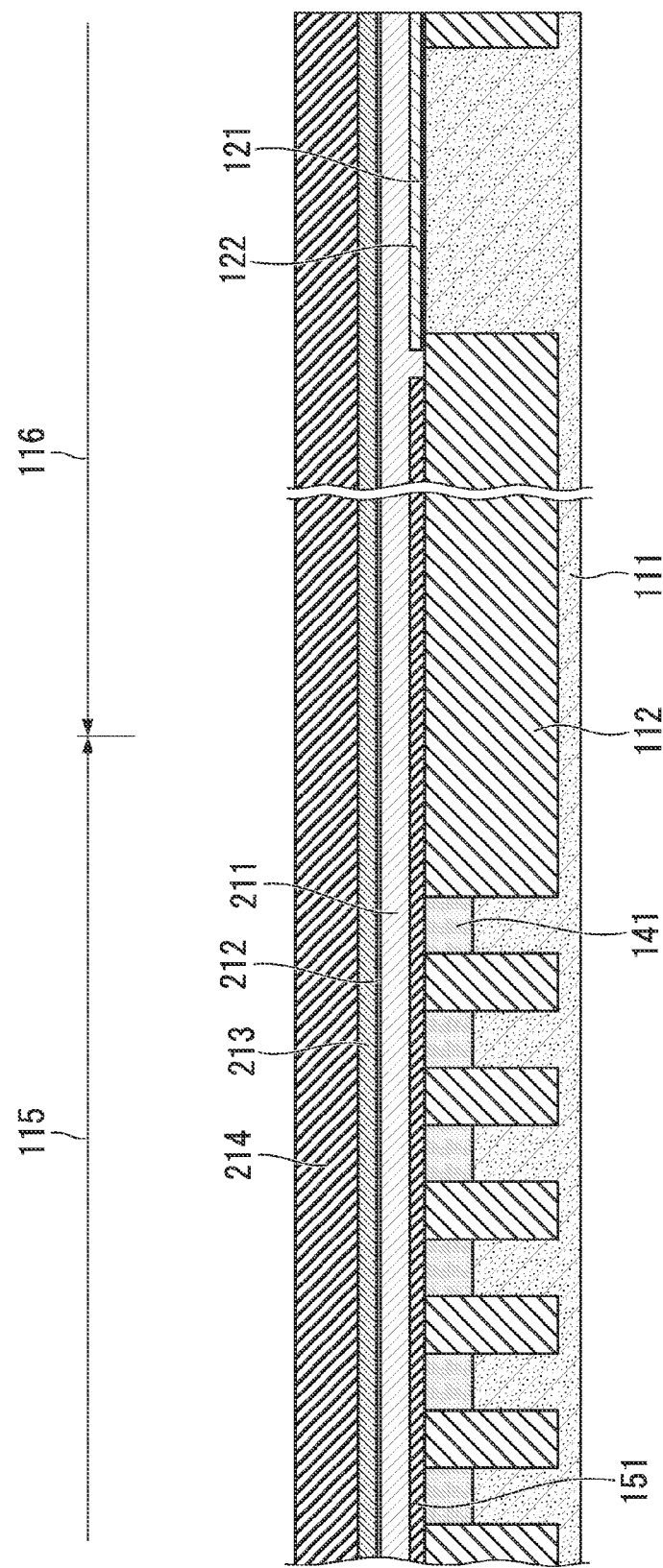
FIG. 16C is a fragmentary cross sectional elevation view of the same step as in FIG. 16A, in accordance with the first preferred embodiment of the present invention.

The third mask 201 is removed and the bit line material shown in FIG. 16A to FIG. 16C is deposited thereover. A doped silicon film, a tungsten nitride film, and a tungsten film can be used as this bit line material, and the preferable film thicknesses thereof are approximately 40 nm, 10 nm, and 50 nm, respectively. It is preferable that the total film thickness of these three films be approximately 100 nm. In the method for manufacturing a semiconductor device according to the present embodiment, the films that constitute the bit line material are, respectively, the second silicon film 211, the bit line tungsten nitride film 212, and the bit line tungsten film 213.

A bit line capacitor film 214 is formed as a bit line capacitor film (first insulating film) is formed over the bit line material. As the material of the bit line capacitor film 214, it is possible to use a film having an etching rate that is slower than that of the first interlayer film (second insulating film) in the process step of forming the capacitor contact. An exemplary film of this type is a silicon nitride film. The film thickness of the bit line capacitor film 214 is preferably approximately 200 nm.

In the cell region 115, the second silicon film 211 is electrically connected to the source diffusion layer 141b exposed at the bit line contact apertures 203. Therefore, the contact apertures 203 will be referred to as the bit line contacts 215.

As shown in FIG. 17A to FIG. 17D, a fourth mask 221 is formed that has the patterns for the bit line to be formed in the cell region 115 and the patterns for the peripheral interconnects and gate electrodes to be formed in the peripheral circuit region 116.

In the cell region 115, the bit line pattern of the fourth mask 221, as shown in FIG. 17A, has a fixed width in the Y direction, and is a long, narrow pattern extending in the X direction that passes over the bit line contact apertures 203. The width in the Y direction is preferably approximately 50 nm. The bit line pattern will be referred to as the bit line fourth mask 221b. A plurality of the bit line fourth masks 221b are formed in a row in the Y direction.

As shown in FIG. 17A, in the peripheral circuit region 116, the fourth mask 221 forms the patterns of the peripheral interconnect fourth mask 221w for forming peripheral interconnects, and the patterns of the gate fourth mask 221g for forming the gate electrodes. The peripheral interconnects in this case refer to the interconnects formed in the part in which the first silicon film 211 is not formed. The width of the peripheral interconnect fourth mask 221w and the gate fourth mask 221g in the Y direction is generally thicker than the bit line fourth mask 221b.

Using the fourth mask 221, etching is done in the sequence of the bit line capacitor film 214, the bit line tungsten film 213, the bit line tungsten nitride film 212, the second silicon film 211, and the first silicon film 122.

Figure 17B:
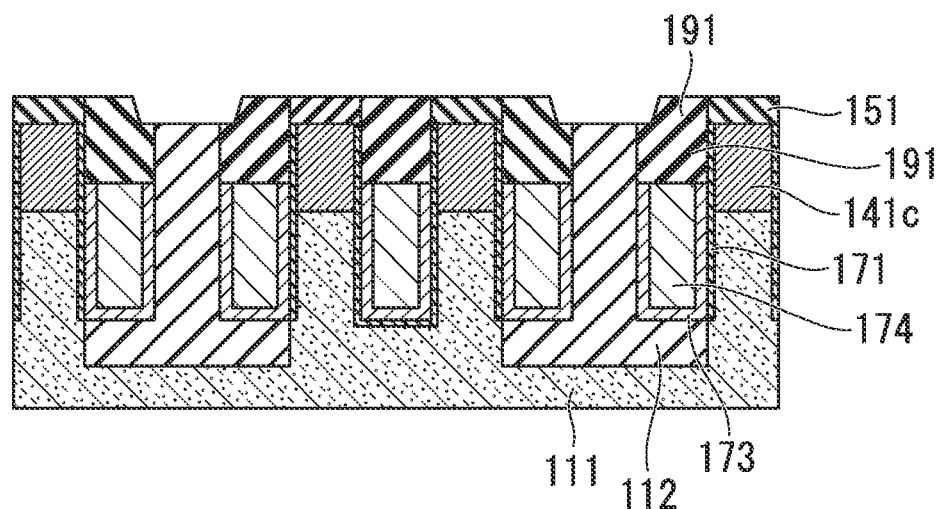
FIG. 17B is a fragmentary cross sectional elevation view of the same step as in FIG. 17A, taken along an Y1-Y1' line of FIG. 17A, in accordance with the first preferred embodiment of the present invention.
Figure 17C:
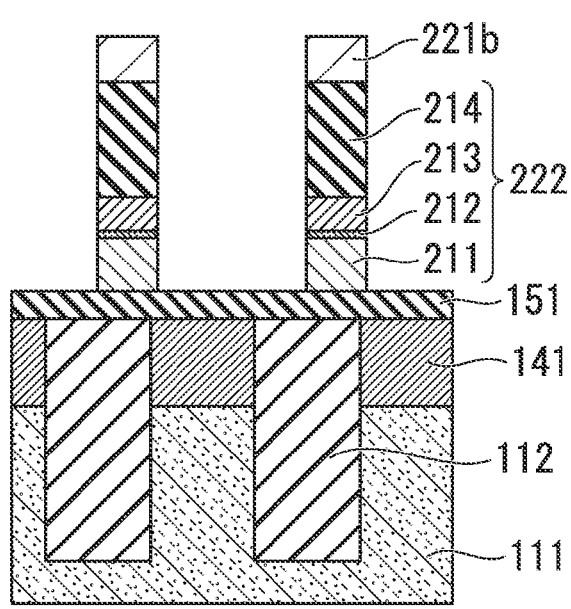
FIG. 17C is a fragmentary cross sectional elevation view of the same step as in FIG. 17A, taken along an X1-X1' line of FIG. 17A, in accordance with the first preferred embodiment of the present invention.
Figure 17D:
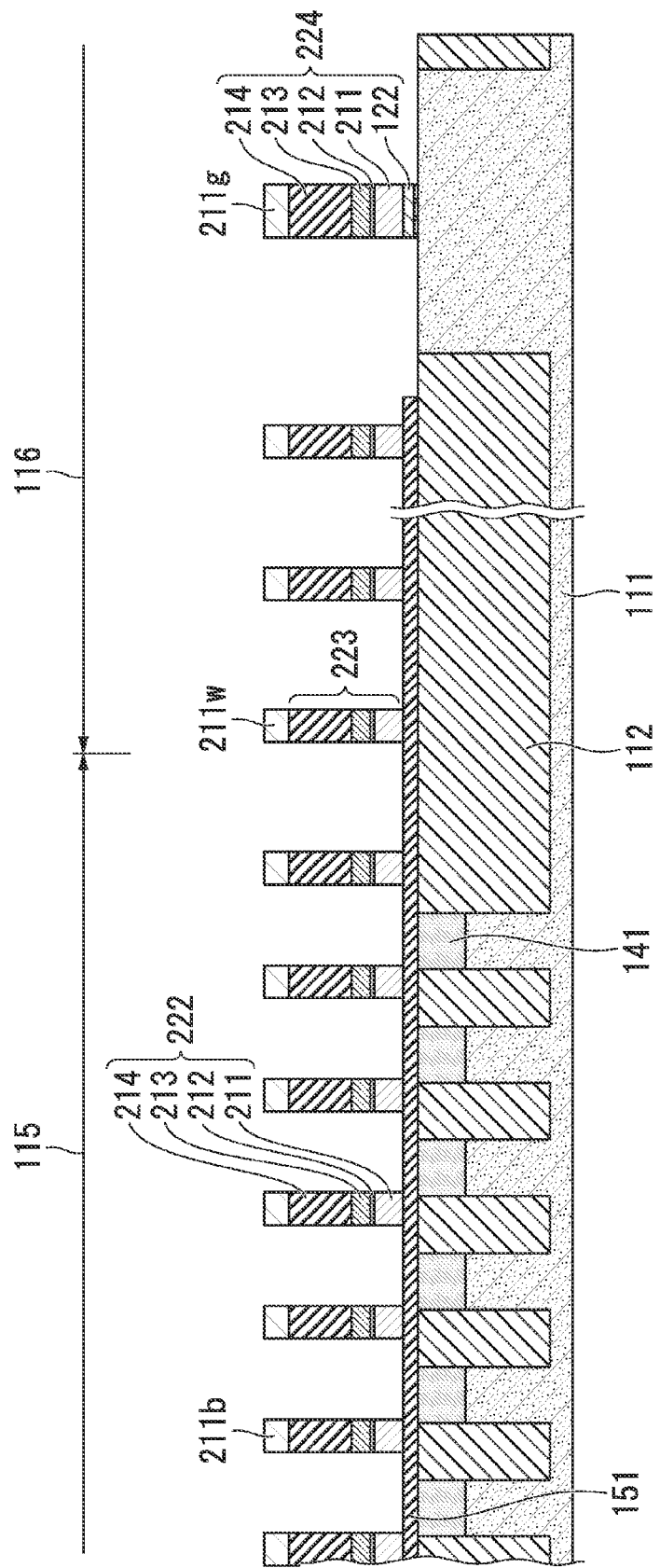
FIG. 17D is a fragmentary cross sectional elevation view of the same step as in FIG. 17A, in accordance with the first preferred embodiment of the present invention.

As shown in FIG. 17D, the bit line 222 constituted by, sequentially from the top, the bit line capacitor film 214, the bit line tungsten film 213, the bit line tungsten nitride film 212, and the second silicon film 211, is formed in the cell region 115.

In the peripheral circuit region 116, in the part in which the first silicon film 122 is not formed, a peripheral interconnect 223 constituted by, sequentially from the top, the bit line capacitor 214, the bit line tungsten film 213, the bit line tungsten nitride film 212, and the second silicon film 211 is formed. This is the same film configuration as the bit line 222, and functions as the interconnect in the peripheral circuit region 116.

A peripheral circuit gate electrode 224 constituted by the bit line capacitor film 214, the bit line tungsten film 213, the second silicon film 211, and the first silicon film 122 is formed in the transistor formation region in the peripheral circuit region 116.

Next, the fourth mask 221 is removed.

Figure 18B:
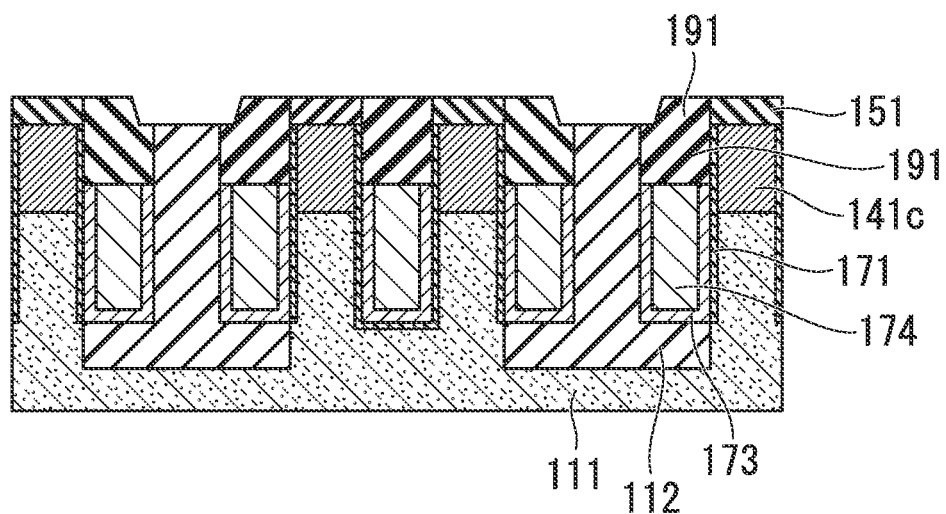
FIG. 18B is a fragmentary cross sectional elevation view of the same step as in FIG. 18A, taken along an Y1-Y1' line of FIG. 18A, in accordance with the first preferred embodiment of the present invention.
Figure 18C:
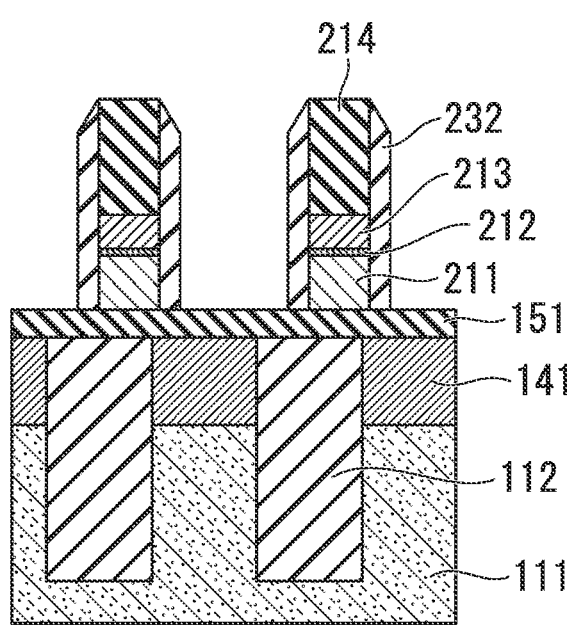
FIG. 18C is a fragmentary cross sectional elevation view of the same step as in FIG. 18A, taken along an X1-X1' line of FIG. 18A, in accordance with the first preferred embodiment of the present invention.
Figure 18D:
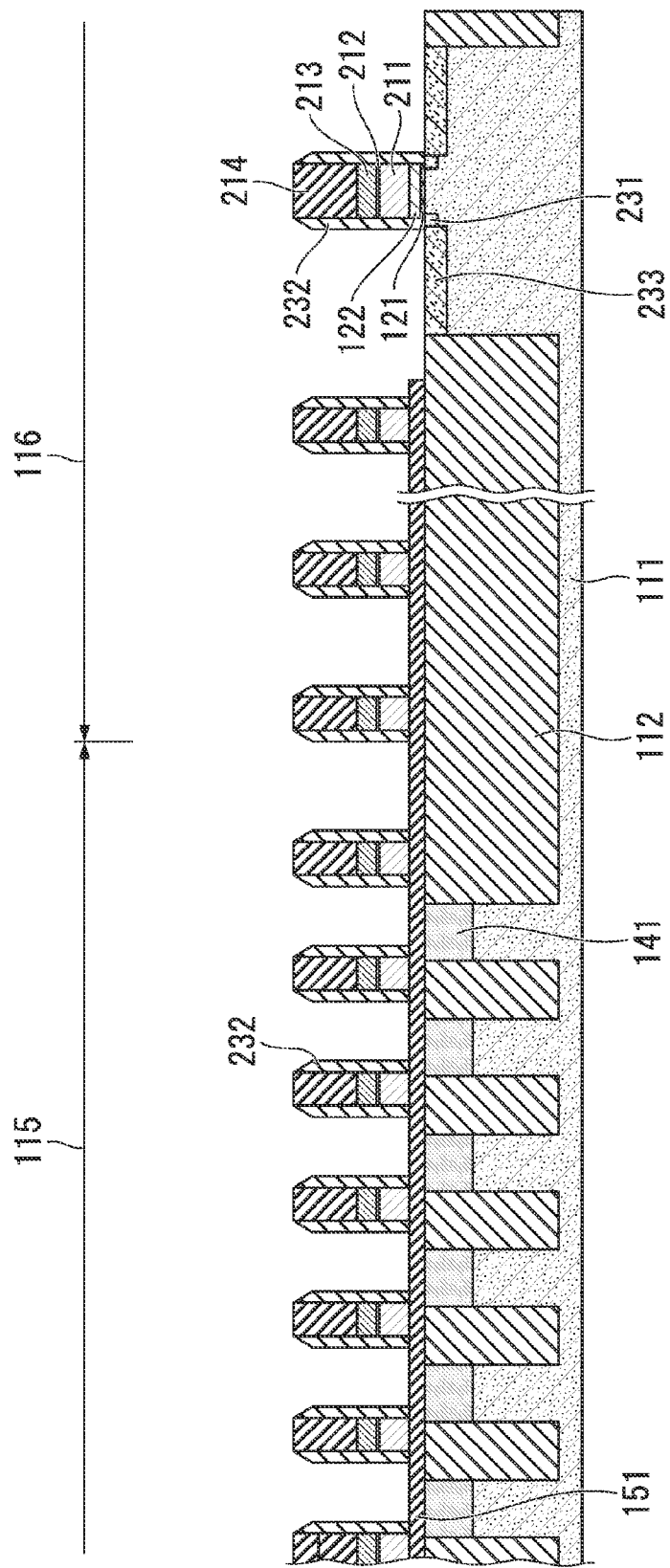
FIG. 18D is a fragmentary cross sectional elevation view of the same step as in FIG. 18A, in accordance with the first preferred embodiment of the present invention.

As shown in FIG. 18A to FIG. 18D, a mask for forming an n-type diffusion layer and having an aperture over an element formation region 112 is formed in the peripheral circuit region 116. Next, an impurity is introduced into the semiconductor substrate 111 in a self-aligned manner with respect to the gate electrode 224 to form an n-type LDD diffusion layer 231. Phosphorus or the like can be used as the impurity for the n-type diffusion layer. An NMOS transistor, for example, is formed in the peripheral circuit region 116 of the present embodiment as shown in FIG. 18D.

After removing the fourth mask 221, in the same manner as described above, a mask for the formation of a p-type diffusion layer and having an aperture over the element formation region 112 is formed, and an impurity is introduced in a self-aligned manner with respect to the gate electrode 224, so as to form a p-type LLD diffusion layer. Boron or the like can be used as the impurity for forming the p-type diffusion layer. After forming the p-type diffusion layer, the mask is removed. The p-type LDD diffusion layer is not shown in FIG. 18A to FIG. 18D.

As shown in FIG. 18A to FIG. 18D, a first side wall film material that covers the bit lines 222, the peripheral bit lines 223, and the side and upper surfaces of the gate electrodes 224, and that covers the substrate is formed. The film thickness is preferably a thickness that does not bury between the bit lines 222, and preferably approximately, for example, 10 nm. In the capacitor contact etching a film having an etching rate that is slower than that of the first insulating film is used as the first side wall material. It is preferable that a material that is the same as the bit line capacitor film 214 be used as such a material. In the method for manufacturing a semiconductor device according to the present embodiment, the description is for the case of using a silicon nitride film.

The first side wall film material is etched back, so as to form a first side wall film 232 having a thickness of approximately 10 nm of each of the wall surfaces of the bit lines 222, the peripheral interconnects 223, and the gate electrodes 224.

In the peripheral circuit region 116, a mask for forming an n-type diffusion layer and having an aperture over the element formation region 112 is formed. Next, an impurity is introduced into the semiconductor substrate 111 in a self-aligning manner with respect to the gate electrodes 224, so as to form an n+ type diffusion layer 233. An NMOS transistor formed in the peripheral circuit region 116 is shown as an example in FIG. 18D of the present embodiment.

After removing the above-noted mask, in the same manner a mask for forming a p-type diffusion layer and having an aperture over the element formation region 112 is formed, an impurity is introduced in a self-aligning manner with respect to the gate electrodes 224, so as to form a p+ type diffusion layer. Boron or the like can be used as the impurity for forming the p+ type diffusion layer. After forming the p+ type diffusion layer, the mask is removed. The p+ type diffusion layer is not shown in FIG. 18A to FIG. 18D.

Figure 19A:
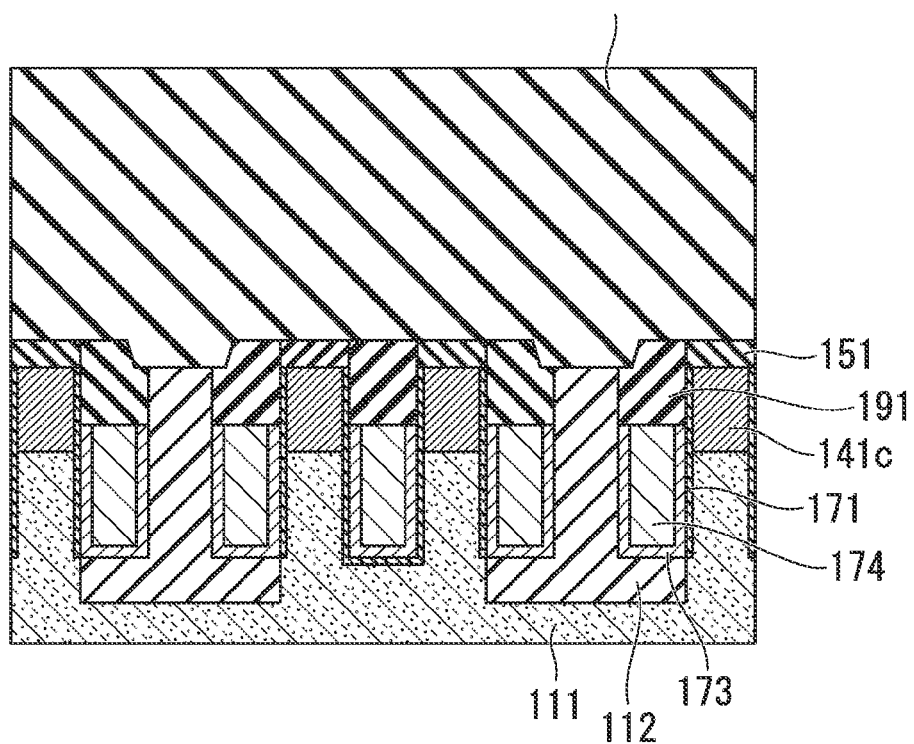
FIG. 19A is a fragmentary cross sectional elevation view of a step, subsequent to the step of FIGS. 18A through 18D, involved in the method of forming a semiconductor device of FIGS. 1-5, taken along an Y1-Y1' line of FIG. 18A, in accordance with the first preferred embodiment of the present invention.
Figure 19B:
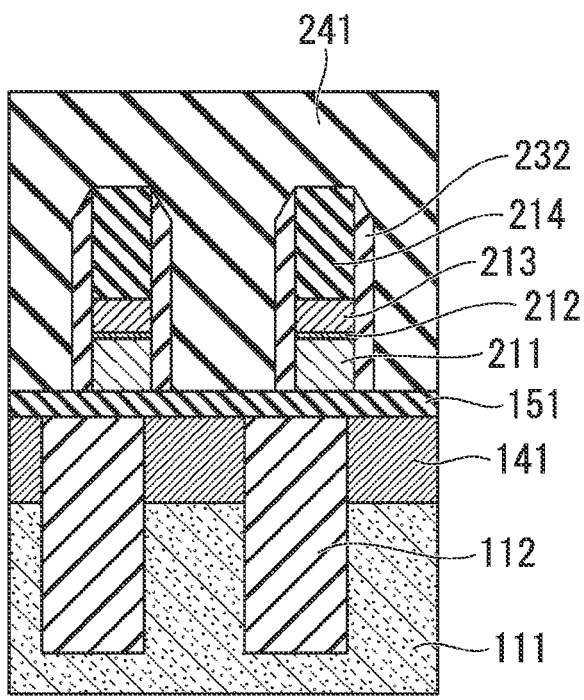
FIG. 19B is a fragmentary cross sectional elevation view of the same step as in FIG. 19A, taken along an X1-X1' line of FIG. 18A, in accordance with the first preferred embodiment of the present invention.
Figure 19C:
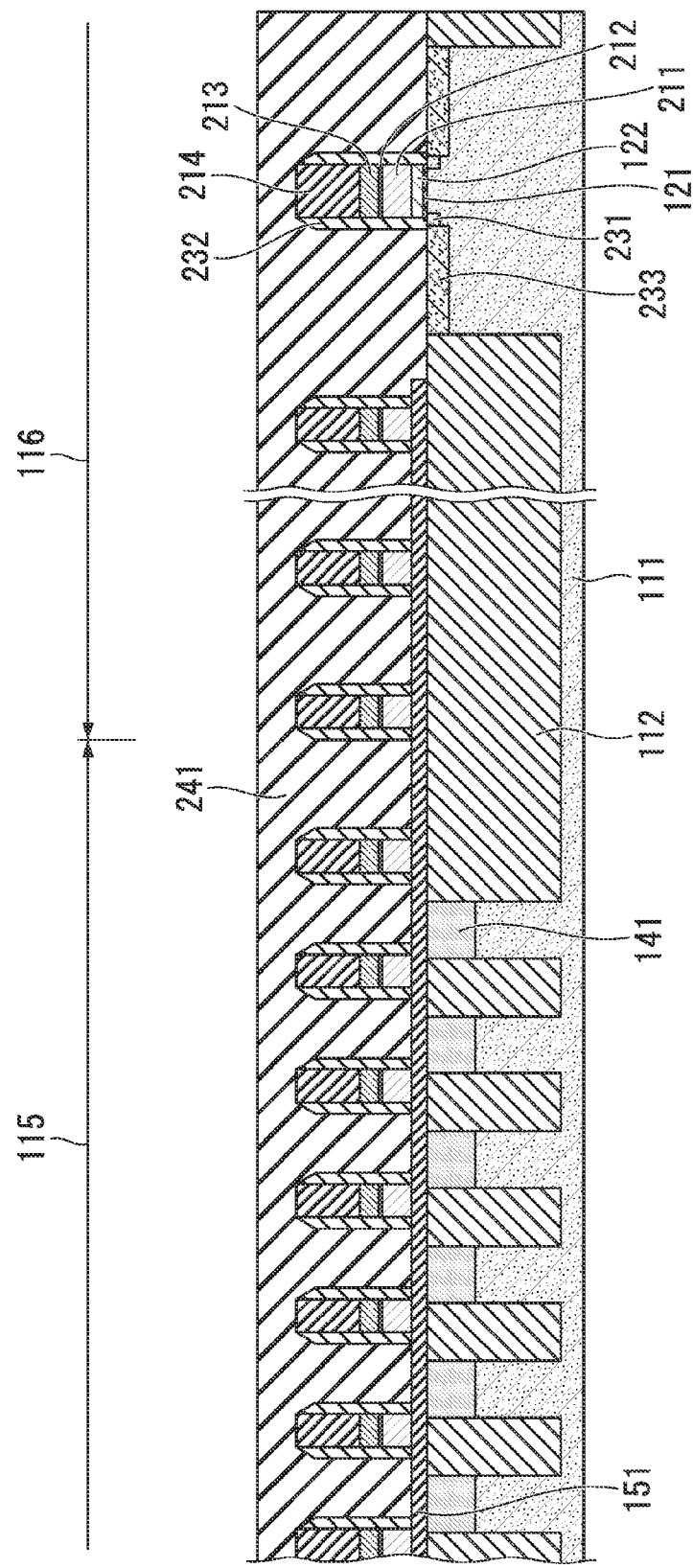
FIG. 19C is a fragmentary cross sectional elevation view of the same step as in FIG. 19A, in accordance with the first preferred embodiment of the present invention.

As shown in FIG. 19A to FIG. 19C, the first interlayer film 241 is formed above the bit lines 222, the peripheral interconnects 223, and the gate electrodes 224, so as to bury between these interconnects. A film having an etching rate that is faster than that of the materials of the bit line capacitor film 214 and the first side wall 232 in the etching process for forming the capacitor contact and one that better gap-filling properties can be used as the material of the first interlayer film 241. In consideration of the DRAM characteristics, it is preferable that a material having a low dielectric constant be used, from the standpoint of reducing the interconnect capacitances between bit lines 222. A silicon oxide film or BSFG (boron phosphorus silicon glass) film or the like can be used as such a material. In using a silicon oxide film, it is possible to use a CVD film, or an SOD (spin-on dielectric) film or the like. In the DRAM 1000, an SOD film is used as the material of the first interlayer film 241. An SOD film has particularly good flatness, and can be formed as a globally flat surface over both the cell region 115 and the peripheral circuit region 116. The film thickness of the first interlayer film 241 is preferably approximately 700 nm in the flat part, and preferably formed with a thickness of approximately 400 nm over the bit line capacitor film 214.

CMP is used to remove by polishing the upper part of the first interlayer film 241, resulting in the formation of a first interlayer film 241 that is globally planarized over both the cell region 115 and the peripheral circuit region 116. The film thickness is preferably approximately 400 nm over the planar part, and is preferably formed to be substantially 100 nm over the bit line capacitor film 214.

In the formation of the first interlayer film 241, the first interlayer film may be removed by polishing until the top of the bit line capacitor film 214 is exposed, after which an insulating film having a thickness of approximately 100 nm is formed.

As shown in FIG. 20A to FIG. 20D, a fifth mask 251 for forming a capacitor contact aperture is formed in the cell region 115. The fifth mask 251 has an aperture at the drain diffusion layer 141c that passes through the first interlayer film 241. This aperture will be referred to as the fifth mask aperture 252.

The pattern of the fifth mask aperture 252 is formed so that one aperture part opens up a plurality of drain diffusion layers 141c provided so as to straddle a bit line in the Y direction, and so as to be a narrow rectangle extending in the Y direction. Each of the fifth mask apertures 252 is formed at a position opposite a row of drain diffusion layers 141c arranged in the Y direction, and a plurality thereof are arranged in the X direction.

Figure 20A:
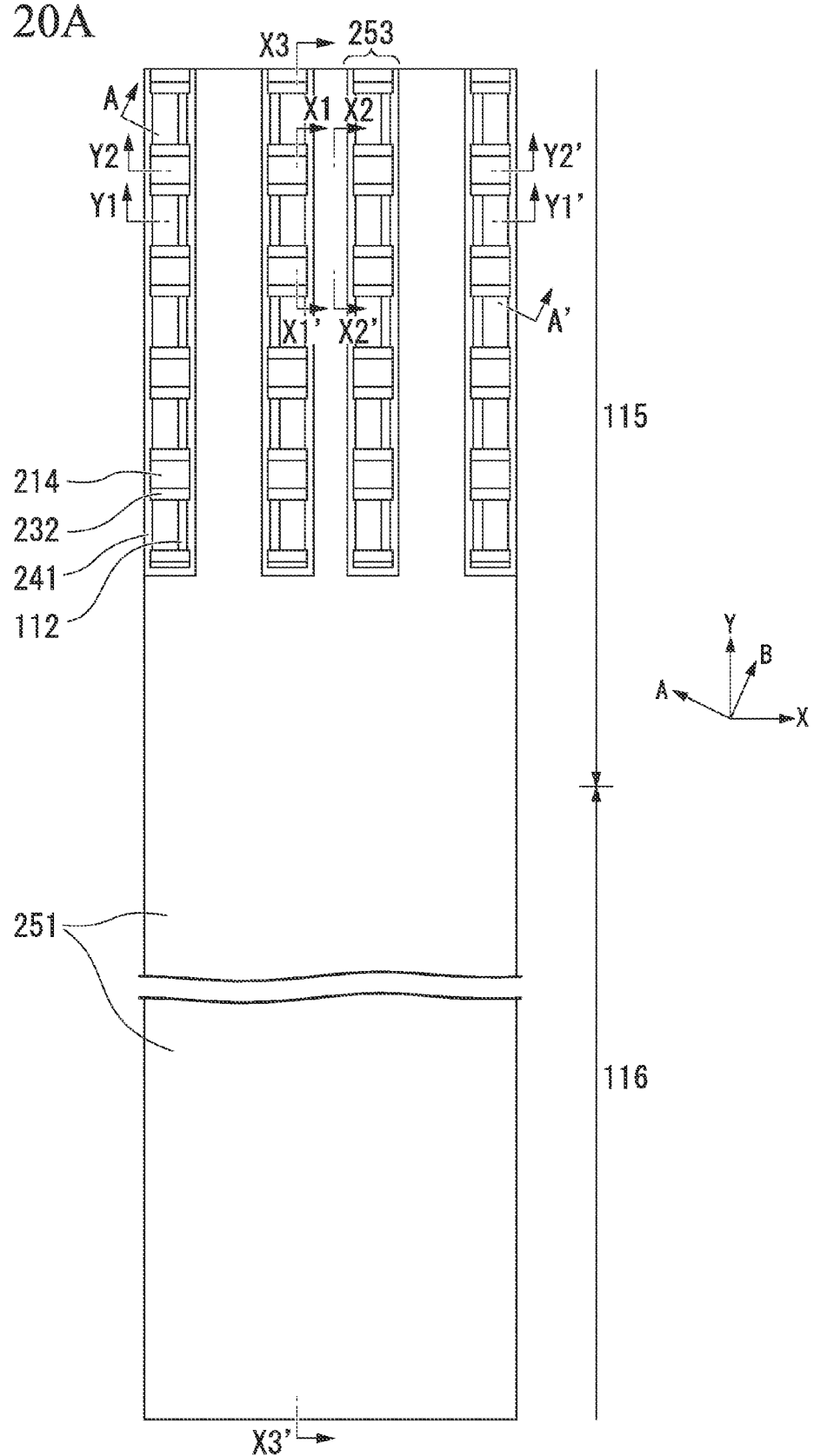
FIG. 20A is a fragmentary plain view of a step, subsequent to the step of FIGS. 19A through 19C, involved in the method of forming a semiconductor device of FIGS. 1-5, in accordance with the first preferred embodiment of the present invention.
Figure 20B:
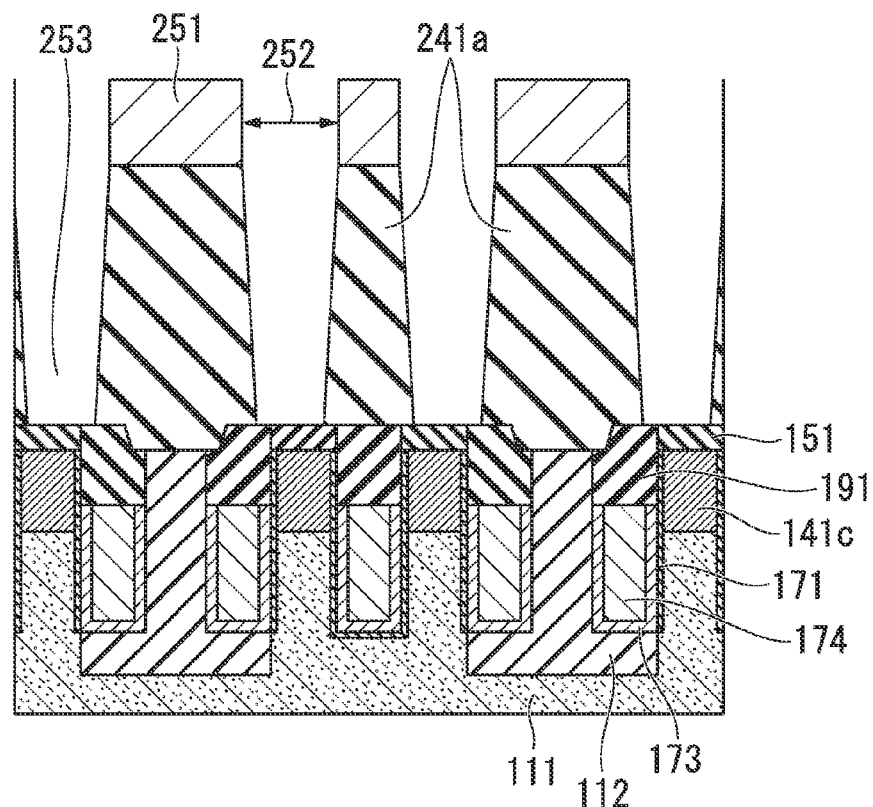
FIG. 20B is a fragmentary cross sectional elevation view of the same step as in FIG. 20A, taken along an Y1-Y1' line of FIG. 20A, in accordance with the first preferred embodiment of the present invention.
Figure 20C:
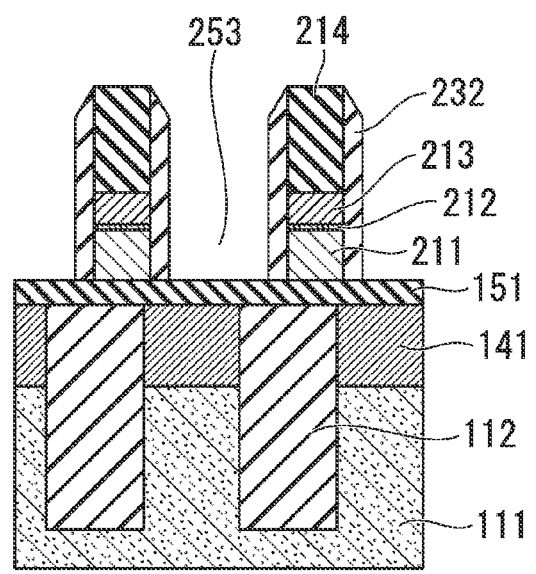
FIG. 20C is a fragmentary cross sectional elevation view of the same step as in FIG. 20A, taken along an X1-X1' line of FIG. 20A, in accordance with the first preferred embodiment of the present invention.
Figure 20D:
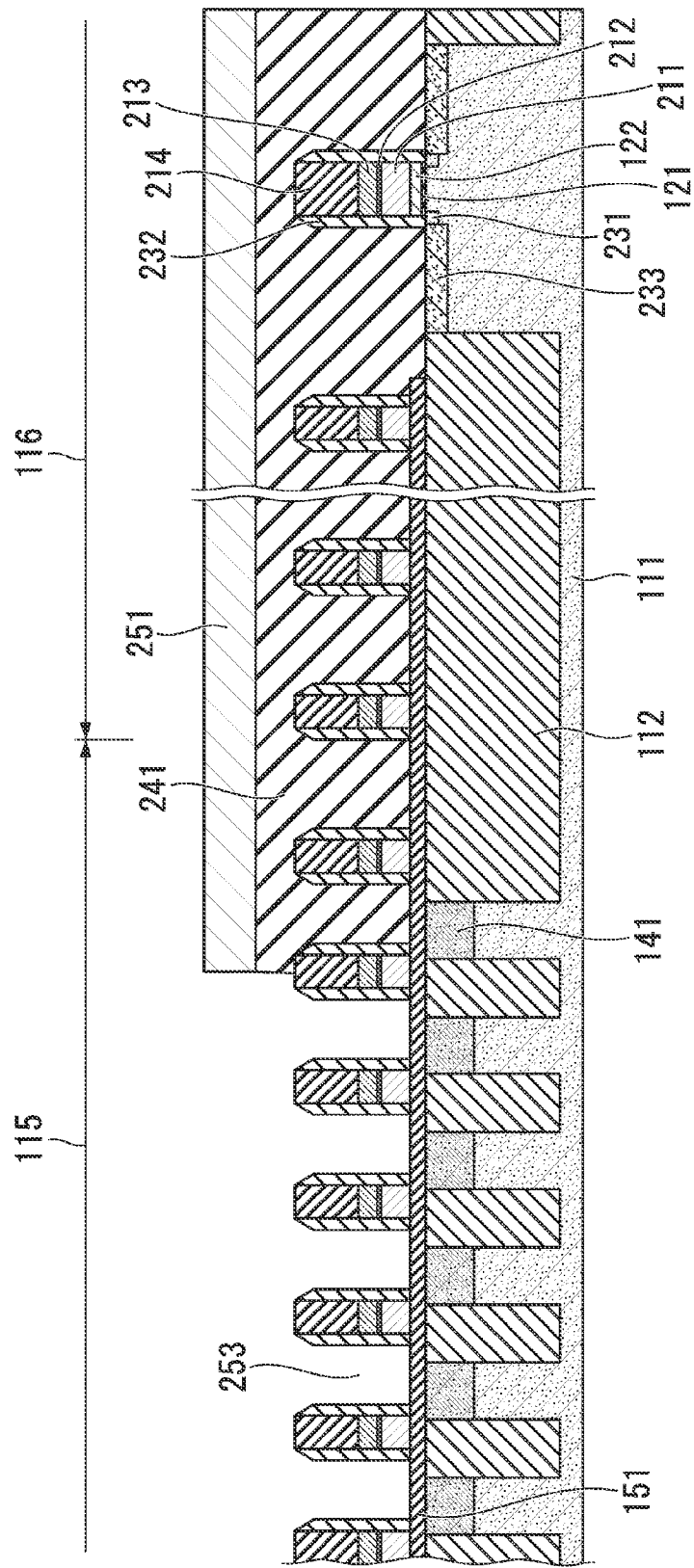
FIG. 20D is a fragmentary cross sectional elevation view of the same step as in FIG. 20A, in accordance with the first preferred embodiment of the present invention.

As shown in FIG. 20B, the first interlayer film 241 is etched, using the fifth mask 251, so as to form an aperture part 253 that exposes the mask insulating film 151 formed on the substrate. Hereinafter, this etching process will be referred to as the capacitor contact etching. The capacitor contact etching is performed with conditions that enable the establishment of a selectivity ratio with respect to the bit line capacitor film 214 and the first side wall film 242, so as to cause these films to remain.

Between adjacent fifth mask apertures 252, beneath the fifth mask 251 pillar-shaped first interlayer films 241 extending in the Y direction remains. This pillar will be referred to as a pillar-shaped first interlayer film 241a. There are two types of pillar-shaped first interlayer films 241a, a pillar-shaped first interlayer film 241a formed above between adjacent drain diffusion layers 141c, and a first interlayer film 241a formed above a bit line contact 215, both types, as shown in FIG. 20A, being formed so as to straddle over the bit lines 222 and extend in the Y direction. The height of the pillar-shaped first interlayer films 241a is preferably approximately 400 nm at the top of the mask insulating film 151, and approximately 100 nm at the top of the bit line capacitor film 214.

Next, as shown in FIG. 21A to FIG. 21D, the fifth mask 251 is removed.

A second side wall film material is formed so as to cover inside the aperture part 253, over the bit line 224, and over the first interlayer film 241. A silicon nitride film can be used as the material of the second side wall film, and the film thickness is preferably approximately 5 nm.

The second side wall film material is etched back, so as to form a second side wall film 261 on the side wall of the aperture part 253. Simultaneously, the mask insulating film 151 on the bottom part is removed, thereby exposing the upper surface of the drain diffusion layer 141c. The process of exposing the upper surface of the drain diffusion layer 141c may also be done in the process step of forming the capacitor contact etching apertures 253 shown in FIG. 15A to FIG. 15D. When that is done, the second side wall film 261 of the process step shown in FIG. 21A to FIG. 21D is formed so as to cover the first interlayer film 241 and the side wall of the aperture part 253 opened in the mask insulating film 151.

Figure 21A:
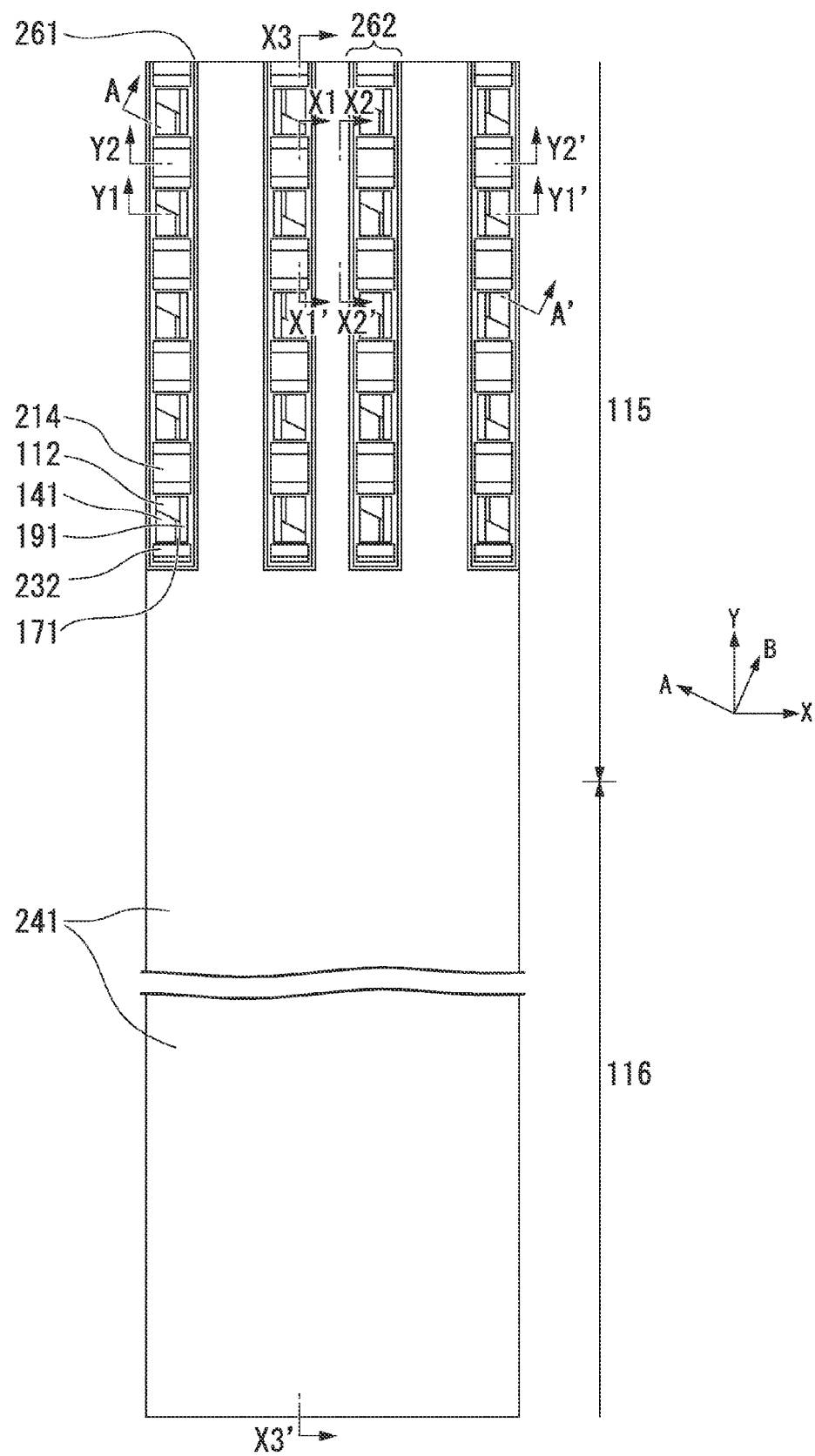
FIG. 21A is a fragmentary plain view of a step, subsequent to the step of FIGS. 20A through 20D, involved in the method of forming a semiconductor device of FIGS. 1-5, in accordance with the first preferred embodiment of the present invention.
Figure 21B:
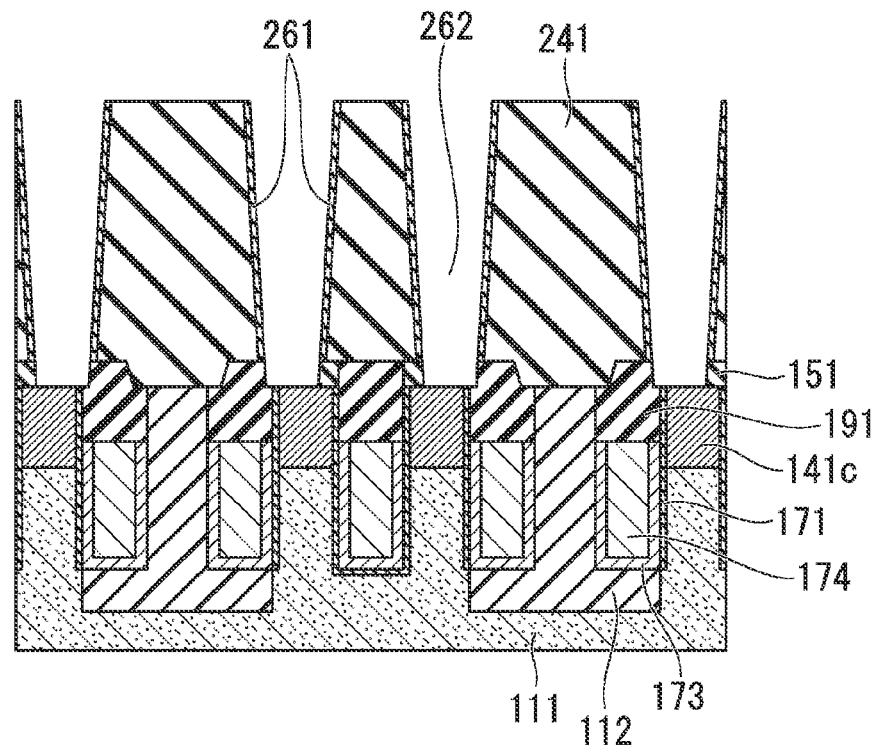
FIG. 21B is a fragmentary cross sectional elevation view of the same step as in FIG. 21A, taken along an Y1-Y1' line of FIG. 21A, in accordance with the first preferred embodiment of the present invention.
Figure 21C:
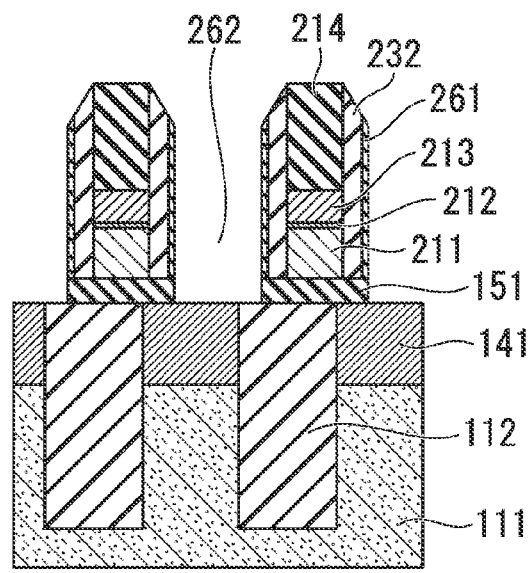
FIG. 21C is a fragmentary cross sectional elevation view of the same step as in FIG. 21A, taken along an X1-X1' line of FIG. 21A, in accordance with the first preferred embodiment of the present invention.
Figure 21D:
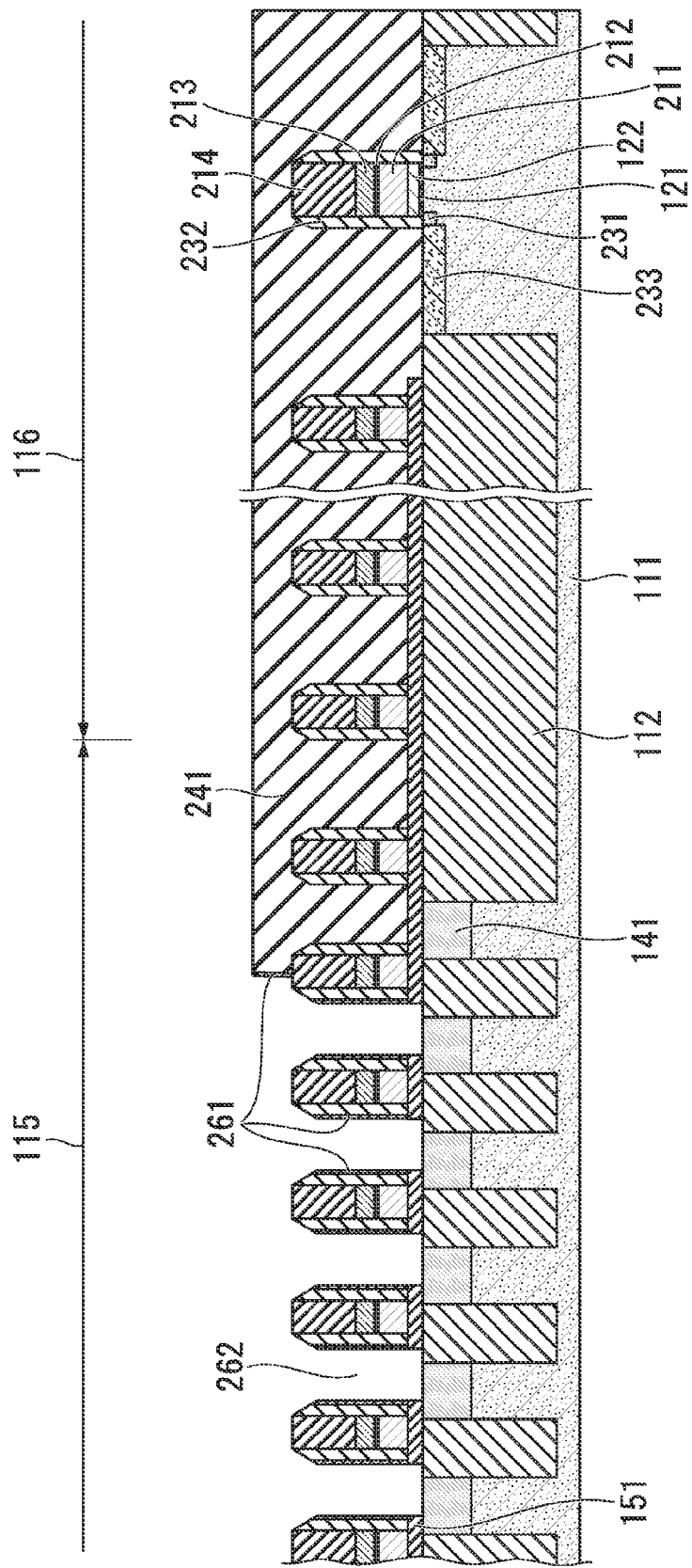
FIG. 21D is a fragmentary cross sectional elevation view of the same step as in FIG. 21A, in accordance with the first preferred embodiment of the present invention.

By proceeding through this process step, a capacitor contact aperture 262 shown in FIG. 21A is formed. The capacitor contact aperture 262 is sandwiched in the X direction by the pillar-shaped first interlayer film 241a and sandwiched in the Y direction by adjacent bit lines 224, and at the bottom part the drain diffusion layer 141c is exposed. A second side wall film 261 is formed on the side wall of the capacitor contact aperture part 262.

The second side wall film 261 is formed so that, in the washing processing in the next process step in which the contact conductive film 271 is formed, reduction of the side surface of the first interlayer film 241 by etching is prevented. In the case in which such film reduction is not a problem, the second side wall film 261 need not be formed.

Figure 22A:
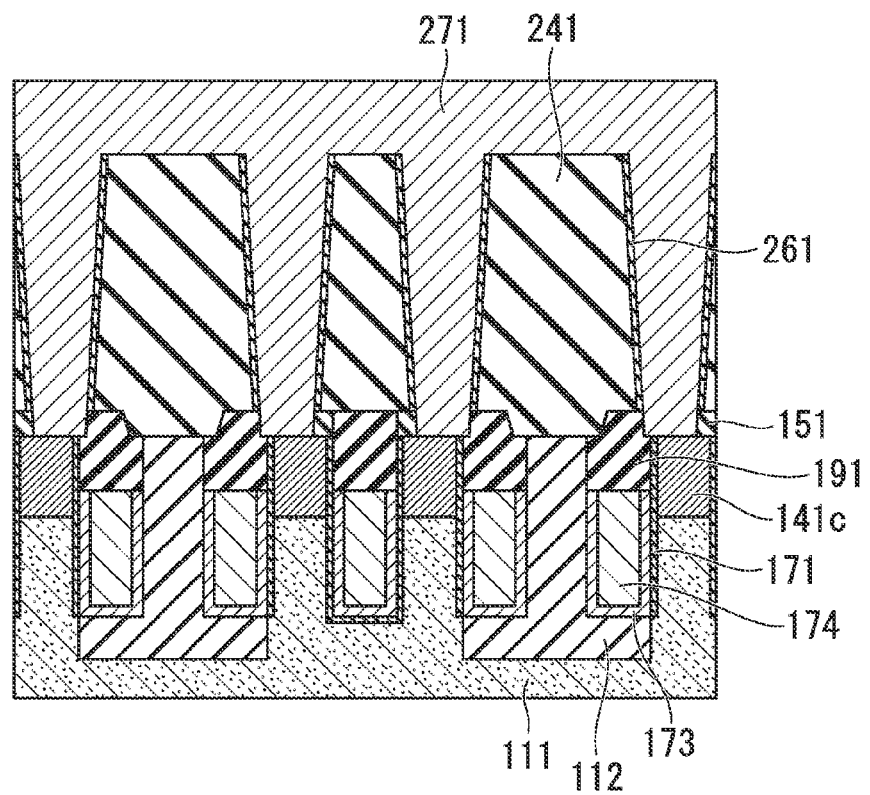
FIG. 22A is a fragmentary cross sectional elevation view of a step, subsequent to the step of FIGS. 21A through 21D, involved in the method of forming a semiconductor device of FIGS. 1-5, taken along an Y1-Y1' line of FIG. 21A, in accordance with the first preferred embodiment of the present invention.
Figure 22B:
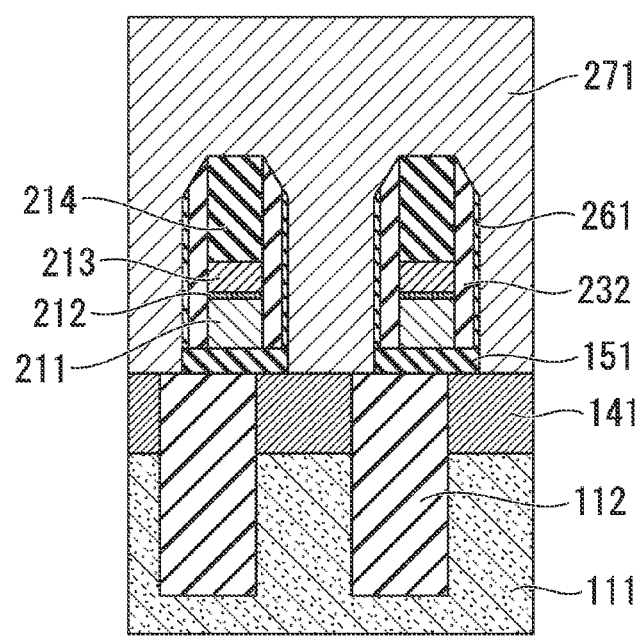
FIG. 22B is a fragmentary cross sectional elevation view of the same step as in FIG. 22A, taken along an X1-X1' line of FIG. 22A, in accordance with the first preferred embodiment of the present invention.
Figure 22C:
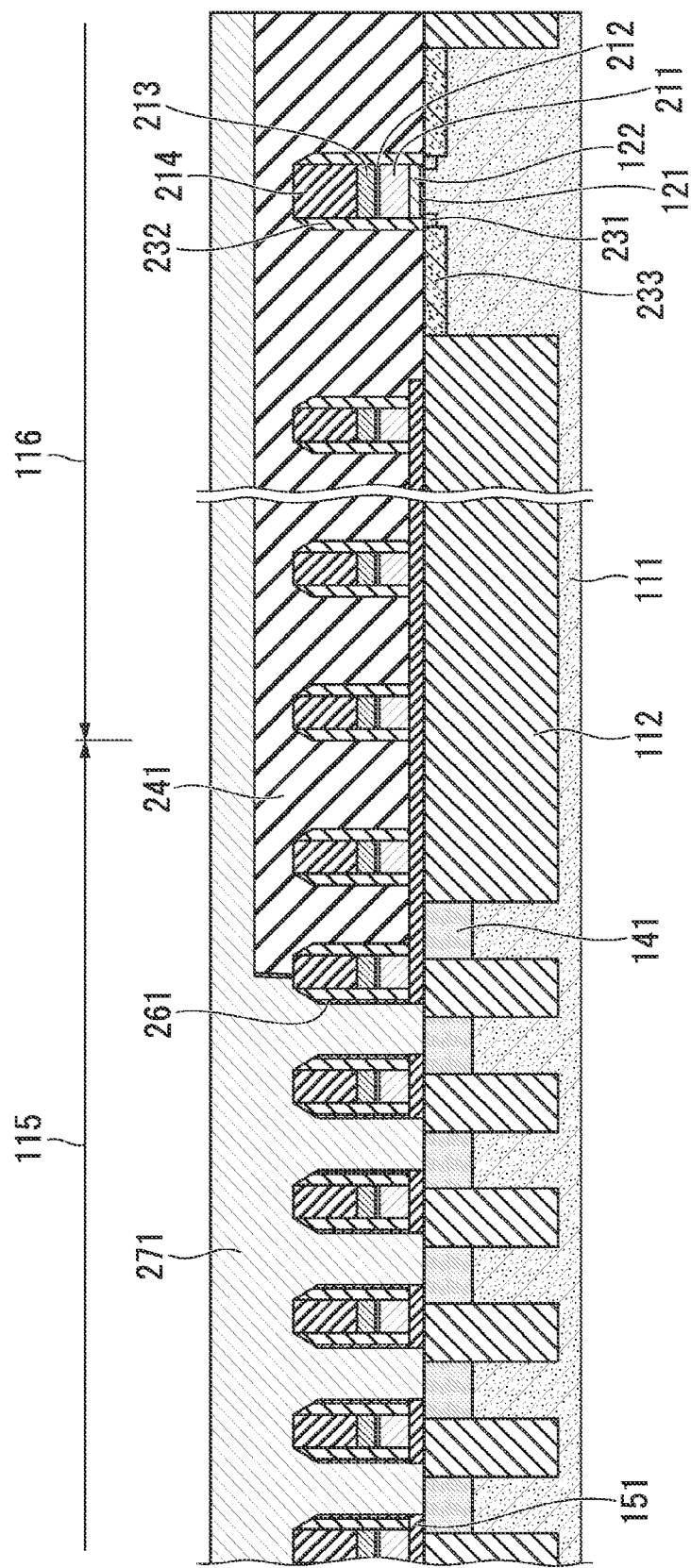
FIG. 22C is a fragmentary cross sectional elevation view of the same step as in FIG. 22A, in accordance with the first preferred embodiment of the present invention.

As shown in FIG. 22A to FIG. 22C, the inside of the capacitor contact aperture 262 is filled, and a contact conductive film 271 is formed so as to cover the first interlayer film 241. A phosphorus-doped silicon film can be used as the material of the contact conducting film 271, and it is preferable that the film thickness be approximately 200 nm. The contact conductive film 271 is connected to the drain diffusion layer 141c at the bottom part.

Figure 23A:
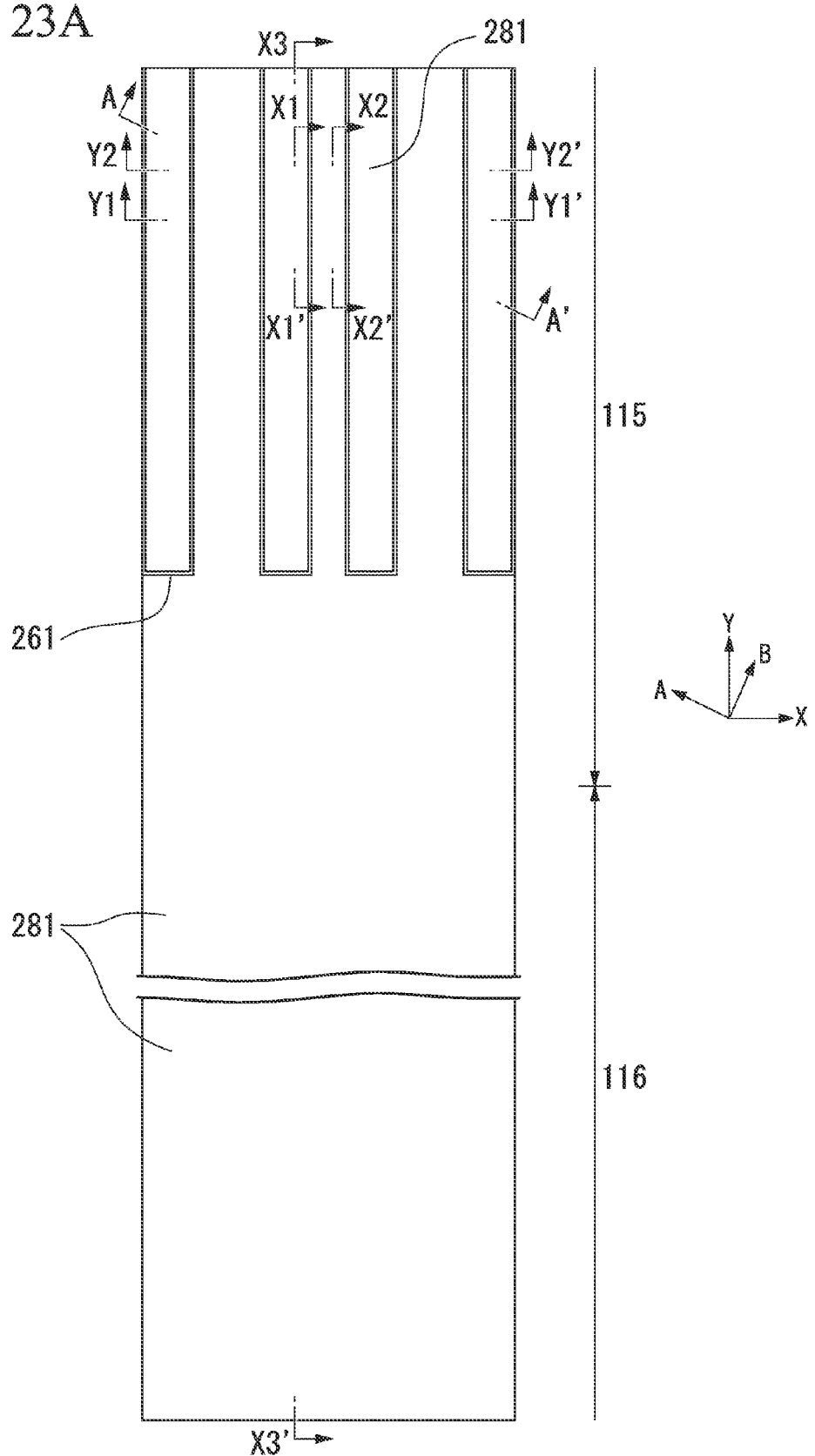
FIG. 23A is a fragmentary plain view of a step, subsequent to the step of FIGS. 22A through 22C, involved in the method of forming a semiconductor device of FIGS. 1-5, in accordance with the first preferred embodiment of the present invention.
Figure 23B:
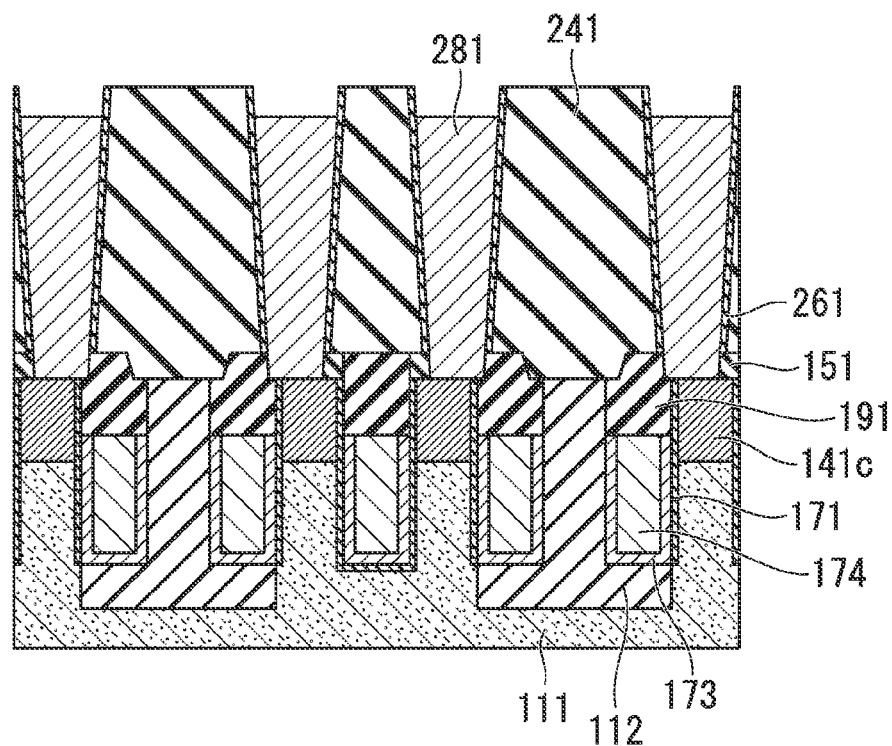
FIG. 23B is a fragmentary cross sectional elevation view of the same step as in FIG. 23A, taken along an Y1-Y1' line of FIG. 23A, in accordance with the first preferred embodiment of the present invention.
Figure 23C:
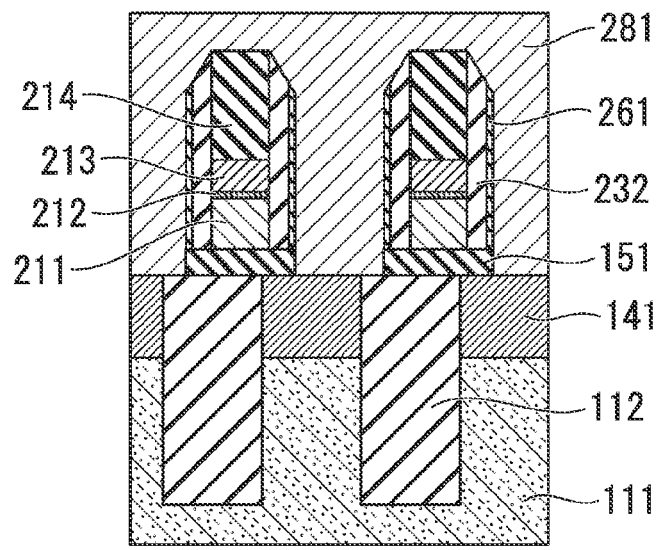
FIG. 23C is a fragmentary cross sectional elevation view of the same step as in FIG. 23A, taken along an X1-X1' line of FIG. 23A, in accordance with the first preferred embodiment of the present invention.
Figure 23D:
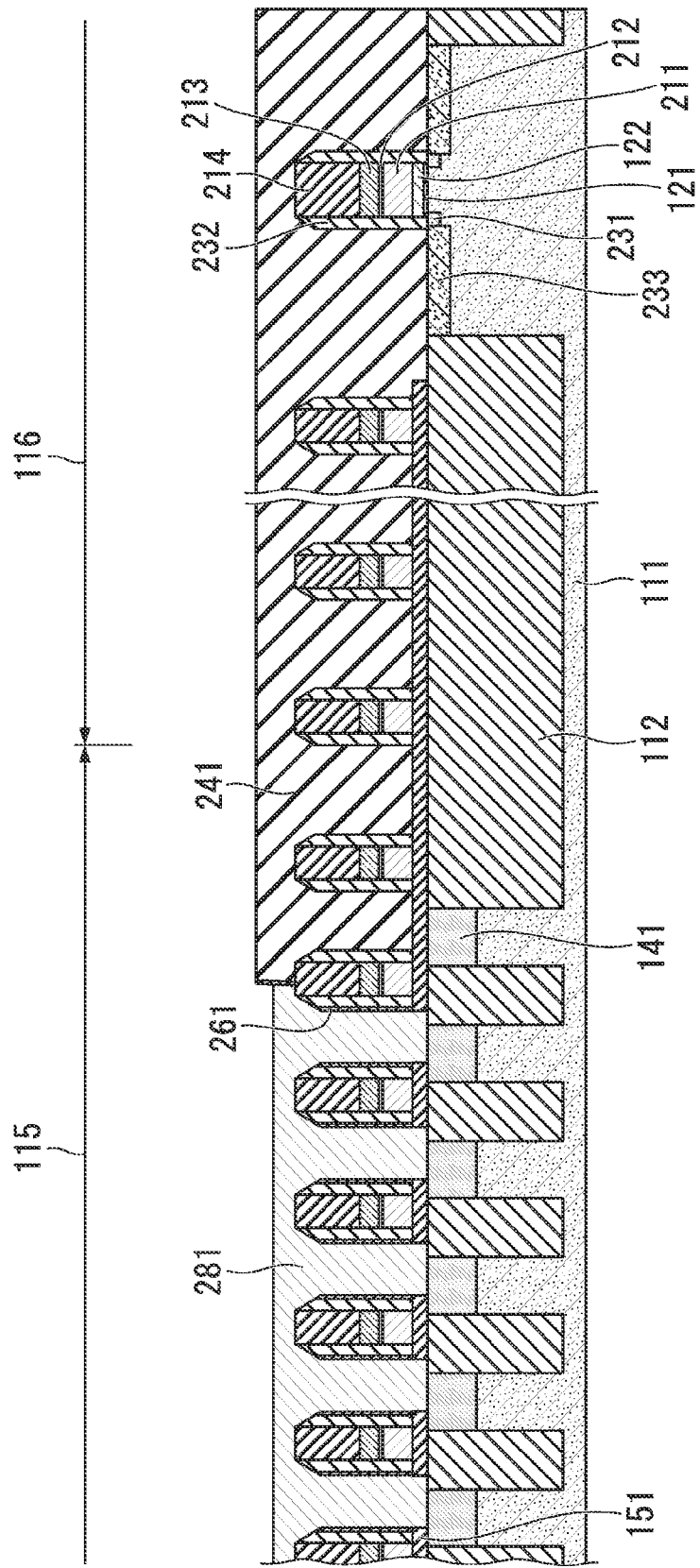
FIG. 23D is a fragmentary cross sectional elevation view of the same step as in FIG. 23A, in accordance with the first preferred embodiment of the present invention.

The contact conductive film 271, as shown in FIG. 23B, is etched back so as to remove the contact conductive film 271 over the first interlayer film 241 and form the contact conductive film 281 inside the capacitor contact aperture 262. The contact conductive film 281 is formed to have a height that is at least as high as the height of the upper surface of the bit line capacitor film 214 and no higher than the height of the upper surface of the first interlayer film 241.

The position of the upper surface of the contact conductive film 271 is preferably formed to be approximately 50 nm higher than the upper surface of the bit line capacitor film 214 and also be approximately 50 nm lower than the upper surface of the first interlayer film 241.

By performing this etching back, it is possible to reduce the amount of polishing of the contact conductive film 281 in the polishing that is performed next with respect to the contact conductive film 281, and also possible to reduce the burden on the contact conductive film 281.

The contact conductive film 281, as shown in FIG. 23A, is formed in a shape that buries the pattern of the second mask aperture 252 when seen in plan view, and in the shape of a long narrow rectangle that extends in the Y direction. The contact conductive film 281 is formed in the cell region 115 arranged in a row with high density in the X direction.

The contact conductive film 281 is mutually connected to a plurality of drain diffusion layers 141c that are arranged in a row with a bit line 224 therebetween in the Y direction. That is, different drain diffusion layers 141c are formed so as to be mutually shorted together, via the contact conductive film 281.

Next, polishing removal, as shown in FIG. 24A, is done by CMP with respect to the contact conductive film 281, so as to separate the contact conductive film 281 extending in the Y direction into a plurality of regions on the upper surface of the bit line capacitor film 214. Next, separated contact conductive films are formed for each drain diffusion layer 141c. The separated contact conductive films will be the capacitor contacts. This polishing process step will be referred to as the contact plug polishing process step.

The contact plug polishing process step will now be described in detail.

The exposed contact conductive film 281 is polished down so as to expose the upper surface of the bit line capacitor film 214 that had been formed blow the contact conductive film 281. When this is done, polishing is also done to the first interlayer film 241, and it is preferable that the polishing been done down to the top of the bit line capacitor film 214. This is because, if the contact conductive film 281 remains on the side wall of the first interlayer film 241 of the capacitor contact aperture 262, there is a risk of shorting by the straddling of the contact conductive film 281 across the bit line capacitor film 214.

After exposure of the bit line capacitor film 214, over-polishing is done so as to polish down the bit line capacitor film 214. The over-polishing assures that the contact conductive film 281 is separated by the bit line capacitor film 214, so that formation is done without shorting.

As described above, the polishing done by CMP in the method for manufacturing a semiconductor device according to the present embodiment is constituted by main polishing, whereby overall polishing is done to lower the surface of the contact conductive film 281 and first interlayer film 241 so as to expose the bit line capacitor film 214, and over-polishing, whereby the bit line capacitor film 214 is polished down.

Figure 24B:
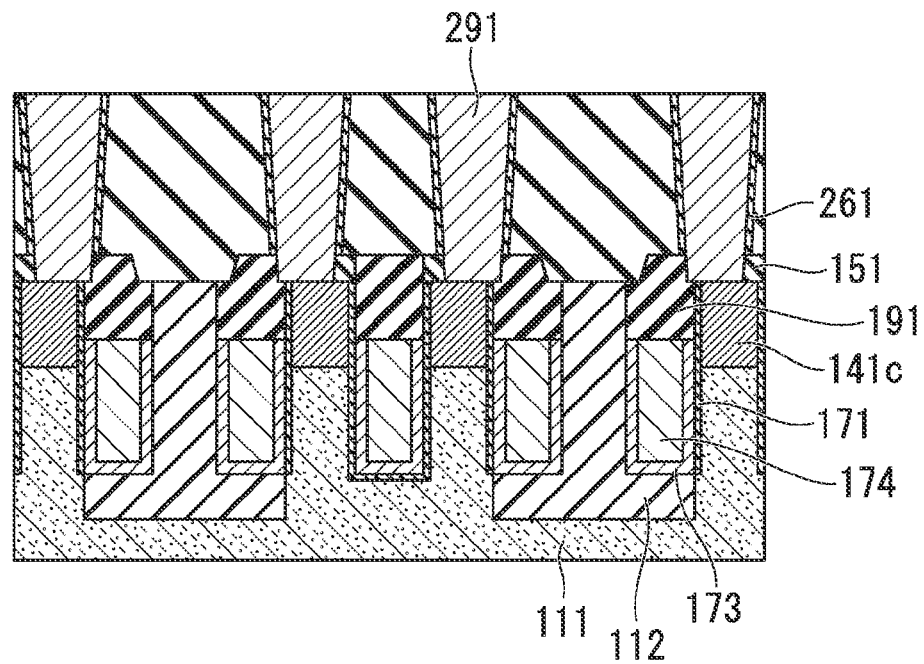
FIG. 24B is a fragmentary cross sectional elevation view of the same step as in FIG. 24A, taken along an Y1-Y1' line of FIG. 24A, in accordance with the first preferred embodiment of the present invention.
Figure 24C:
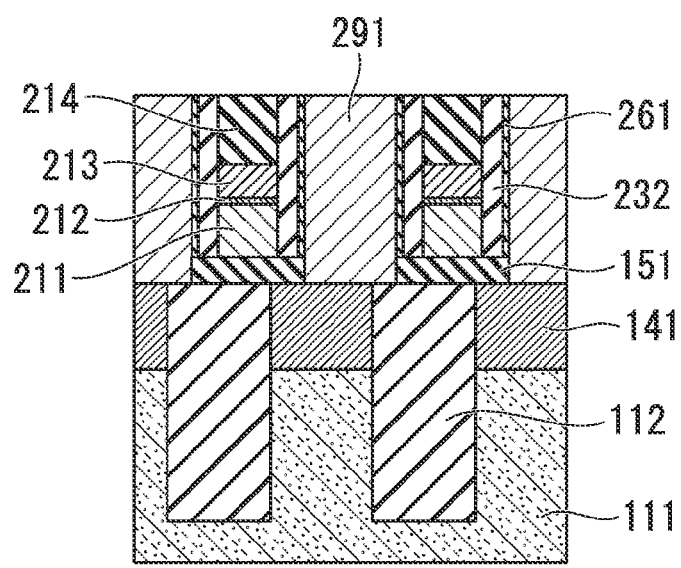
FIG. 24C is a fragmentary cross sectional elevation view of the same step as in FIG. 24A, taken along an X1-X1' line of FIG. 24A, in accordance with the first preferred embodiment of the present invention.
Figure 25A:
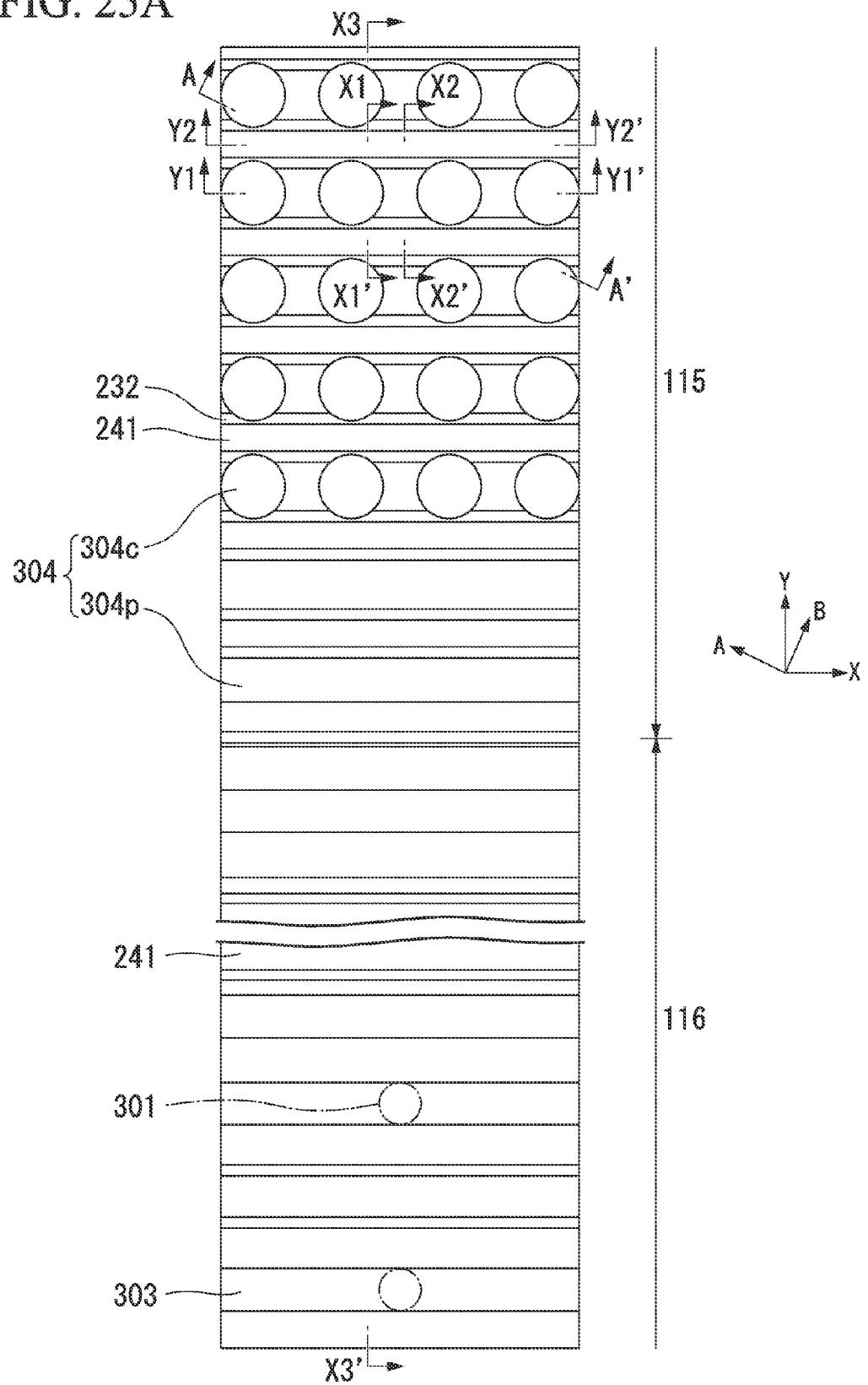
FIG. 25A is a fragmentary plain view of a step, subsequent to the step of FIGS. 24A through 24D, involved in the method of forming a semiconductor device of FIGS. 1-5, in accordance with the first preferred embodiment of the present invention.
Figure 25B:
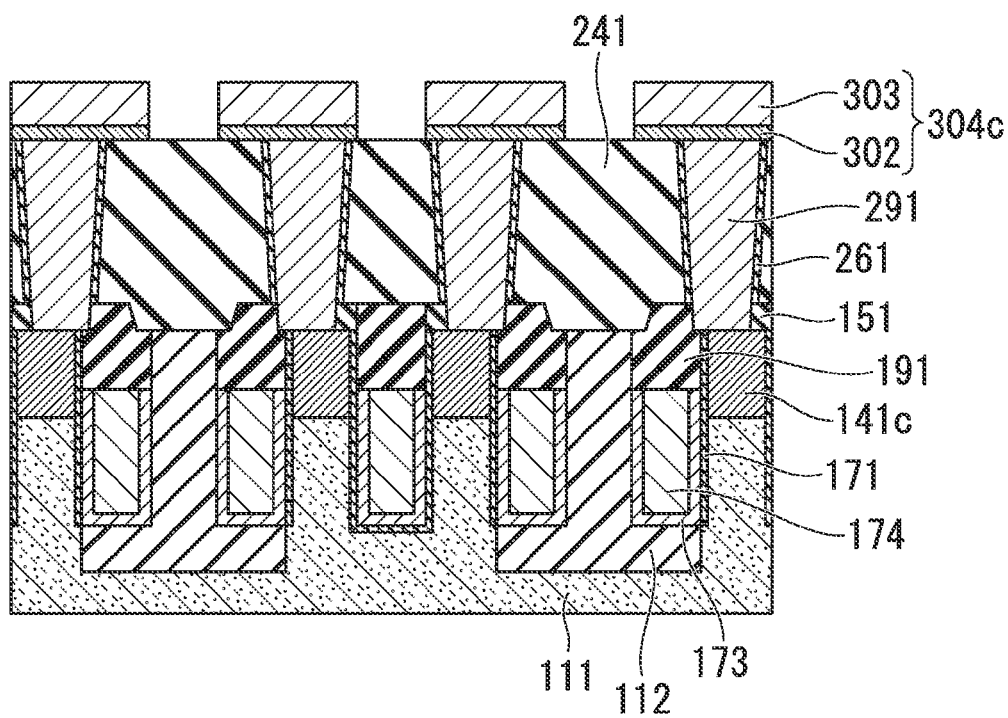
FIG. 25B is a fragmentary cross sectional elevation view of the same step as in FIG. 25A, taken along an Y1-Y1' line of FIG. 25A, in accordance with the first preferred embodiment of the present invention.
Figure 25C:
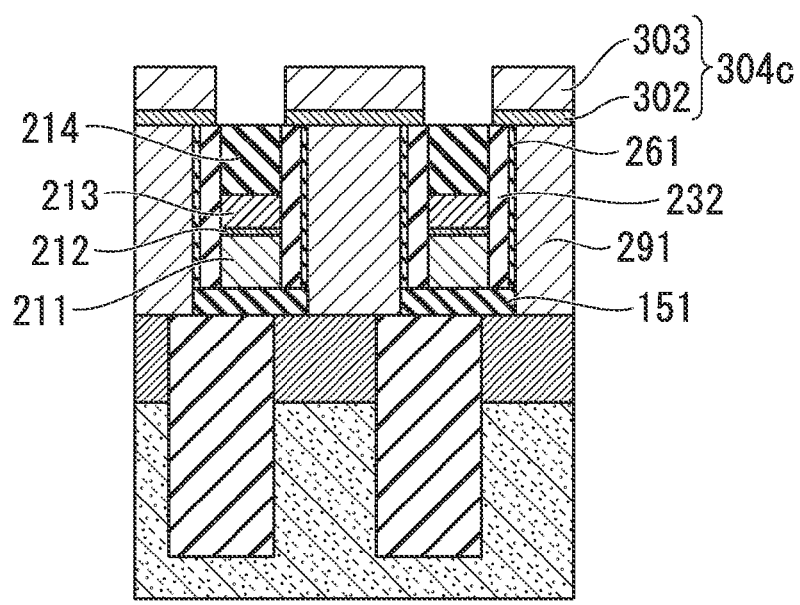
FIG. 25C is a fragmentary cross sectional elevation view of the same step as in FIG. 25A, taken along an X1-X1' line of FIG. 25A, in accordance with the first preferred embodiment of the present invention.
Figure 25D:
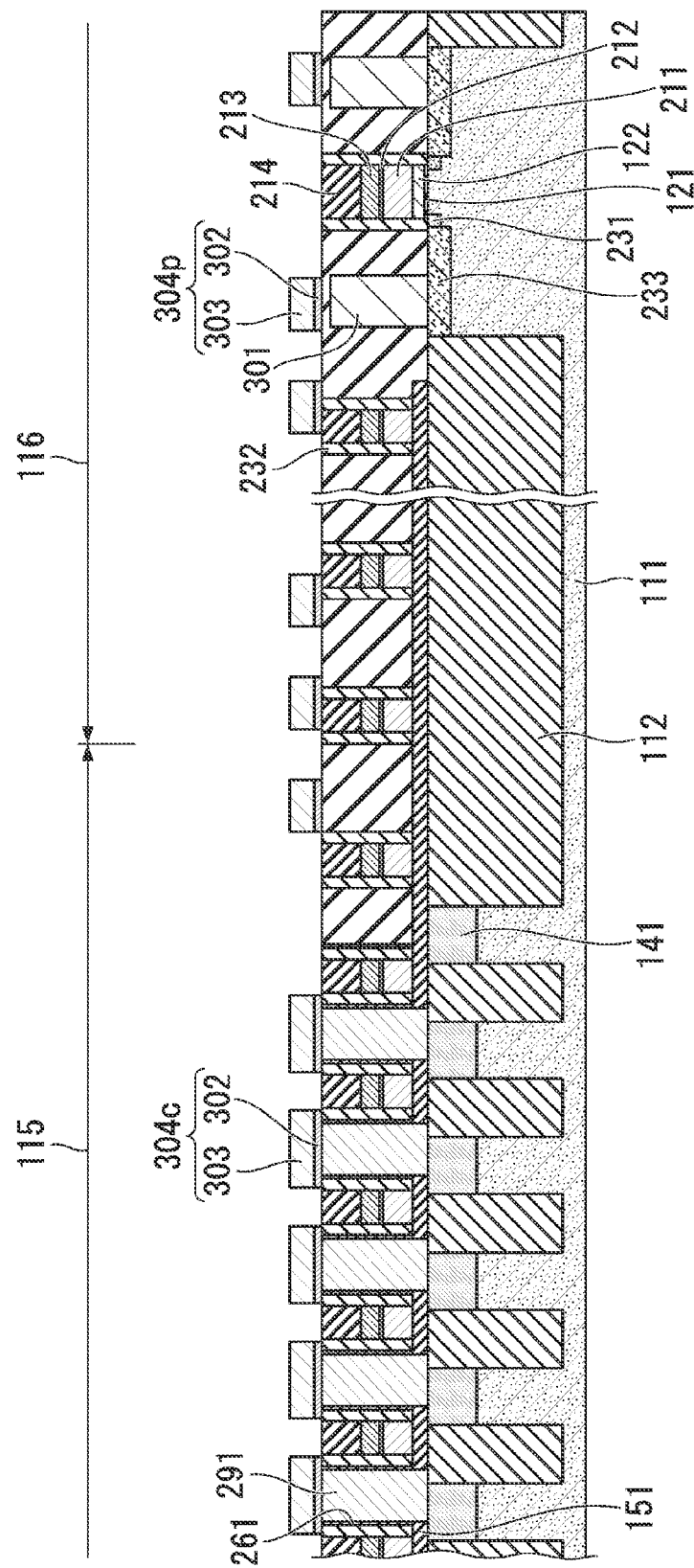
FIG. 25D is a fragmentary cross sectional elevation view of the same step as in FIG. 25A, in accordance with the first preferred embodiment of the present invention.

By performing the contact plug formation process step, a contact conductive film 291 is formed that is separated by the bit line capacitor film 214, as shown in FIG. 24B, from the contact conductive film 281 formed to extend in the Y direction. One separated contact conductive film 291 is connected to each drain diffusion layer 141c.

In the method for manufacturing a semiconductor device according to the present embodiment, as shown in FIG. 20A to FIG. 20D, a plurality of drain diffusion layers 141c arranged in the Y direction are opened up by the aperture of one resist aperture part. A long, narrow rectangular pattern is formed extending lengthwise in the Y direction. It is preferable that the aperture width of this pattern be approximately equivalent with the minimum process dimension value F by etching. Using this resist pattern, apertures are formed in the interlayer film, contact conductive film is filled into the apertures, and CMP is used to polish the contact conductive film down to the top of the bit line capacitor film 214, thereby forming the capacitor contact. In this method of forming the capacitor contact, it is possible to increase the surface area of the aperture of the resist aperture part. Also, compared with the conventional method of using a hole to form a capacitor contact, it is possible to increase the exposure resolution margin in formation of the resist mask using lithography, and to increase the yield.

The films that are polished in the contact plug formation process step are two types of films, these being the contact conductive film 281 and the first interlayer film 241 in the main polishing, and the three types of films, these being the contact conductive film 281, the first interlayer film 241, and the bit line capacitor film 214 in the over-polishing. In this case, because the second side wall film 261 is extremely thin compared to the other films and can be easily polished, it is not considered in the contact plug formation process step.

A silicon film made of phosphorus-doped silicon and a silicon oxide film or the like can be used as the films polished by the main polishing. As the material for the films polished by the over-polishing, three types of materials, these being a silicon nitride film added to the above-noted two film types, specifically, a silicon film, a silicon oxide film, and a silicon nitride film.

In order to form the contact conductive film 291 separated in the Y direction by the bit line capacitor film 214, the contact plug formation process step completely removes unwanted parts of the contact conductive film 281 existing on the bit line capacitor film 214, so as to expose the bit line film 214.

Also, in the method for manufacturing a semiconductor device according to the present embodiment, in order to prevent the occurrence of erosion in the cell region, the polishing is done with conditions under which the polishing rate of the first interlayer film 241 and the bit line capacitor film 214 is faster than that of the contact conductive film 281. The ratio between the polishing rates of the first interlayer film 241 and the bit line capacitor film 214 is preferably such that the rates are approximately equivalent.

In the case of forming the first interlayer film 241, the bit line capacitor film 214, and the contact conductive film 281 from a silicon oxide film, a silicon nitride film, and a silicon film, respectively, the ratio between the polishing rate of the silicon oxide film, the polishing rate of the silicon nitride film, and the polishing rate of the silicon film is preferably 1 to 0.6:1 to 0.6:0.4 to 1:0.05, these polishing rate being the rates for totally covering films.

Next, the contact plug formation process step in the method for manufacturing a semiconductor device according to the present embodiment will be described in detail. First, as the main polishing, the first interlayer film 241 and the contact conductive film 281 are polished to a height at which the upper surface of the bit line capacitor film 214 is exposed. Because the conditions are such that the polishing rate of the first interlayer film 241 is higher than the polishing rate of the contact conductive film 281, polishing removal of the first interlayer film 241 formed in the surrounding area proceeds ahead of the polishing of the contact conductive film 281. The contact conductive film 281 has the shape of a micro-pattern having a width seen in plan view of approximately F to 2F, where F is the minimum process dimension. For this reason, the mechanical polishing acts greatly on the protruding portions of the contact conductive film 281, making it easy to remove the contact conductive film 281. Also, the contact conductive film 281 is removed by polishing so as to match with the flat surface made by the first interlayer film 241. That is, the polishing rate on the actual pattern of the contact conductive film 281 is faster than the polishing rate in the flat part. As a result, the semiconductor substrate is formed into a substantially flat surface as polishing proceeds. Erosion is therefore suppressed in the cell region 115.

As the above-described polishing proceeds, the bit line capacitor film 214 is exposed, and a plug-shaped contact conductive film 291 separated for each drain diffusion layer 141*c* is formed.

Additionally, over-polishing is done so as to polish down the upper part of the bit line capacitor film 214. The over-polishing is done with conditions under which the polishing rate of the bit line capacitor film 214 and the first interlayer film 241 is faster than the polishing rate of the contact conductive film 291. That is, the conditions are such that, compared to the contact conductive film 291, the surrounding film is easier to polish.

In the over-polishing as well, mechanical polishing proceeds in the same manner as in the main polishing. That is, compared to the plug-shaped contact conductive film 291, the polishing removal of the first interlayer film 241 and the bit line capacitor film 214 formed in the surrounding area proceeds with priority, and acts so as to form convexities in the contact conductive film 291. The size of the contact conductive film 291 is a pattern shape having a width seen in plan view of approximately F to 2F, where F is the minimum process dimension. For this reason, it is easy to remove the convexity by the action of the mechanical polishing. The contact conductive film 291 is removed by polishing so as to match with the height of flat surface made by the first interlayer film 241 and the bit line capacitor film 214. Therefore, the polishing rate on the actual pattern of the contact conductive film 291 is faster than the polishing rate in the flat part. In the cell region 115, the occurrence of erosion is suppressed. As a result, the substrate being polished is planarized as polishing proceeds.

In order that a step does not occur between the bit line capacitor film 214 and the first interlayer film 241, it is preferable the polishing rate of the bit line capacitor film 214 and the polishing rate of the first interlayer film 241 be substantially the same.

The films being polished by the main polishing are a silicon film and a silicon oxide film, and in the case of dividing the contact plug formation process step into main polishing and over-polishing, the selectivity ratio with respect to the silicon nitride film in the main polishing need not be considered. However, because the ending point of the main polishing tends to vary over the substrate surface of the semiconductor device, and it is difficult to stop the main polishing uniformly over the substrate surface of the semiconductor device, it is preferable to perform the main polishing and the over-polishing under the same conditions. Additionally, by performing the main polishing and the over-polishing under the same conditions, it is possible to avoid the loss of time for the purpose of changing the polishing conditions midway, thereby improving the throughput. In this polishing method, the need for control of the polishing conditions is reduced, and it is possible to increase productivity of the semiconductor device.

In the main polishing, the height of the flat substrate is determined by and dependent upon the polishing rates of the bit line capacitor film 214 and the first interlayer film 241. The polishing of the contact conductive film 291 is performed so as to pull the bit line capacitor film 214 and the first interlayer film 241 into a flat surface. The polishing rate of the actual pattern of the contact conductive film 291 is accelerated so that it is adjusted to the polishing rate of the first interlayer film 241 and the bit line capacitor film 214. The polishing rate of the contact conductive film 291 for a completely covering film can be set so that it is a polishing rate slower than that of the first interlayer film 241 and the bit line capacitor film 214. That is, by controlling the polishing of the bit line capacitor film 214 and the first interlayer film 241, it is possible to control the height of the substrate flat surface formed by the contact conductive film 291, the bit line capacitor film 214, and the first interlayer film 241.

Although a silicon film can be used as the contact conductive film 291, a silicon nitride film can be used as an interconnect-shaped capacitor film, and a silicon oxide film can be used as the interlayer film, the materials of these three types of films are not limited in this manner. Each of the films may be made of a plurality of types of films that have approximately the same polishing rates.

In the polishing process step in which three types of films are formed under the above-noted conditions, it is preferable that a polishing material be used that includes, polishing particles, a high-polymer chemical compound or an inorganic acid such that the polishing rates of the bit line capacitor film 214 and the first interlayer film 241 be faster than the polishing rate of the contact conductive film 291. By using such a polishing material, the ratio between the polishing rate of the silicon oxide film, the polishing rate of the silicon nitride film, and the polishing rate of the silicon film is 1.0 to 0.6:0.4 to 1:0.05, this being the condition for an appropriate selectivity ratio.

Silica particles or alumina particles and the like, which have a relatively strong mechanical polishing action, can be used as the polishing particles. Among such polishing particles, because they can form the contact plug without causing scratches, colloidal silica particles, one type of silica particles, are preferably used.

In the capacitor contact formation process step in the present embodiment, colloidal silica particles are used.

The polishing agent that includes these polishing particles usually has a high polishing rate with respect to a silicon oxide film, and the same or a greater polishing rate with respect to a silicon film. In the capacitor contact formation process step in the present embodiment, to reduce the polishing rate of a silicon film, a polishing material that includes a high-polymer chemical compound in addition to colloidal silica particles is used. Because the high-polymer chemical compound selectively attaches as a film on the silicon surface and changes the surface condition from hydrophobic to hydrophilic, it is thought to act so as to suppress the polishing rate of the silicon oxide film with respect to the silicon oxide film.

The silicon nitride film that used and polished in the present embodiment is a relatively hard film.

With a general type of slurry, the polishing rate of a silicon nitride film is slower than the polishing rates of a silicon oxide film and a silicon film. To increase the polishing rate of the silicon nitride film to approximately that of a silicon oxide film, it is preferable to introduce an inorganic acid into the slurry. Nitric acid or phosphoric acid can be used as the inorganic acid.

Additionally, in order to suppress coagulation and increase the dispersion of the polishing material, an additive can be added so as to adjust the progress of the coagulation of the polishing material. It is preferable that the pH of the polishing material be adjusted to 2 to 3.

In the contact plug formation process step in the present invention, controlled polishing is done so that the polishing is stopped at a position midway in the height of the bit line capacitor film 214. In order to do this, rather than using a stopper film, it is necessary to stop the polishing of the film being polished. According to the present invention, because it is possible to achieve global flatness over both the cell region 115 and the peripheral circuit region 116, it is easy to control the polishing rate of the films being polished. In order to improve the controllability of the polishing rate, it is preferable to use an optical film thickness monitor to monitor the film thickness in real time as polishing of the thickness of the film (interlayer film) is done to the prescribed height.

According to the present invention, it is possible to perform both the main polishing and the over-polishing in the contact plug formation process step using one slurry. For this reason, it is not necessary to perform multiple-step polishing that is divides the slurries into one for the main polishing and one for the over-polishing, thereby enabling an improvement in the productivity of the semiconductor device.

After completing the polishing in the contact plug formation process step, a peripheral contact aperture part having an aperture over the element formation region 114 of the peripheral circuit region 116 is formed.

After forming the contact plug material within the peripheral contact aperture part, the contact plug material is buried into the peripheral contact aperture part. By doing this, the peripheral contact plug 301 is formed. A film laminate of a titanium film, a titanium nitride film, and a tungsten film can be used as the contact plug material.

As shown in FIG. 25A to FIG. 25D, a second interconnect base film 302 and a second interconnect main interconnect film 303 are formed on the substrate as the film materials constituting the second interconnect. A titanium nitride film can be used for the second interconnect base film 302, and a tungsten film can be used for the second interconnect main interconnect film 303.

Using lithography, a resist mask for the capacitor pad second interconnect connected to the contact conductive film 291 in the cell region 115 and a resist mask for the peripheral second interconnect connected to the peripheral contact plug 311 in the peripheral circuit region 116 are formed.

Additionally, using dry etching, the second interconnect base film 302 and the second interconnect main interconnect 303 are etched using the resist mask as the mask, so as to form the second interconnect 304. The part of the second interconnect 304 connected to the contact conductive film 291 in the cell region 115 is the capacitor pad second interconnect 304c and the part of the second interconnect 304 connected to the peripheral contact plug 311 in the peripheral circuit region 116 is the peripheral second interconnect 304p. The capacitor pad second interconnect 304c functions as a pad for formation of a capacitor lower electrode that is formed over the same.

As described above, in the contact plug formation process step in the present embodiment, global planarization is done over both the cell region 115 and the peripheral circuit region 116. For this reason, in the formation of the resist pattern by lithography when the second interconnect 304 is formed, problems such as difference focal depths between the cell region 115 and the peripheral circuit region 116 are prevented. It is therefore possible to establish a large exposure margin, and to form a resist pattern with good yield.

A silicon oxide film is formed on the upper part of the substrate. This silicon oxide film will be referred to as the capacitor interlayer film 311. The thickness of the silicon oxide film is preferably approximately 1.5 μm.

A capacitor electrode aperture part that passes through the capacitor interlayer film 311 and opens over the upper surface of the capacitor pad second interconnect 304c is formed. After that, a capacitor lower electrode 312 is formed so as to cover the bottom surface from the side surface of the capacitor electrode aperture part. Additionally, a capacitor insulating film 313 is formed over the capacitor lower electrode 312, and a capacitor upper electrode film is formed on the capacitor insulating film 313. After that, the capacitor upper electrode film is patterned, and the capacitor upper electrode 314 is formed. After forming an upper interlayer film 315 over the capacitor upper electrode 314, a second peripheral contact aperture part that is connected to the upper surface of the peripheral second interconnect 304p in the peripheral circuit region 116 is formed.

After forming a film of the second peripheral contact material inside the second peripheral contact aperture part, CMP is used to remove the unnecessary second peripheral contact material on the interlayer film. Next, the second peripheral contact plug is formed by burying the second peripheral contact material into the second peripheral contact aperture part.

After the above, a third interconnect 318 is formed. The third interconnect 318 is connected to the second peripheral contact plug and is constituted by an upper interconnect barrier layer 316 and an upper interconnect main interconnect layer 317.

After the above, the interlayer film, contact, interconnect, and protective film are formed, thereby completing the DRAM 1000.

Second Embodiment

A DRAM according to the second embodiment of the present invention will be described. The DRAM manufacturing by the method for manufacturing a semiconductor device of the present embodiment has the same structure as the DRAM 1000 shown in FIG. 3 to FIG. 5. For the constituent elements shown in FIG. 22 that describes the method for manufacturing a semiconductor device according to the present embodiment that are the same as constituent elements shown in FIG. 1 to FIG. 21, the same reference numerals are assigned as in FIG. 1 to FIG. 21, and the descriptions thereof have been be omitted.

In the method for manufacturing a semiconductor device according to the first embodiment, when performing the polishing of the contact conductive film 291 in the polishing process step show in FIG. 19A to FIG. 19C, the conditions are such that the polishing rate with respect to the contact conductive film 291 is relative slow. When a thick contact conductive film 291 is removed by polishing, because there is a possibility of sacrificing semiconductor device productivity, etching back is done beforehand so as to make the thickness of the contact conductive film 291 thin.

In the method for manufacturing a semiconductor device according to the present embodiment, a polishing method is shown that planarizes the cell region and the peripheral circuit region without performing such etching back.

In the method for manufacturing a semiconductor device according to the present embodiment, the process steps are the same as the method for manufacturing a semiconductor device according to the first embodiment up until the process step of forming the contact conductive film 271 (process step of FIG. 17A to FIG. 17D).

Figure 26A:
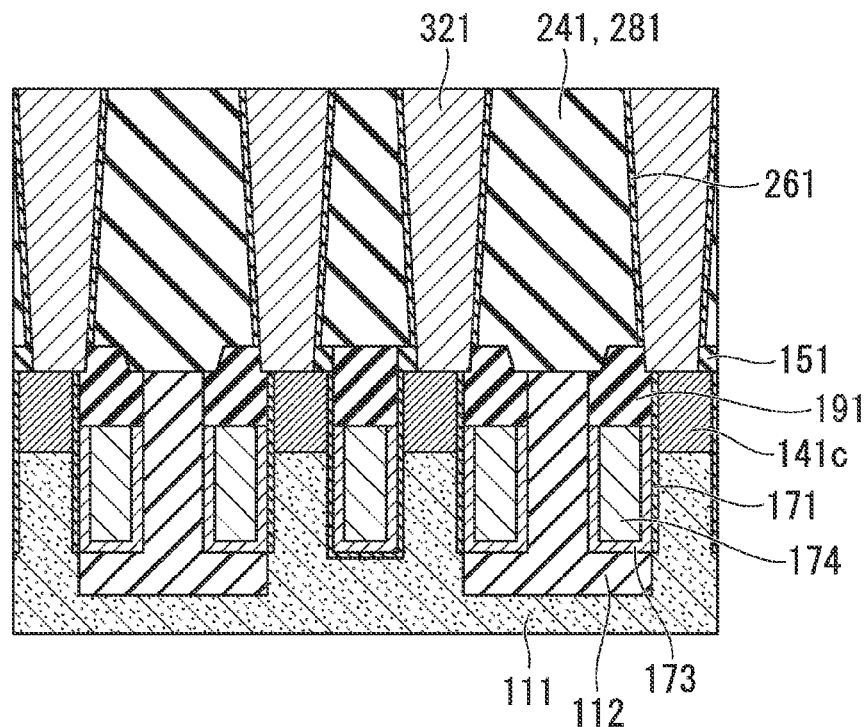
FIG. 26A is a fragmentary cross sectional elevation view of a step involved in a method of forming a semiconductor device, in accordance with a second preferred embodiment of the present invention.
Figure 26B:
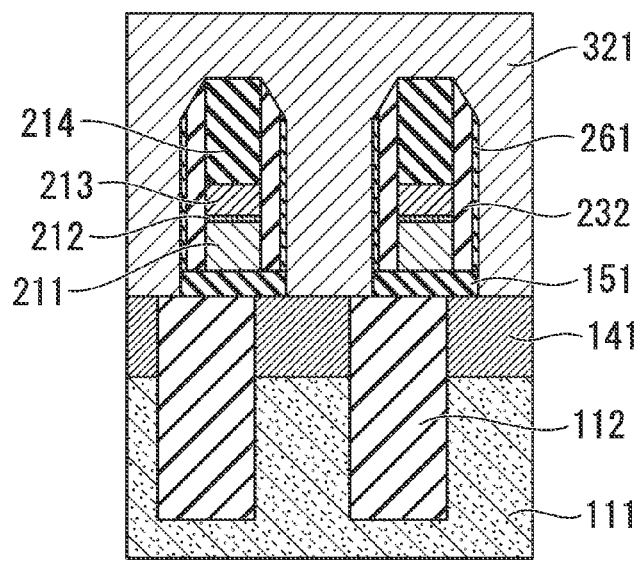
FIG. 26B is a fragmentary cross sectional elevation view of the same step as in FIG. 26A, taken along an X1-X1' line of FIG. 26A, in accordance with the second preferred embodiment of the present invention.

Before performing the polishing process step using CMP, the contact conductive film 271 is formed over the entire surface of the substrate. Polishing is done to the contact conductive film 271 until the upper surface of the first interlayer film 214 is exposed. As shown in FIG. 26A to FIG. 26C, the contact conductive film 271 is buried into the capacitor contact aperture part 262, so as to form the contact conductive film 321. This polishing will be referred to as the contact conductive film removal polishing. In the contact conductive film removal polishing, the slurry used in the method for manufacturing a semiconductor device according to the first embodiment may be used. To accelerate the polishing rate, the polishing rate of the first interlayer film may be made greater than the polishing rate of the contact conductive film 271.

The main polishing and over-polishing of the contact plug formation process step are performed in the same manner as the method for manufacturing of the first embodiment. The manufacturing process steps shown in FIG. 25A to FIG. 25D and thereafter are the same as the process steps in the process step for manufacturing a semiconductor device according to the first embodiment.

In this contact plug formation process step, in the case of using the same slurry in the contact conductive film removal polishing, the main polishing, and the over-polishing, it is possible to use one set of polishing conditions. For this reason, it is possible to eliminate the loss of time in changing the polishing conditions during the polishing process. Also, it is possible to improve the productivity of the semiconductor device over the manufacturing method that uses etching back by, for example, having to control only one set of polishing conditions. Additionally, it is possible to make the film thickness of the contact conductive film 271 required for burying the capacitor contact aperture part 262 thin.

Therefore, the method for manufacturing a semiconductor device according to the present embodiment is effective in the case of forming the capacitor contacts with a high density in the DRAM.

Third Embodiment

Figure 27:
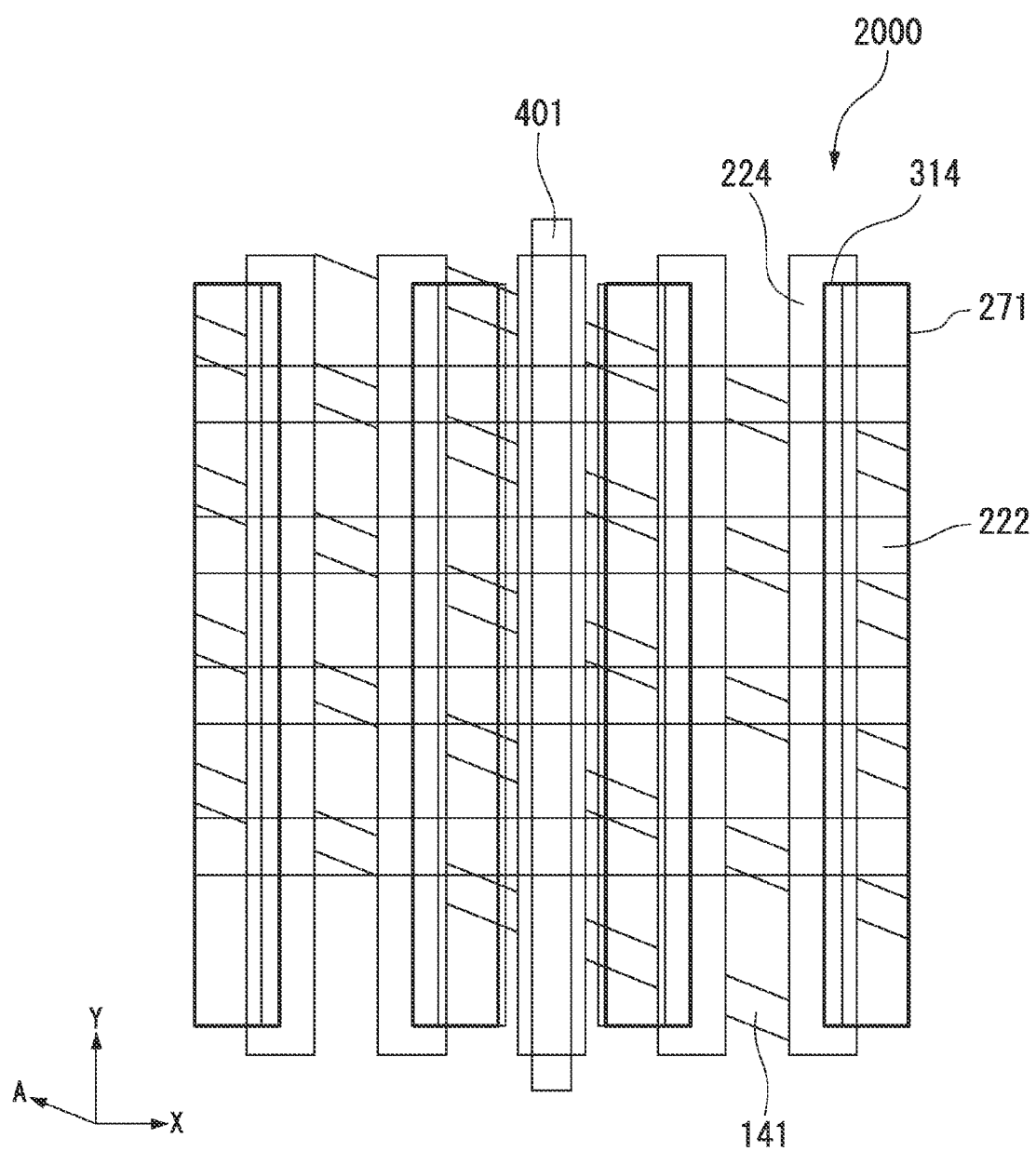
FIG. 27 is a fragmentary plan view of a semiconductor device, in accordance with a third preferred embodiment of the present invention.

In the DRAM 2000 of the present embodiment, as shown in FIG. 27, in the constitution of the DRAM 1000 shown in FIG. 2 to FIG. 5, a capacitor contact separation film 401 (a fourth insulating film) is formed within the first interlayer film between the adjacent active regions.

The method for manufacturing the DRAM 2000, which is a third embodiment of the present invention, will be described. In this method, a capacitor contact aperture part which has an enlarged width in the X direction is used so to form the capacitor contact. In this method, two adjacent drain diffusion layers 141c that sandwich the element separation gate trench in the X direction are opened together. The resolution margin of the lithography is thus improved in the case of forming the capacitor contact aperture, thereby enabling formation of the super-densely spaced contact plugs.

Also, of the constituent elements shown in FIG. 28 to FIG. 39, constituent elements the same as those shown in that of FIG. 6 to FIG. 25 are assigned the same reference numerals as in FIGS. 6 to 25, and the descriptions thereof are omitted.

In a method for manufacturing a semiconductor device of the present embodiment, the same process steps are performed up to the step shown in FIG. 13 in a method for manufacturing a semiconductor device of the first embodiment.

Figure 28A:
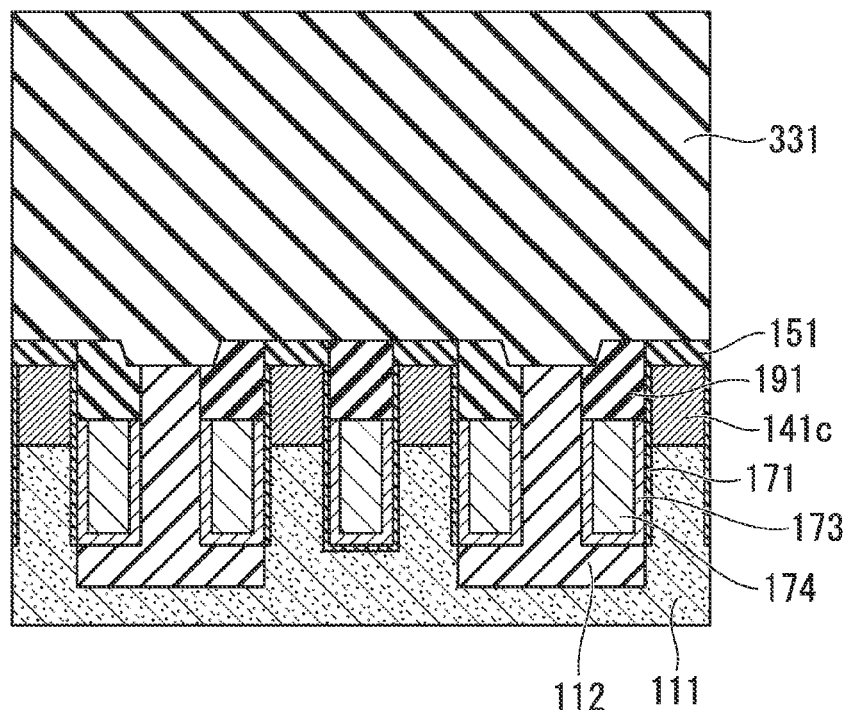
FIG. 28A is a fragmentary cross sectional elevation view of a step, subsequent to the same step as of FIG. 13, taken along an Y1-Y1' line of FIG. 11A, involved in a method of forming a semiconductor device, in accordance with the third preferred embodiment of the present invention.
Figure 28B:
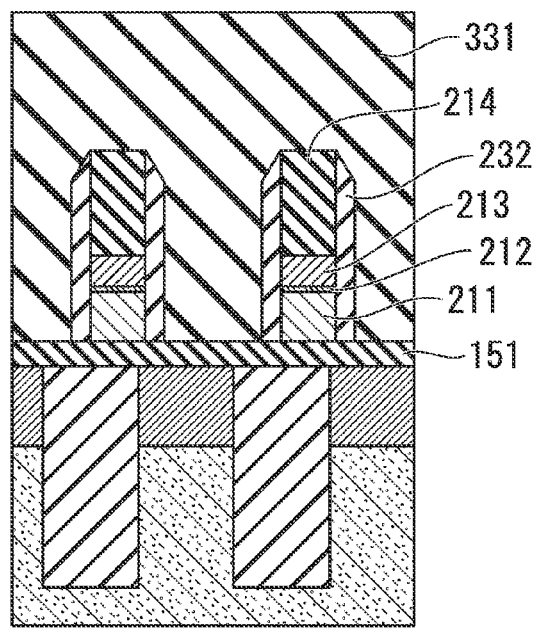
FIG. 28B is a fragmentary cross sectional elevation view of the same step as in FIG. 28A, taken along an X1-X1' line of FIG. 28A, in accordance with the second preferred embodiment of the present invention.
Figure 28C:
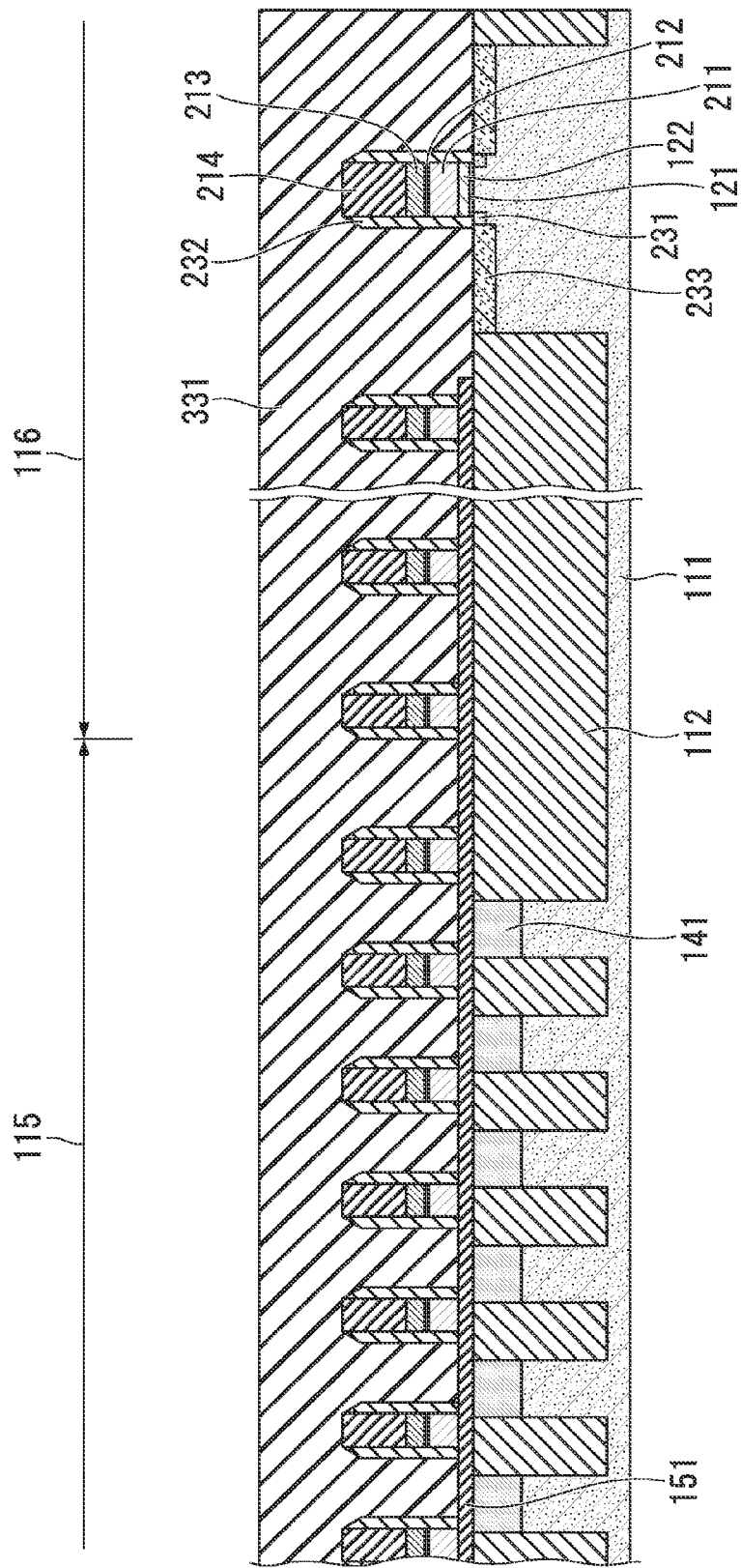
FIG. 28C is a fragmentary cross sectional elevation view of the same step as in FIG. 28A, in accordance with the second preferred embodiment of the present invention.

After the above, as shown in FIG. 28A to 28C, the first interlayer film 331 is formed. The film thickness of the first interlayer film 331 after polishing process is formed to be thicker than that of the case of the method for manufacturing a semiconductor device of the first embodiment. For example, it is preferable that the film thickness over the substrate be approximately 600 nm, and the film thickness over the bit line capacitor film 214 be approximately 300 nm.

As shown in FIG. 29A to 29D, a fifth mask 341 is formed in the cell region 115. The fifth mask 341 is for forming the capacitor contact aperture part that opens these the drain diffusion layer 141c in the first interlayer film 331.

Figure 29A:
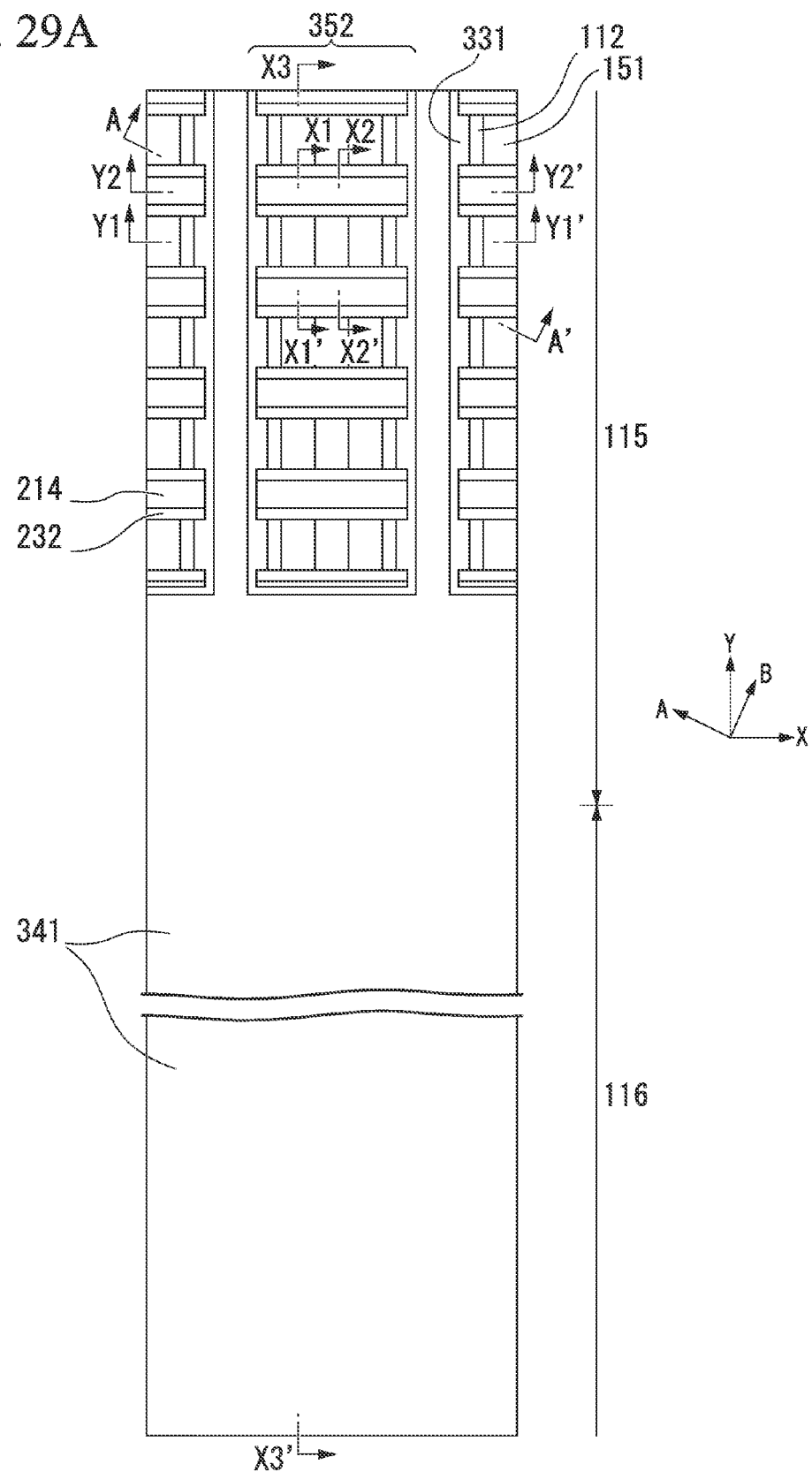
FIG. 29A is a fragmentary plain view of a step, subsequent to the step of FIGS. 28A through 28C, involved in the method of forming the semiconductor device, in accordance with the third preferred embodiment of the present invention.
Figure 29B:
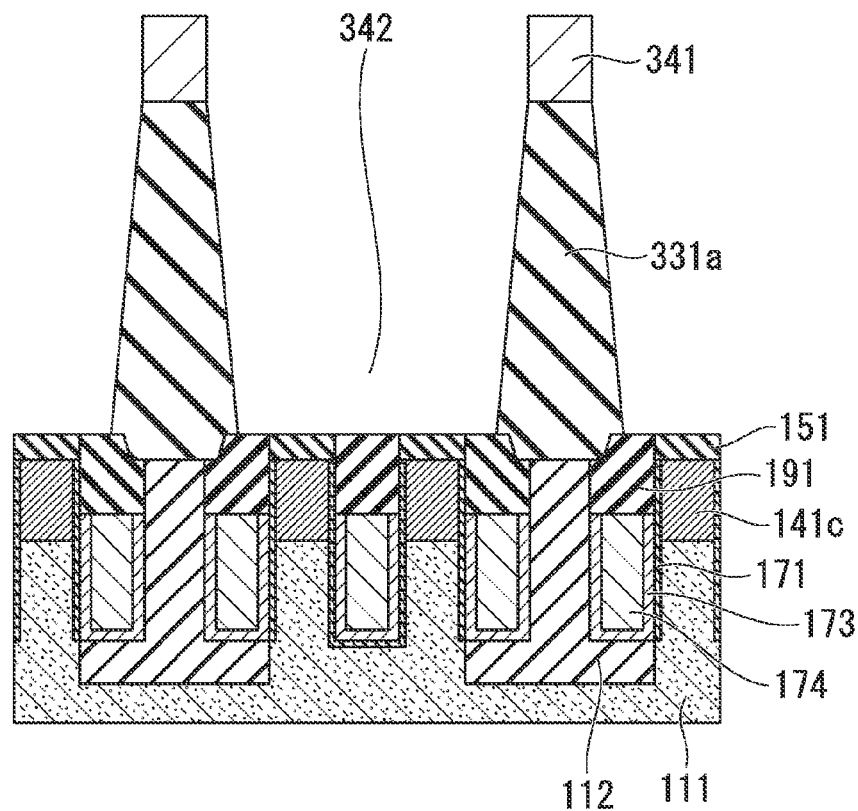
FIG. 29B is a fragmentary cross sectional elevation view of the same step as in FIG. 29A, taken along an Y1-Y1' line of FIG. 29A, in accordance with the third preferred embodiment of the present invention.
Figure 29C:
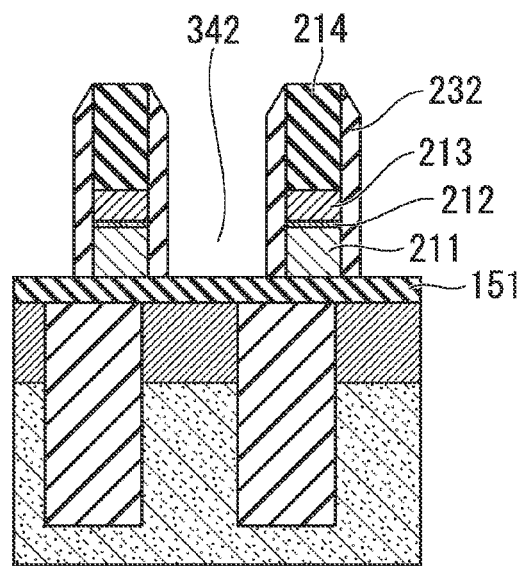
FIG. 29C is a fragmentary cross sectional elevation view of the same step as in FIG. 29A, taken along an X1-X1' line of FIG. 29A, in accordance with the third preferred embodiment of the present invention.
Figure 29D:
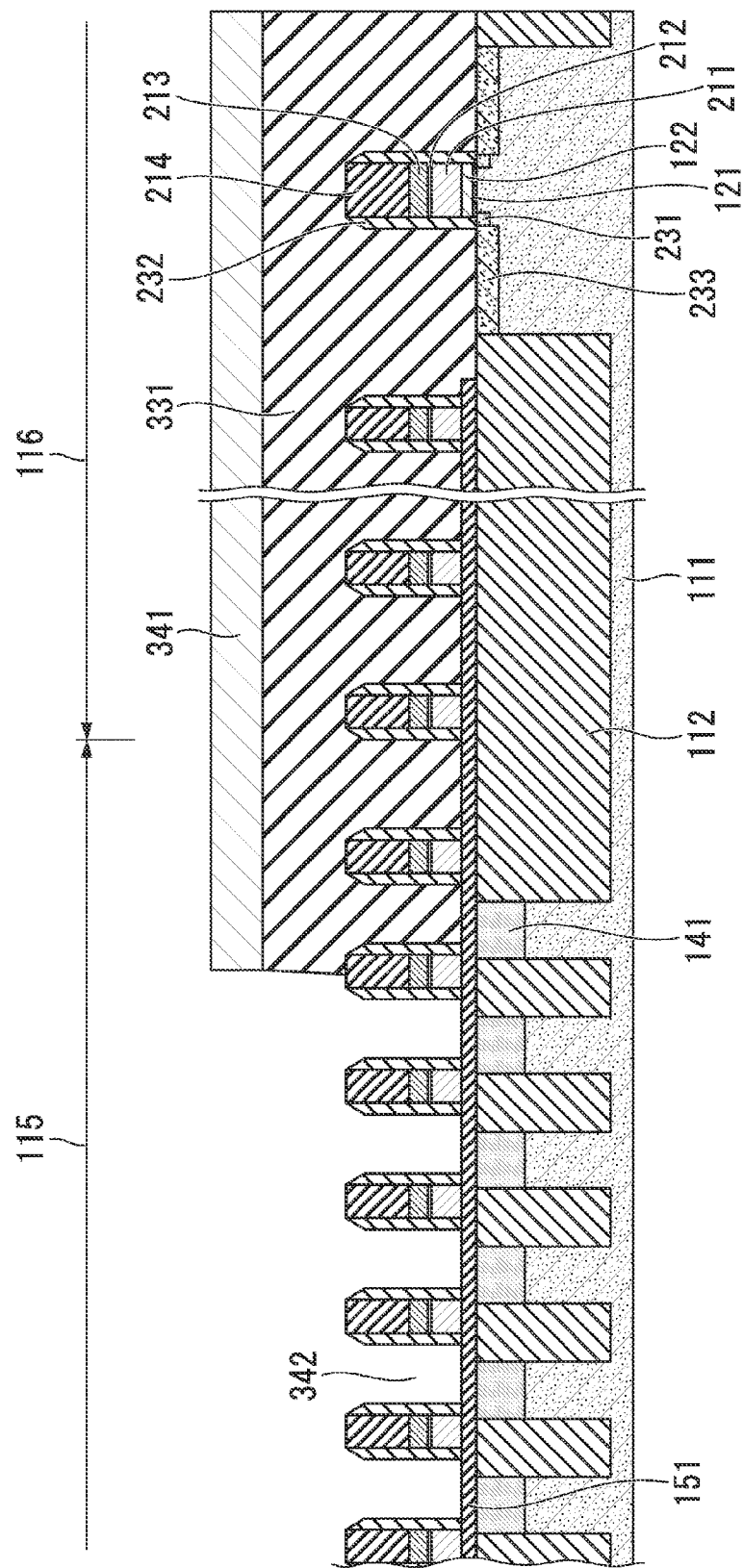
FIG. 29D is a fragmentary cross sectional elevation view of the same step as in FIG. 29A, in accordance with the third preferred embodiment of the present invention.
Figure 30A:
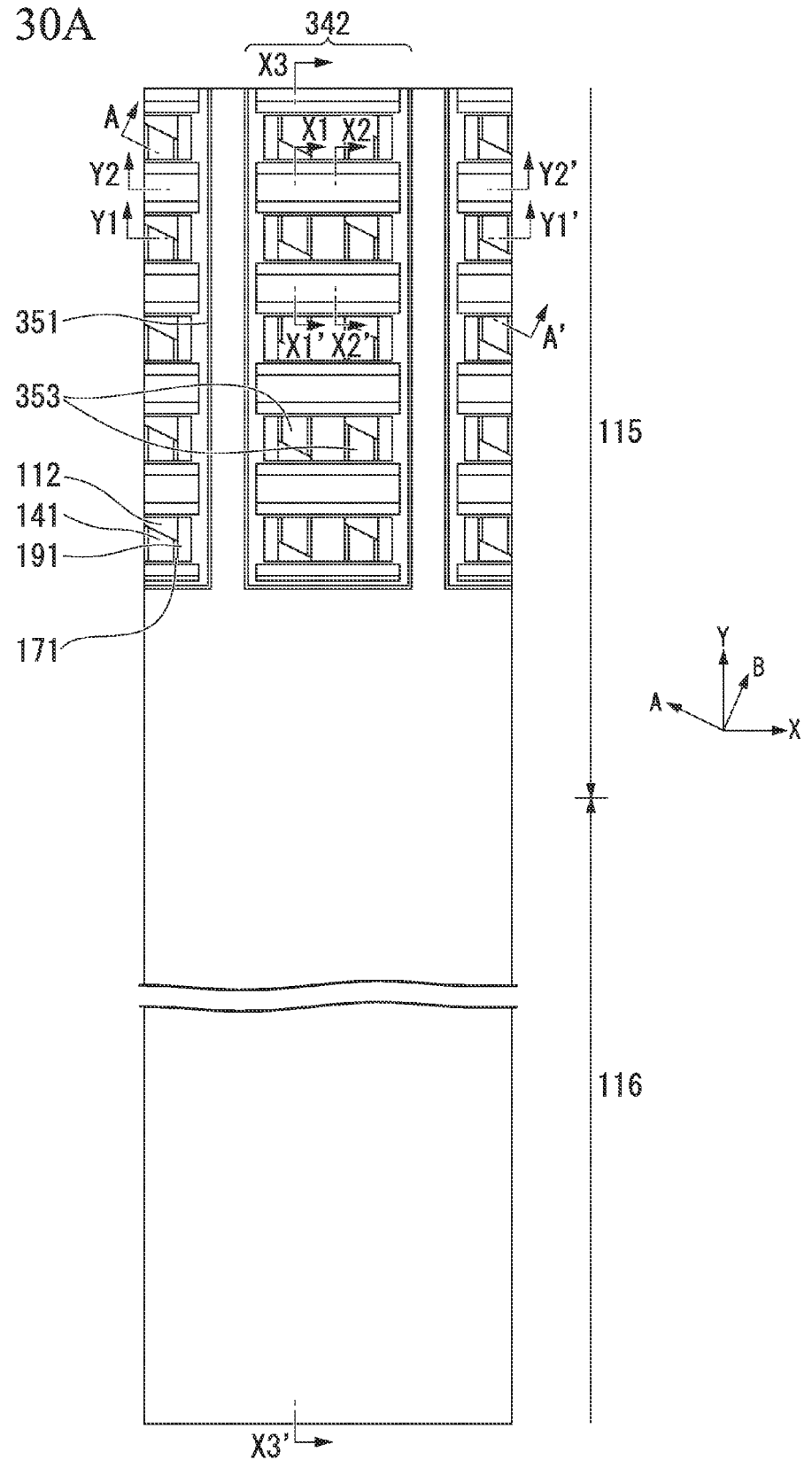
FIG. 30A is a fragmentary plain view of a step, subsequent to the step of FIGS. 29A through 29D, involved in the method of forming the semiconductor device, in accordance with the third preferred embodiment of the present invention.
Figure 30B:
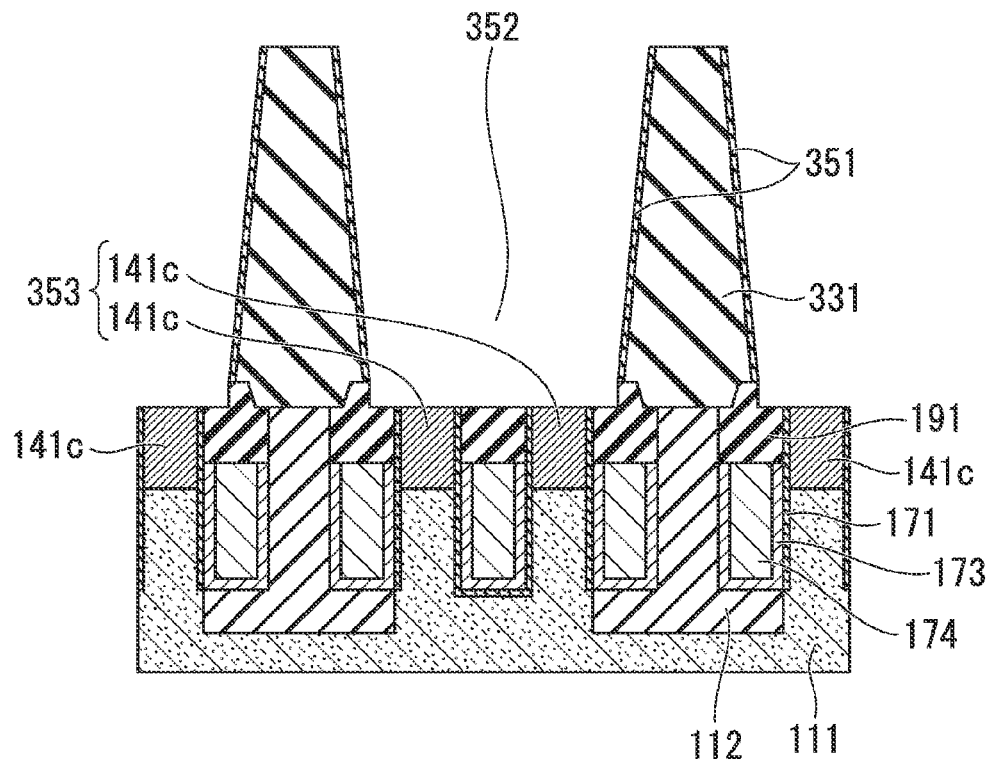
FIG. 30B is a fragmentary cross sectional elevation view of the same step as in FIG. 30A, taken along an Y1-Y1' line of FIG. 30A, in accordance with the third preferred embodiment of the present invention.
Figure 30C:
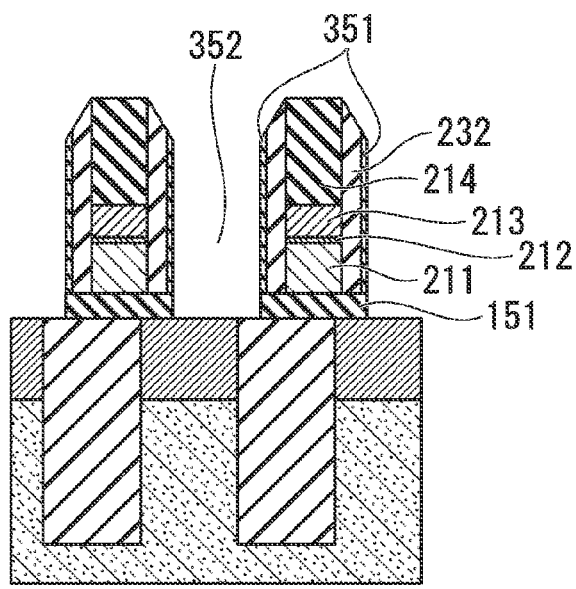
FIG. 30C is a fragmentary cross sectional elevation view of the same step as in FIG. 30A, taken along an X1-X1' line of FIG. 30A, in accordance with the third preferred embodiment of the present invention.
Figure 30D:
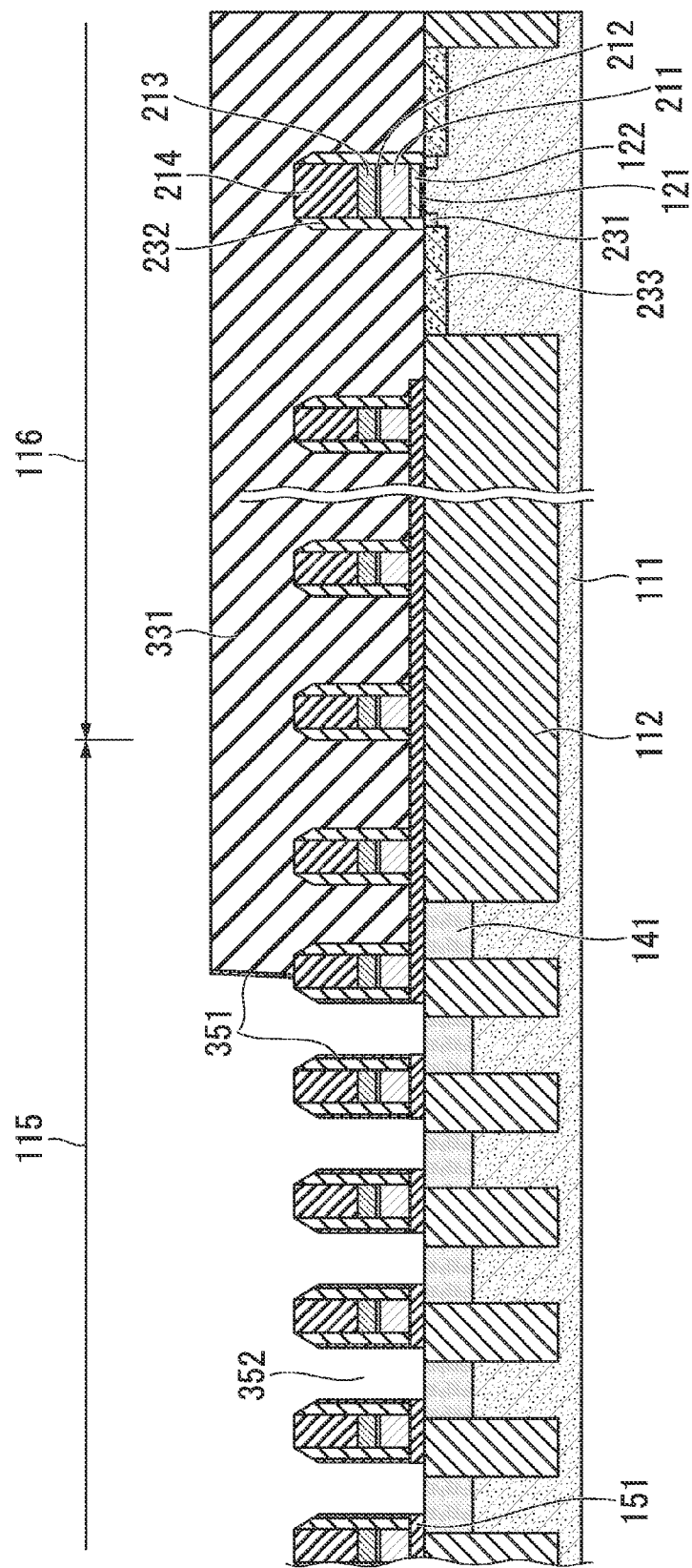
FIG. 30D is a fragmentary cross sectional elevation view of the same step as in FIG. 30A, in accordance with the third preferred embodiment of the present invention.

The fifth mask 341, as shown in FIG. 29A, is adjacent sandwiching the element separation gate trench, and has a pattern in which one aperture part opens over the drain diffusion layers 141c formed in a row in the Y direction. Also, the remaining part of the pattern of the fifth mask 341 covers over the source diffusion layers 141b, this being a pattern extending in the Y direction.

The first interlayer film 331 etching is performed using the fifth mask 341, so that the mask insulating film 151 on the substrate and the upper surface of the buried capacitor layer 191 are exposed so as to form an aperture part 342. The capacitor contact etching is performed under conditions that enable the establishment of a selectivity ratio with respect to the bit line capacitor film 214 and a first side wall 232. When this is done, the bit line capacitor film 214 and the first side wall 232 are caused to remain, so that the bit lines 222 are not exposed.

The first interlayer film 331 that is formed so as to remain beneath the fifth mask 341 will be referred to as a pillar-shaped first interlayer film 331a. The pillar-shaped first interlayer film 331a is formed so as to straddle over the bit lines 222 in the Y direction and extend in the Y direction. The height of the pillar part of the first interlayer films 331a in the part of which straddles over the bit lines 222 is preferably formed to be approximately 300 nm at the top of the bit line capacitor film 214.

As shown in FIG. 30A to 30D, the fifth mask 341 is removed. A second side wall film material is formed so as to cover the inside of the aperture part 342, over the bit line 222, and over the pillar-shaped first interlayer film 331a. A silicon nitride film or the like can be used as the material of the second side wall film, and the film thickness is preferably approximately 5 nm.

The second side wall film material is etched back, so as to form a second side wall film 351 on the side wall of the aperture part 352. Simultaneously, the mask insulating film 151 on the bottom part is removed, thereby exposing the upper surface of the drain diffusion layer 141c. The process of removing the mask insulating film 151 and exposing the top of the drain diffusion layer 141c may also be done in the process step of the capacitor contact etching shown in FIG. 29A to FIG. 29D, so that the second side wall film 351 of the manufacturing process step shown in FIG. 30A to FIG. 30D is formed.

By proceeding through this process step, a capacitor contact aperture part 352 is formed. This aperture part is sandwiched in the X direction by the pillar-shaped first interlayer film 331a and sandwiched in the Y direction by the pillar-shaped first interlayer film 331a, and at the bottom part the capacitor-side diffusion layer 141c is exposed.

The second side wall film 351 is formed so that, in the washing processing in the next process step in which the contact conductive film 271 is formed, reduction of the side surface of the first interlayer film 331 by etching is prevented. In the case in which such film reduction is not a problem, the second side wall film 351 need not be formed.

The bottom region of the capacitor contact aperture part 352 is sandwiched in the Y direction by the bit lines 222 and is sandwiched in the X direction by the pillar-shaped first interlayer film 331a. In this region, two drain diffusion layers 141c belonging to different adjacent active regions are exposed as a pair, these being separated by the element separation gate trench. These two drain diffusion layers 141c exposed as a pair will be referred to as a diffusion layer pair 353.

Figure 31A:
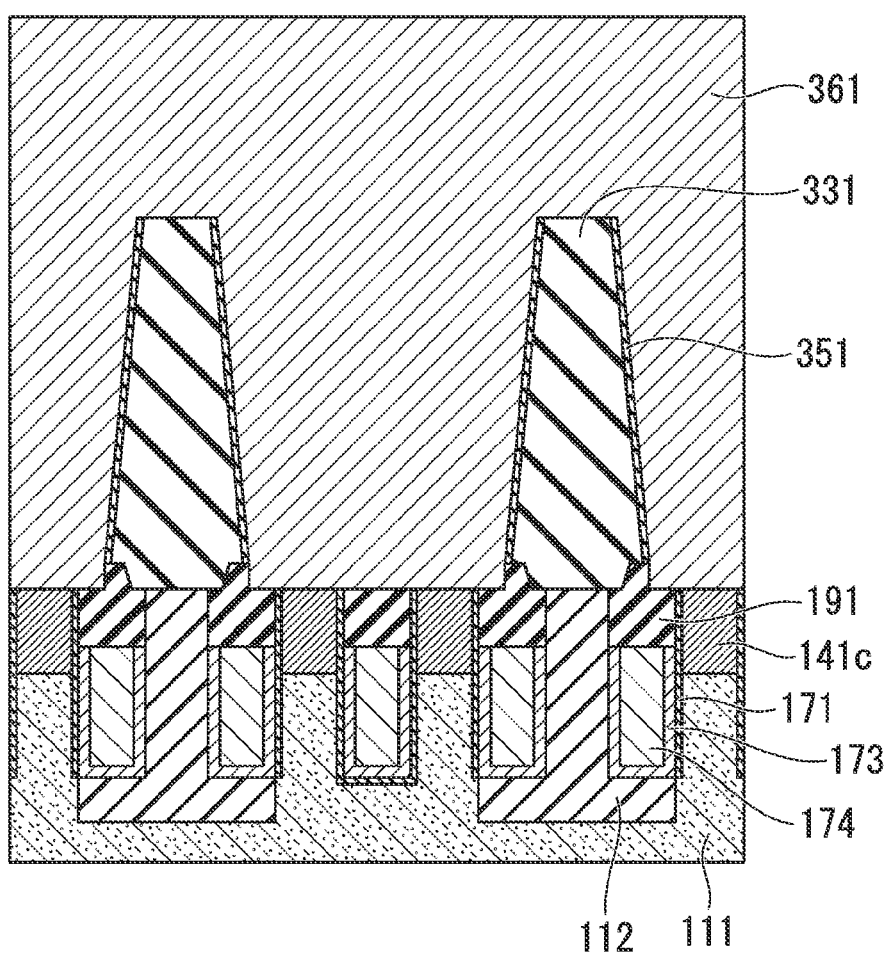
FIG. 31A is a fragmentary cross sectional elevation view of a step, subsequent to the same step as of FIGS. 30A through 30D, taken along an Y1-Y1' line of FIG. 30A, involved in a method of forming a semiconductor device, in accordance with the third preferred embodiment of the present invention.
Figure 31B:
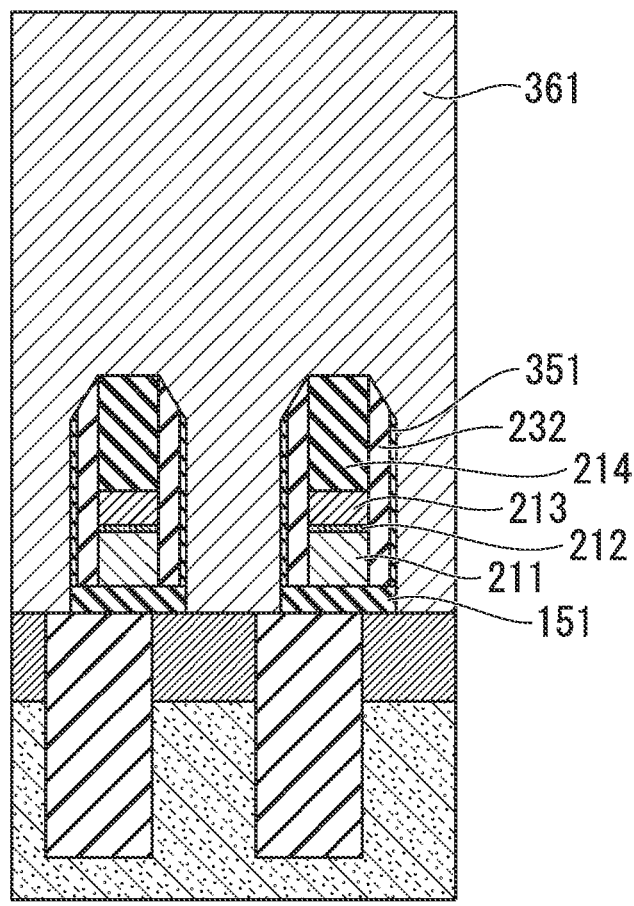
FIG. 31B is a fragmentary cross sectional elevation view of the same step as in FIG. 31A, taken along an X1-X1' line of FIG. 31A, in accordance with the second preferred embodiment of the present invention.
Figure 32A:
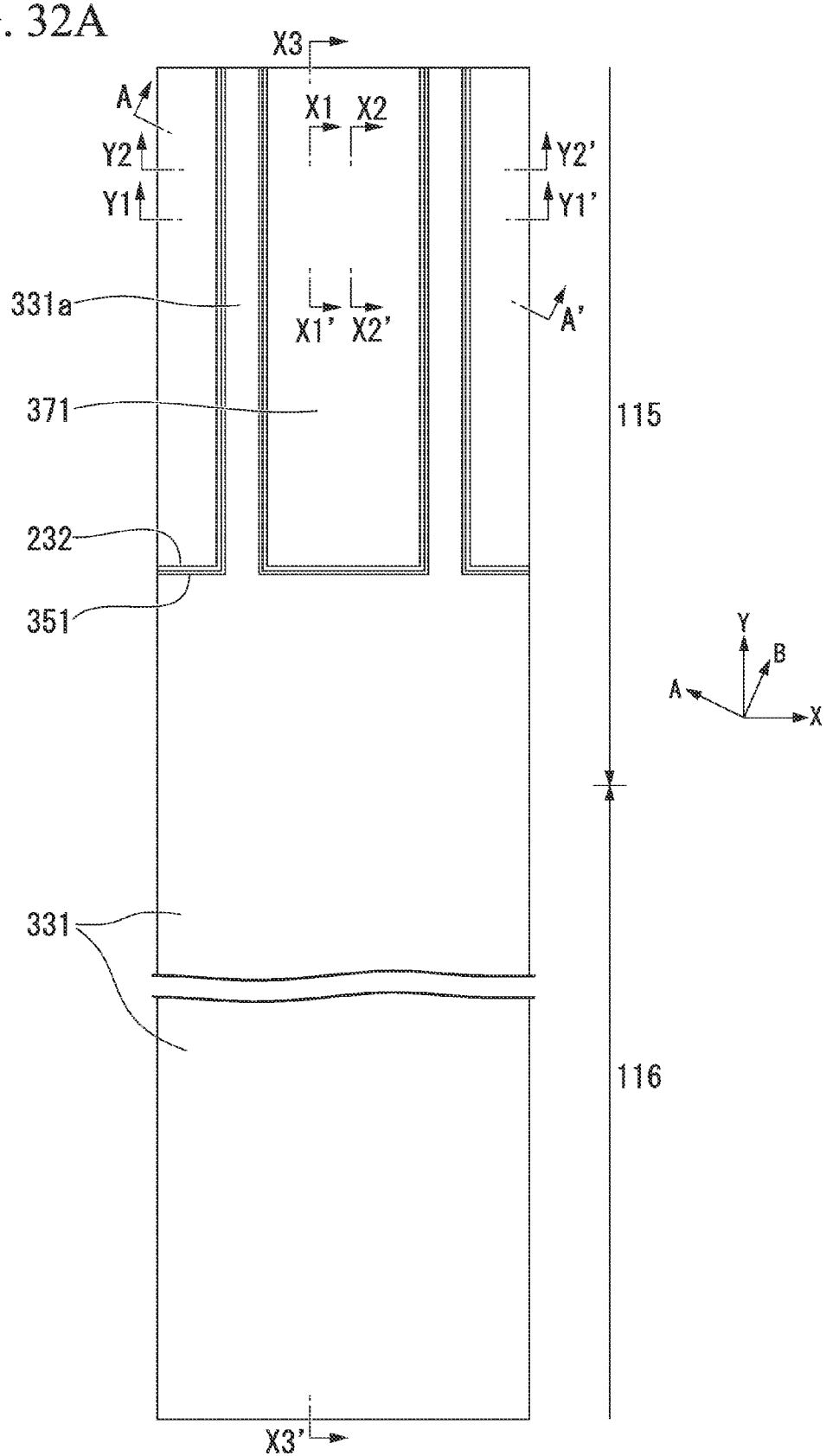
FIG. 32A is a fragmentary plain view of a step, subsequent to the step of FIGS. 31A through 31C, involved in the method of forming the semiconductor device, in accordance with the third preferred embodiment of the present invention.
Figure 32B:
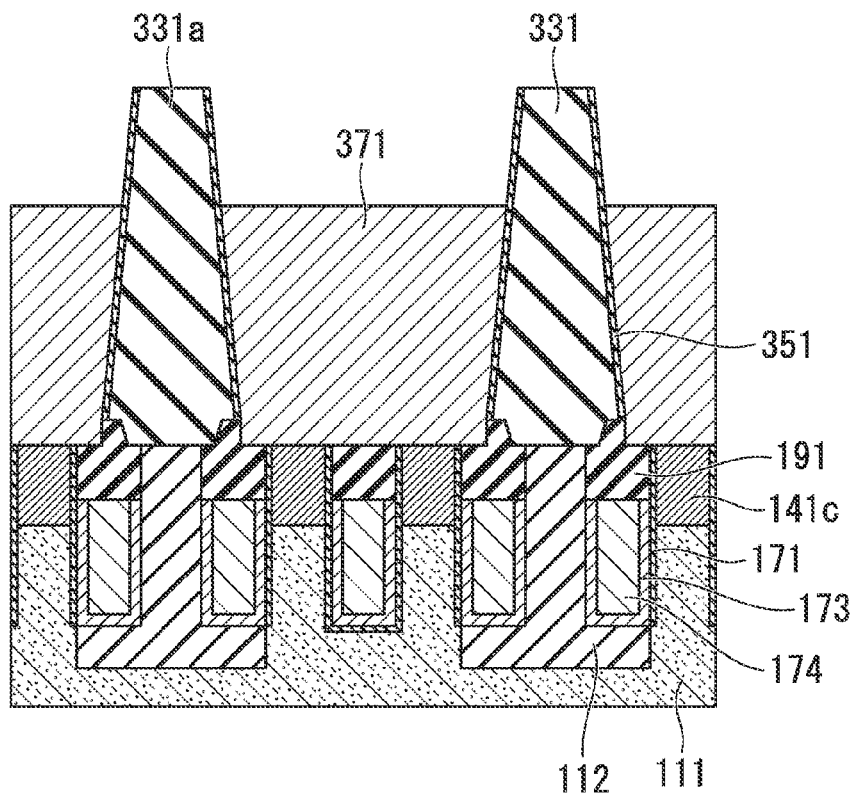
FIG. 32B is a fragmentary cross sectional elevation view of the same step as in FIG. 32A, taken along an Y1-Y1' line of FIG. 32A, in accordance with the third preferred embodiment of the present invention.
Figure 32C:
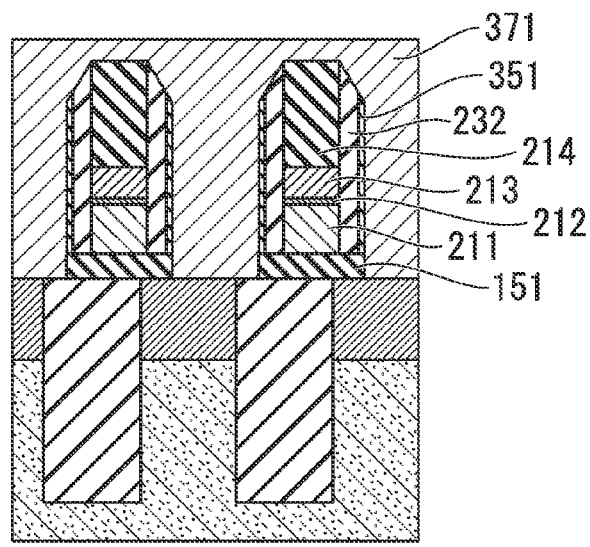
FIG. 32C is a fragmentary cross sectional elevation view of the same step as in FIG. 32A, taken along an X1-X1' line of FIG. 32A, in accordance with the third preferred embodiment of the present invention.
Figure 32D:
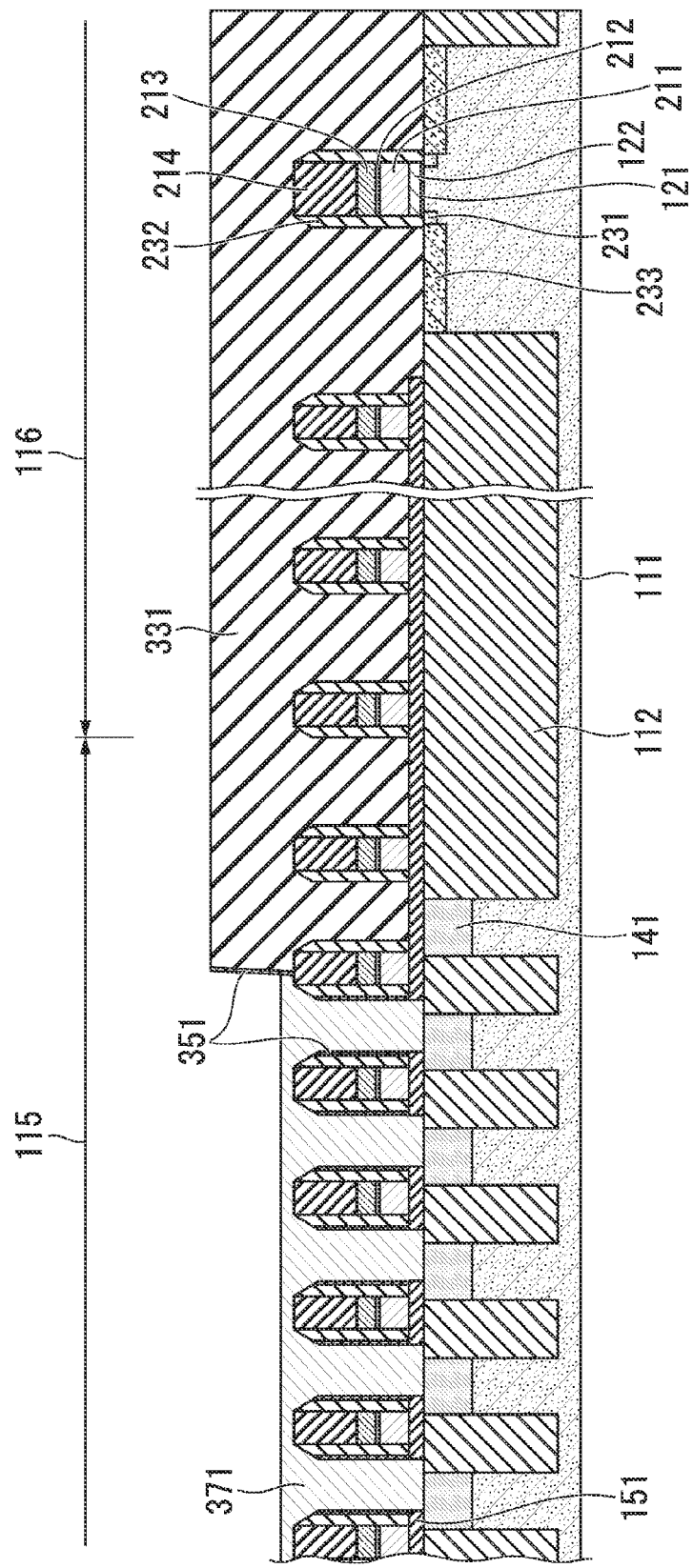
FIG. 32D is a fragmentary cross sectional elevation view of the same step as in FIG. 32A, in accordance with the third preferred embodiment of the present invention.
Figure 33A:
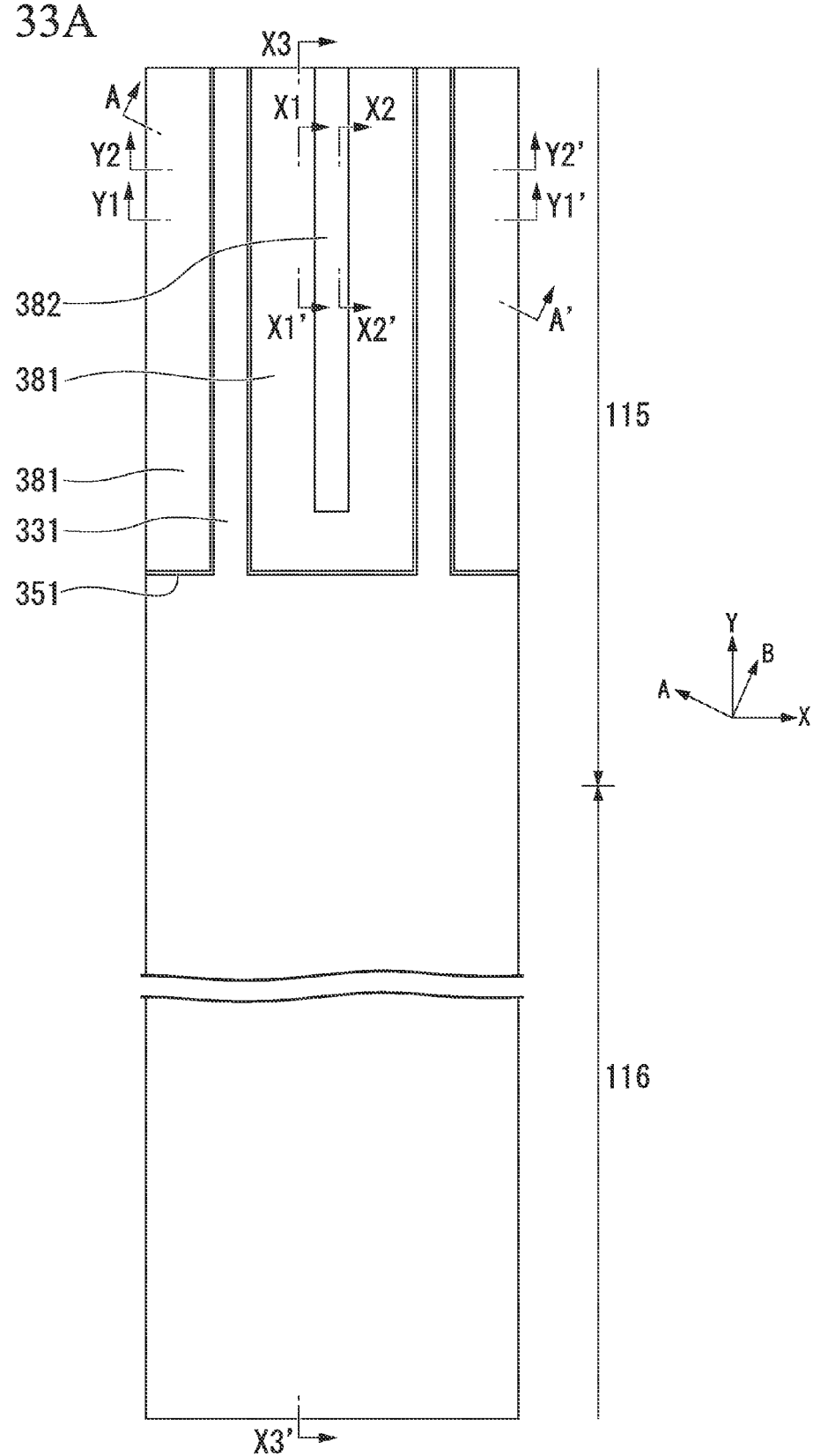
FIG. 33A is a fragmentary plain view of a step, subsequent to the step of FIGS. 32A through 32D, involved in the method of forming the semiconductor device, in accordance with the third preferred embodiment of the present invention.
Figure 33B:
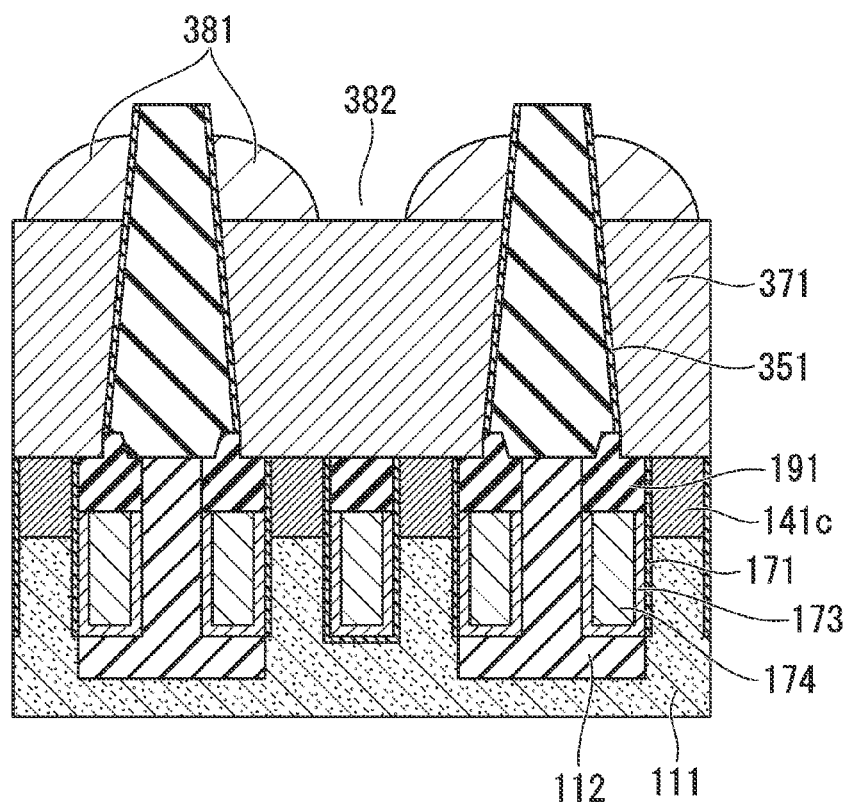
FIG. 33B is a fragmentary cross sectional elevation view of the same step as in FIG. 33A, taken along an Y1-Y1' line of FIG. 33A, in accordance with the third preferred embodiment of the present invention.
Figure 33C:
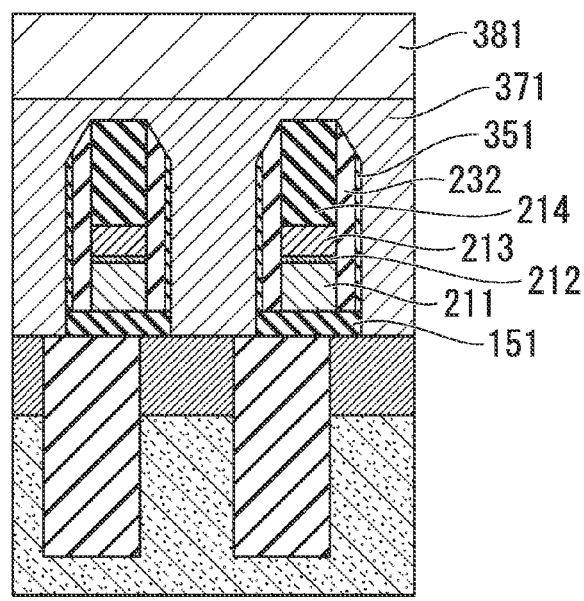
FIG. 33C is a fragmentary cross sectional elevation view of the same step as in FIG. 33A, taken along an X1-X1' line of FIG. 33A, in accordance with the third preferred embodiment of the present invention.
Figure 33D:
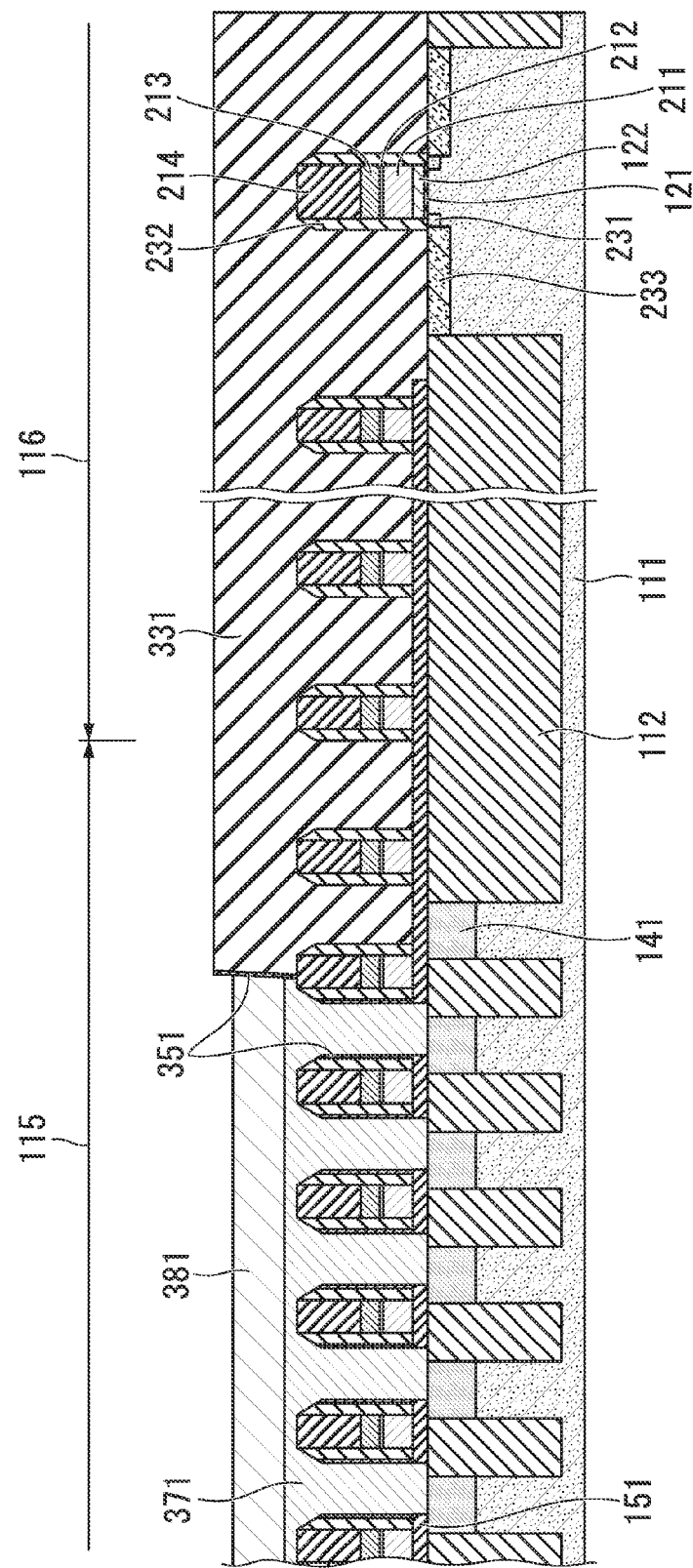
FIG. 33D is a fragmentary cross sectional elevation view of the same step as in FIG. 33A, in accordance with the third preferred embodiment of the present invention.
Figure 34A:
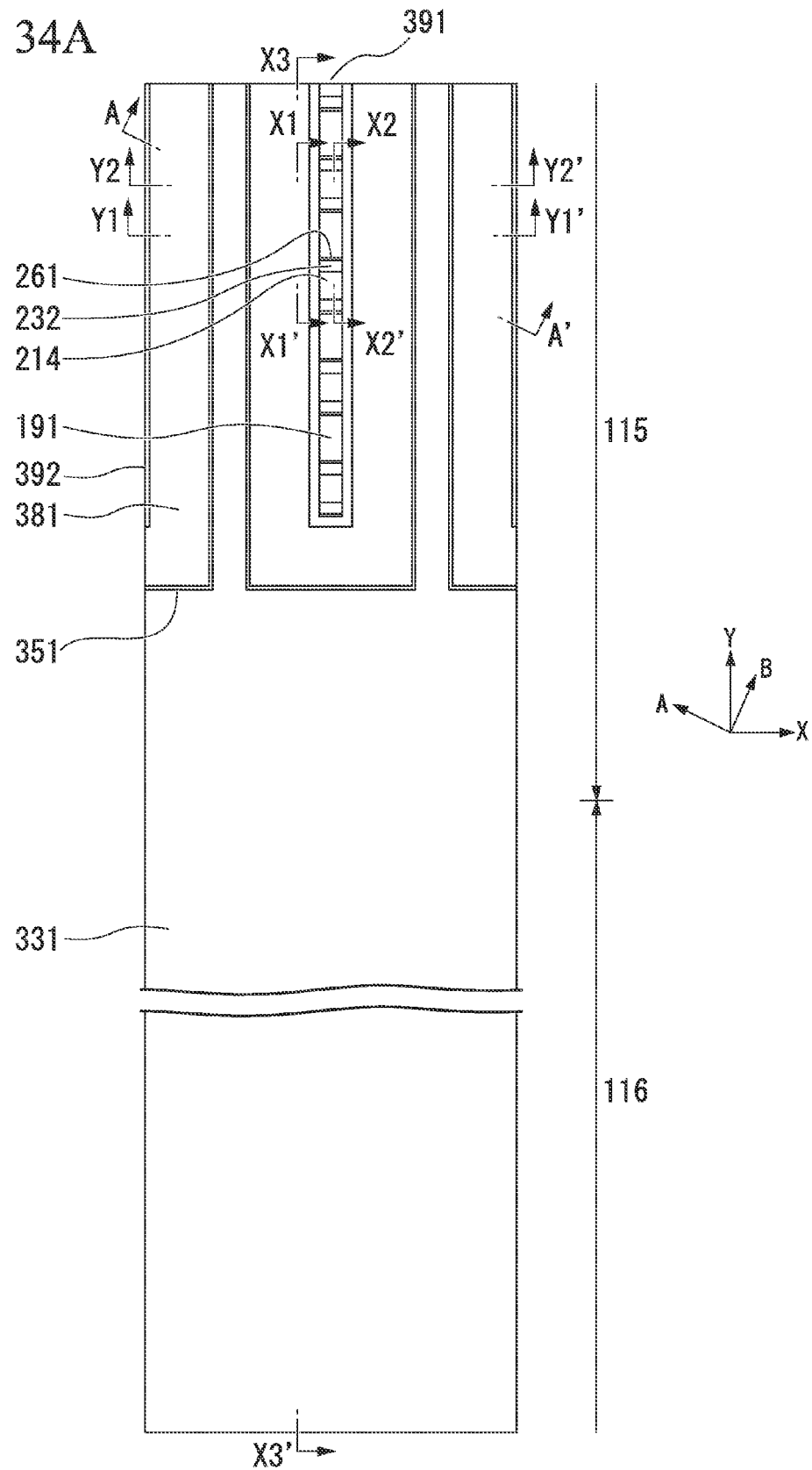
FIG. 34A is a fragmentary plain view of a step, subsequent to the step of FIGS. 33A through 33D, involved in the method of forming the semiconductor device, in accordance with the third preferred embodiment of the present invention.
Figure 34B:
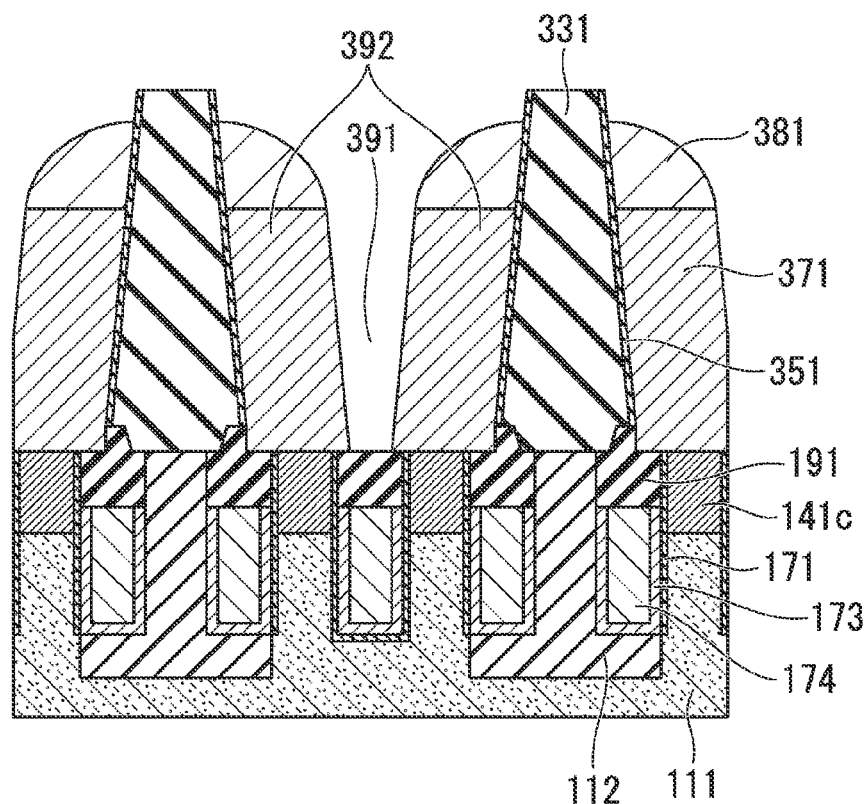
FIG. 34B is a fragmentary cross sectional elevation view of the same step as in FIG. 34A, taken along an Y1-Y1' line of FIG. 34A, in accordance with the third preferred embodiment of the present invention.
Figure 34C:
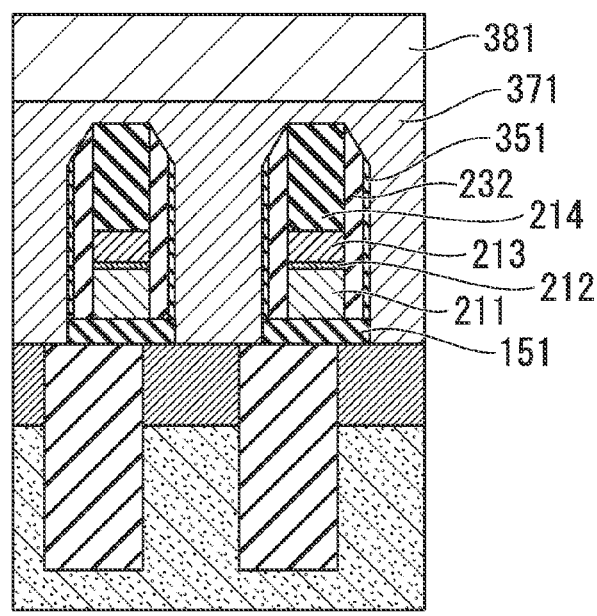
FIG. 34C is a fragmentary cross sectional elevation view of the same step as in FIG. 34A, taken along an X1-X1' line of FIG. 34A, in accordance with the third preferred embodiment of the present invention.
Figure 34D:
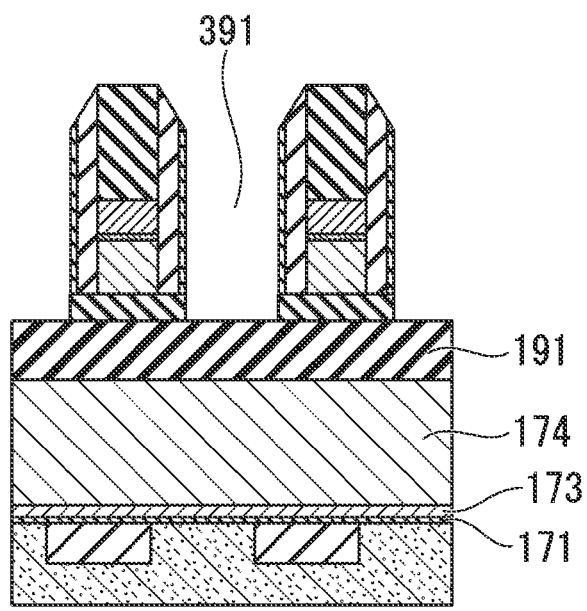
FIG. 34D is a fragmentary cross sectional elevation view of the same step as in FIG. 34A, taken along an X2-X2' line of FIG. 34A, in accordance with the third preferred embodiment of the present invention.

As shown in FIG. 31A to FIG. 31C, an electrical conductor is filled inside the capacitor contact aperture part 352, so as to form a contact conductive film 361 that covers the first interlayer film 331. The contact conductive film 361 is connected to the drain diffusion layer 141c at the bottom part. A phosphorus-doped silicon film or the like can be used as the material of the contact conductive film 361, and it is preferable that the film thickness thereof be approximately 300 nm.

The contact conductive film 361 is etched back so as to bury the contact conductive film 361 into the inside of the capacitor contact aperture part 352. When doing this, the contact conductive film 361 is formed to have a height that is no higher than the height of the upper surface of the capacitor contact aperture 352 and at least as high as the height of the upper surface of the bit line capacitor film 214. The upper surface of the bit line capacitor film 214 may be exposed. The position of the upper surface of the contact conductive film 361 is preferably formed to be approximately 200 nm lower than the upper surface of the first interlayer film 331 and also be approximately 100 nm higher than the upper surface of the bit line capacitor film 214.

By this process step, the contact conductive film 361 is buried into the inside of the capacitor contact aperture part 352 so as to form an interconnect-shaped contact conductive film 371. By lowering the position of the upper surface of the contact conductive film 371, the inside of the capacitor contact aperture 352 is formed in a recessed shape. The pillar-shaped first interlayer film 331a is preferably formed so as to protrude by approximately 200 nm from the upper surface of the contact conductive film 371.

The contact conductive film 371 has the width of the region sandwiched by the pillar-shaped first interlayer films 331a in the X direction, straddles over the bit lines 222, and extends in the Y direction, so as to be formed in the shape of a long narrow rectangle when seen in plan view.

To the contact conductive film 371 are connected to a plurality of drain diffusion layers 141c that are separated therefrom by the bit lines 222 arranged in the Y direction and belonged to different active regions, and drain diffusion layers 141c that are separated therefrom by the element separation gate trench in the X direction and belong to a diffusion layer couple 353 that belongs to a different active region. The drain diffusion layers 141c that belong to different active regions are formed so as to be mutually shorted together.

As shown in FIG. 33A to FIG. 33D, a third side wall film material is formed that covers the side surface and upper surface of the pillar-shaped first interlayer film 331a and that covers the contact conductive film 371. The film thickness of the third side wall film material is preferably formed according to be a thickness that does not bury between the pillar-shaped first interlayer films 331a that are adjacent in the X direction.

It is possible to use a material that will be a mask in the case of etching the contact conductive film 371 as the third side wall film material, this being, for example, a silicon nitride film or silicon oxide film.

The third side wall film material is etched back, so as to form third side wall films (third insulating films) 381 on the side wall of the pillar-shaped first interlayer film 331a. The width in the X direction of the third side wall film 381 is preferably approximately 60 nm. The third side wall films 381 are formed at both right and left on the upper surface of the contact conductive film 371. The upper surface of the contact conductive film 371 is exposed between the two third side wall films 381. This exposed region will be referred to as a third side wall inter-film aperture part 382. The third side wall inter-film aperture 382 has the shape of a long narrow rectangle that extends in the Y direction. It is preferable that the aperture width in the X direction of the third side wall inter-film aperture 382 be approximately 40 nm.

Using the third side wall film 381, the pillar-shaped first interlayer film 331a and the first interlayer film 331 as a mask, as shown in FIG. 34A to FIG. 34D, the contact conductive film 371 that is exposed at the third side wall inter-film aperture 382 is anisotropically etched. The trench is formed in the center in the X direction of the contact conductive film 371. The trench will be referred to as a contact conductive film separation trench (second aperture) 391. The contact conductive film 371 which had been in the shorted condition by the contact conductive film separation trench 391 straddling across the element separation gate trench is divided into two in the X direction. The buried gate capacitor layer 191 which is formed over the element separation gate trench is exposed at the bottom of the contact conductive film separation trench 391. The two contact conductive films 371 divided in the X direction will be referred to as contact conductive films 392. The contact conductive films 392 are subsequently shorted in the Y direction between the adjacent drain diffusion layers 141c which are separated by the bit lines.

In the anisotropic etching process step, a material having a selectivity ratio with respect to the pillar-shaped first interlayer film 331a, the bit line capacitor film 214 and the first side wall 232 such that these films are caused to remain is preferably used for the contact conductive film 371. In the case of the method for manufacturing a semiconductor device according to the present embodiment, for example, a film having an etching rate that is slower than that of a silicon nitride film and a silicon oxide film and having an etching rate that is faster than that of a silicon film is used.

Figure 35A:
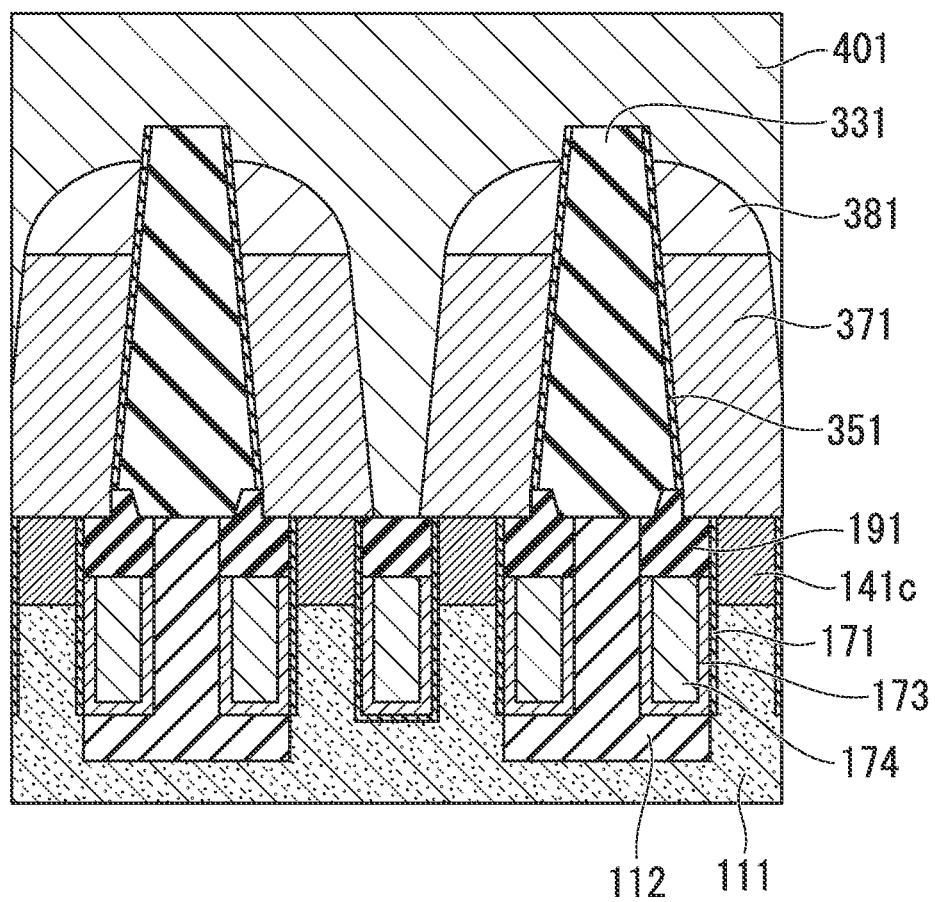
FIG. 35A is a fragmentary cross sectional elevation view of a step, subsequent to the step of FIGS. 34A through 34D, taken along an Y1-Y1' line of FIG. 34A, involved in a method of forming a semiconductor device, in accordance with the third preferred embodiment of the present invention.
Figure 35B:
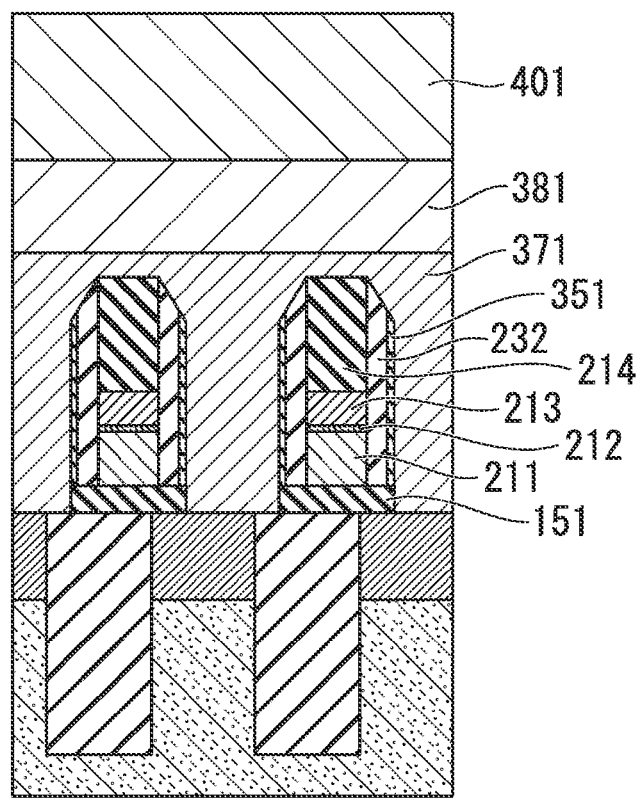
FIG. 35B is a fragmentary cross sectional elevation view of the same step as in FIG. 35A, taken along an X1-X1' line of FIG. 34A, in accordance with the second preferred embodiment of the present invention.
Figure 35C:
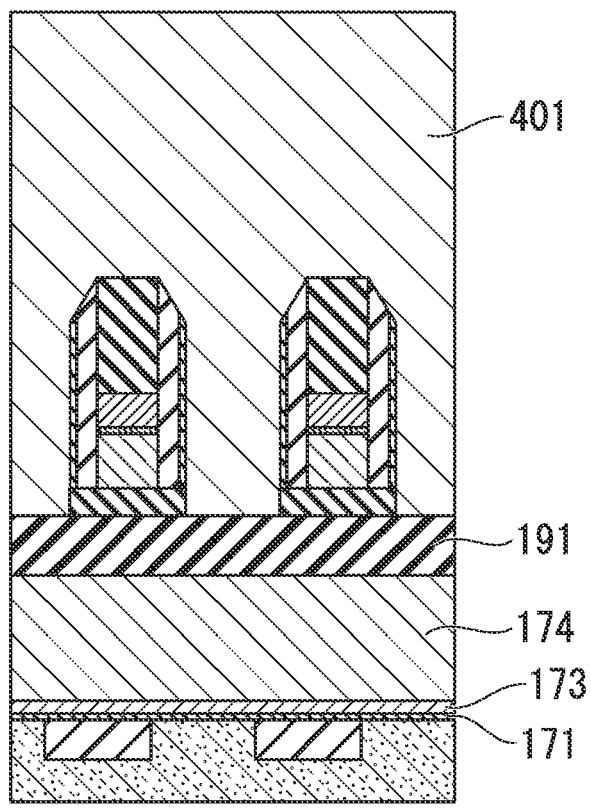
FIG. 35C is a fragmentary cross sectional elevation view of the same step as in FIG. 35A, taken along an X2-X2' line of FIG. 34A, in accordance with the second preferred embodiment of the present invention.
Figure 35D:
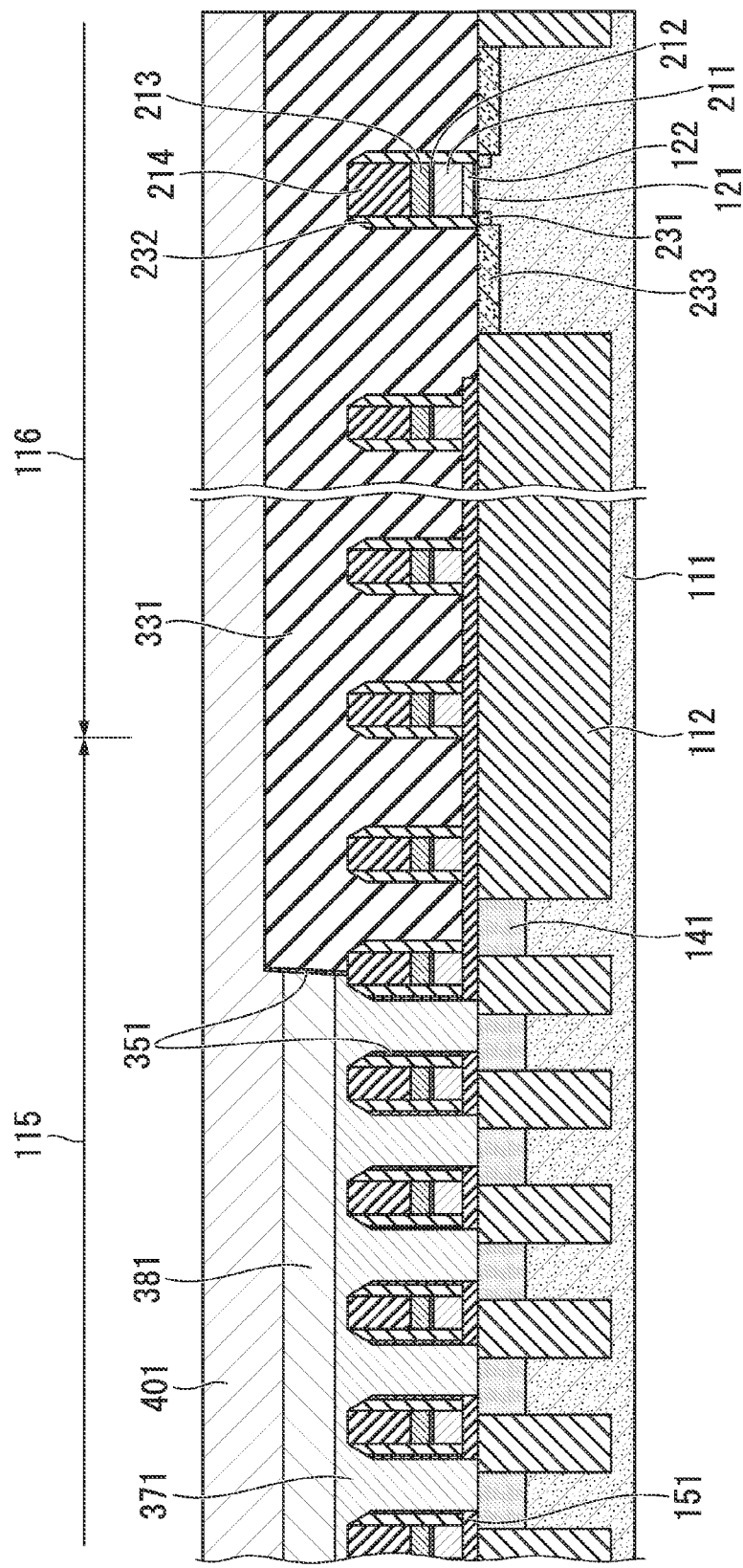
FIG. 35D is a fragmentary cross sectional elevation view of the same step as in FIG. 35A, in accordance with the second preferred embodiment of the present invention.
Figure 36A:
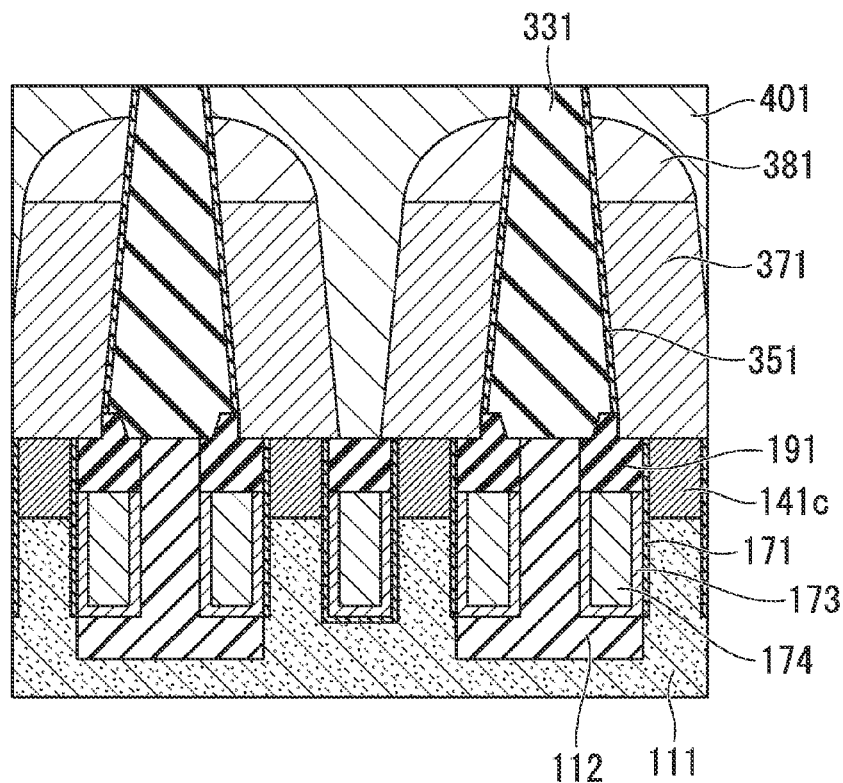
FIG. 36A is a fragmentary cross sectional elevation view of a step, subsequent to the step of FIGS. 35A through 35D, taken along an Y1-Y1' line of FIG. 34A, involved in a method of forming a semiconductor device, in accordance with the third preferred embodiment of the present invention.
Figure 36B:
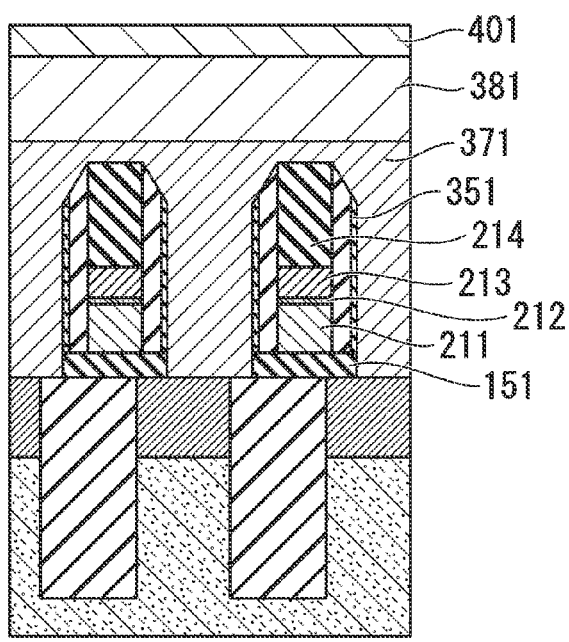
FIG. 36B is a fragmentary cross sectional elevation view of the same step as in FIG. 36A, taken along an X1-X1' line of FIG. 34A, in accordance with the second preferred embodiment of the present invention.
Figure 36C:
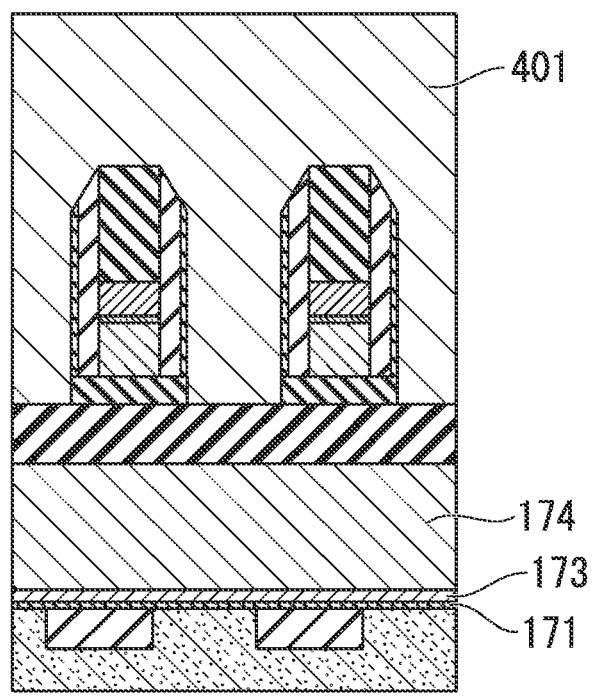
FIG. 36C is a fragmentary cross sectional elevation view of the same step as in FIG. 36A, taken along an X2-X2' line of FIG. 34A, in accordance with the second preferred embodiment of the present invention.
Figure 36D:
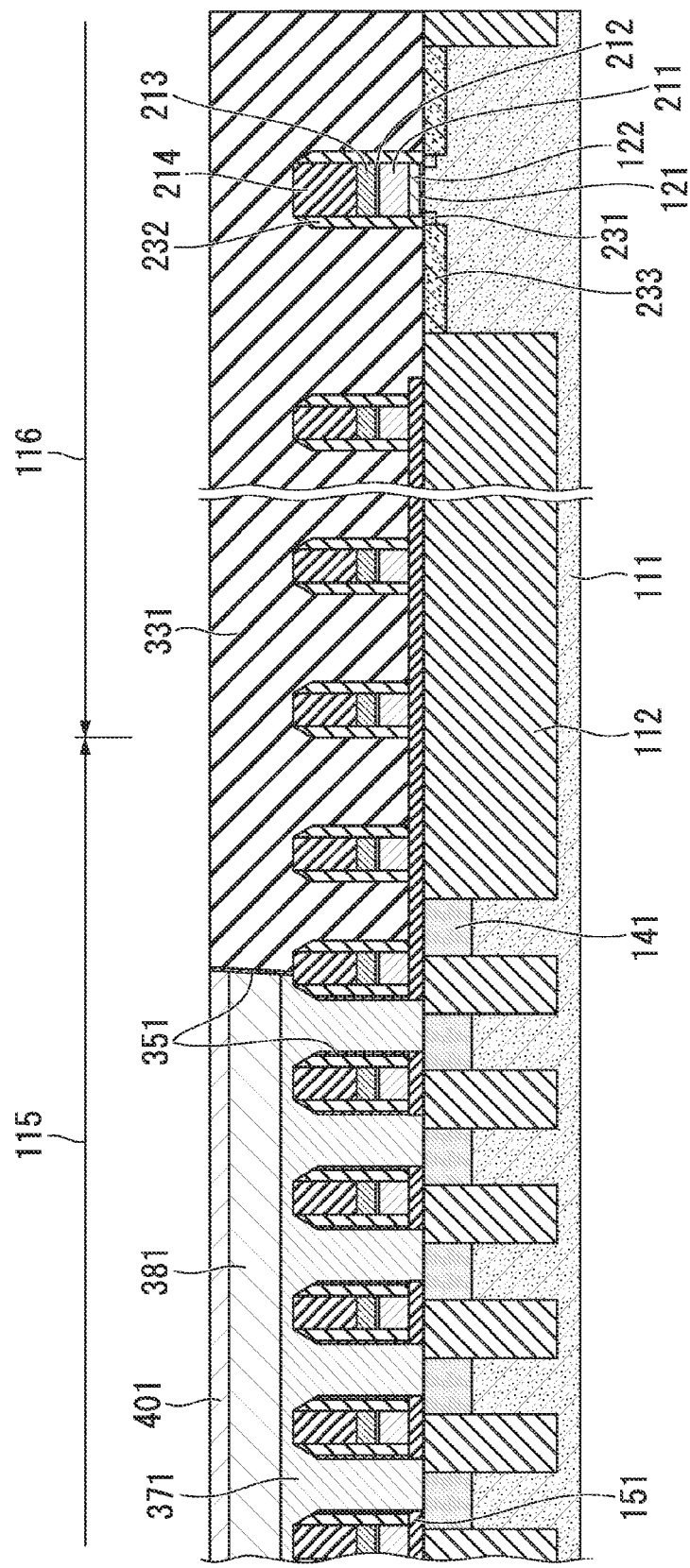
FIG. 36D is a fragmentary cross sectional elevation view of the same step as in FIG. 36A, in accordance with the second preferred embodiment of the present invention.
Figure 37A:
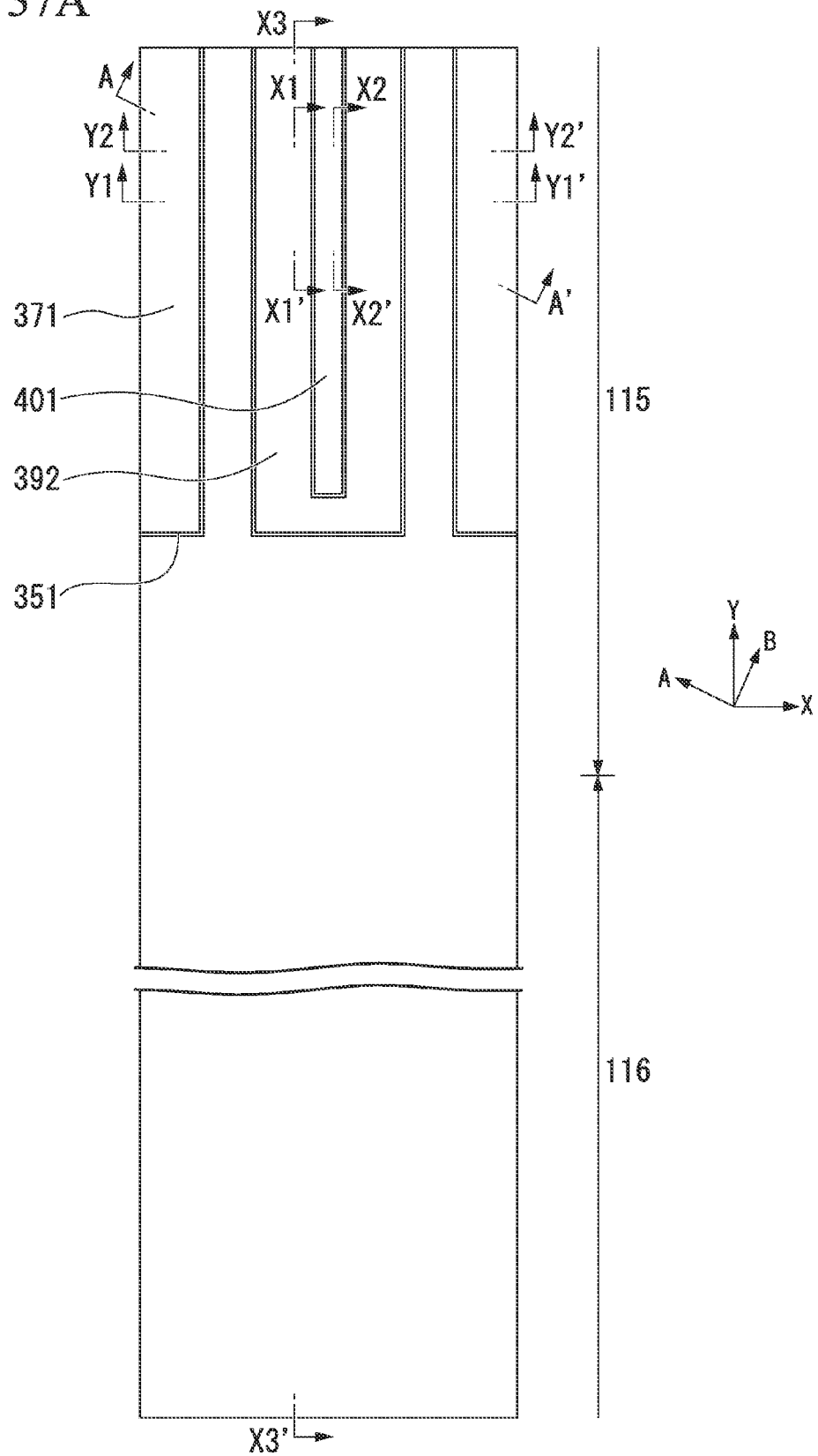
FIG. 37A is a fragmentary plain view of a step, subsequent to the step of FIGS. 36A through 36D, involved in the method of forming the semiconductor device, in accordance with the third preferred embodiment of the present invention.
Figure 37B:
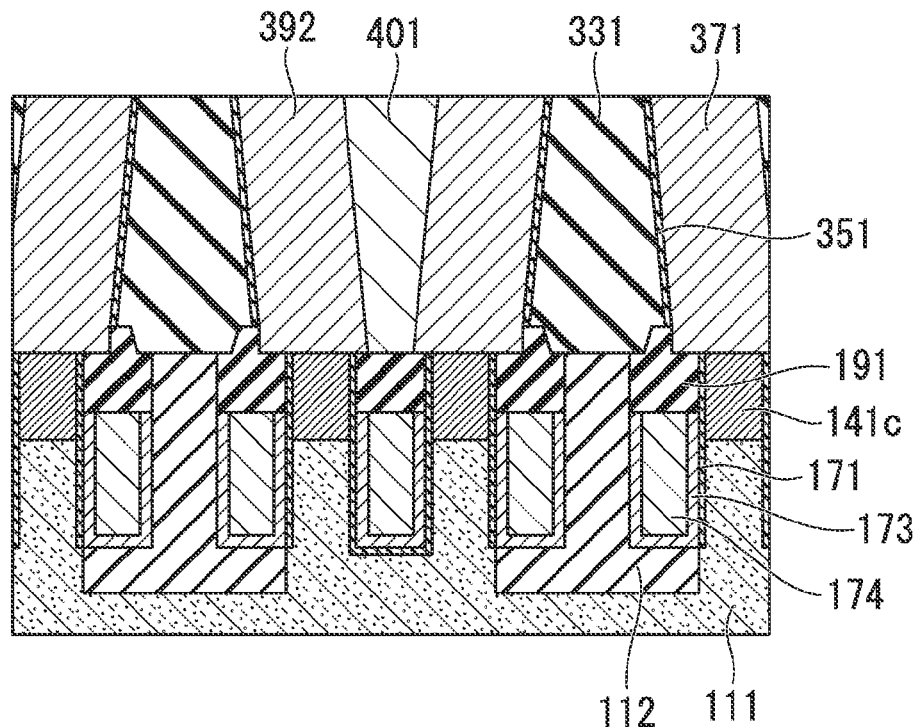
FIG. 37B is a fragmentary cross sectional elevation view of the same step as in FIG. 37A, taken along an Y1-Y1' line of FIG. 37A, in accordance with the third preferred embodiment of the present invention.
Figure 37C:
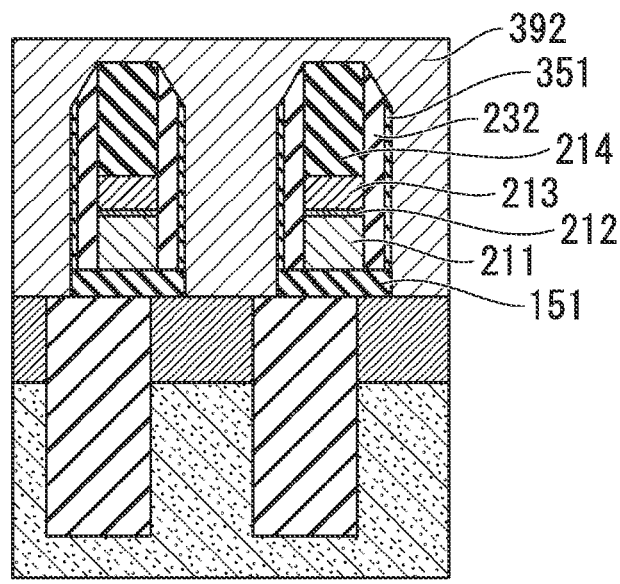
FIG. 37C is a fragmentary cross sectional elevation view of the same step as in FIG. 37A, taken along an X1-X1' line of FIG. 37A, in accordance with the third preferred embodiment of the present invention.
Figure 37D:
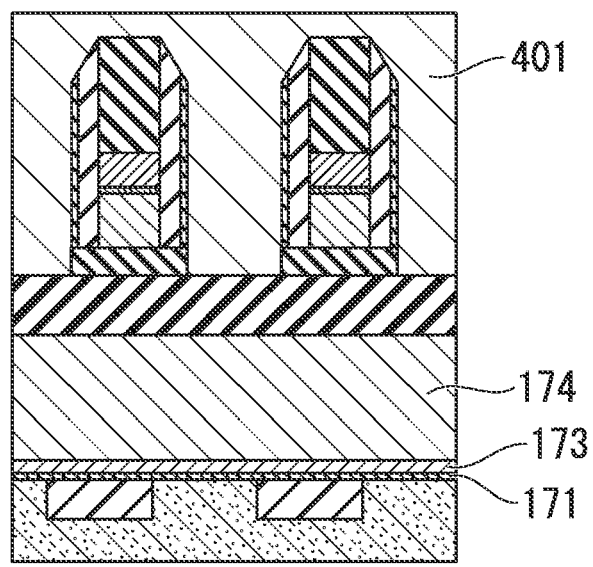
FIG. 37D is a fragmentary cross sectional elevation view of the same step as in FIG. 37A, taken along an X2-X2' line of FIG. 37A, in accordance with the third preferred embodiment of the present invention.
Figure 37E:
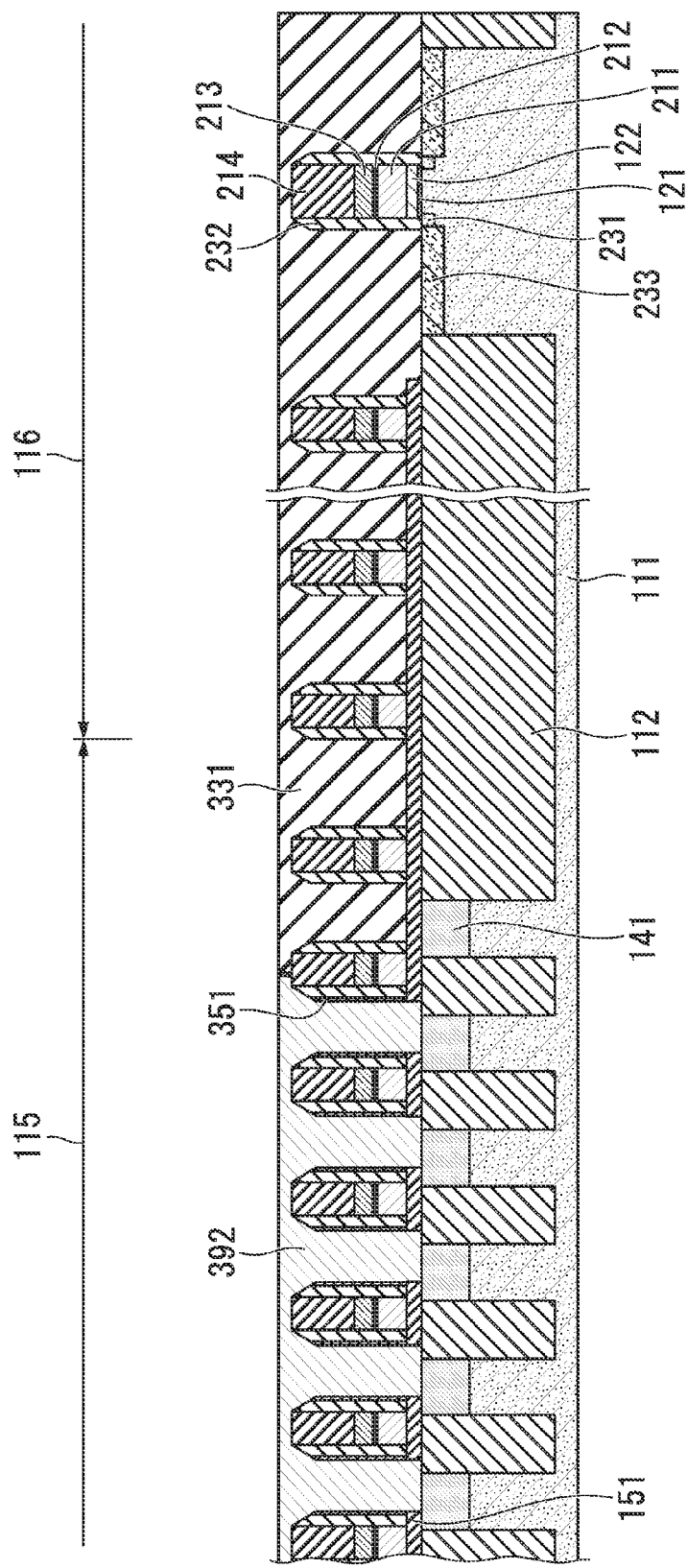
FIG. 37E is a fragmentary cross sectional elevation view of the same step as in FIG. 37A, in accordance with the third preferred embodiment of the present invention.
Figure 38A:
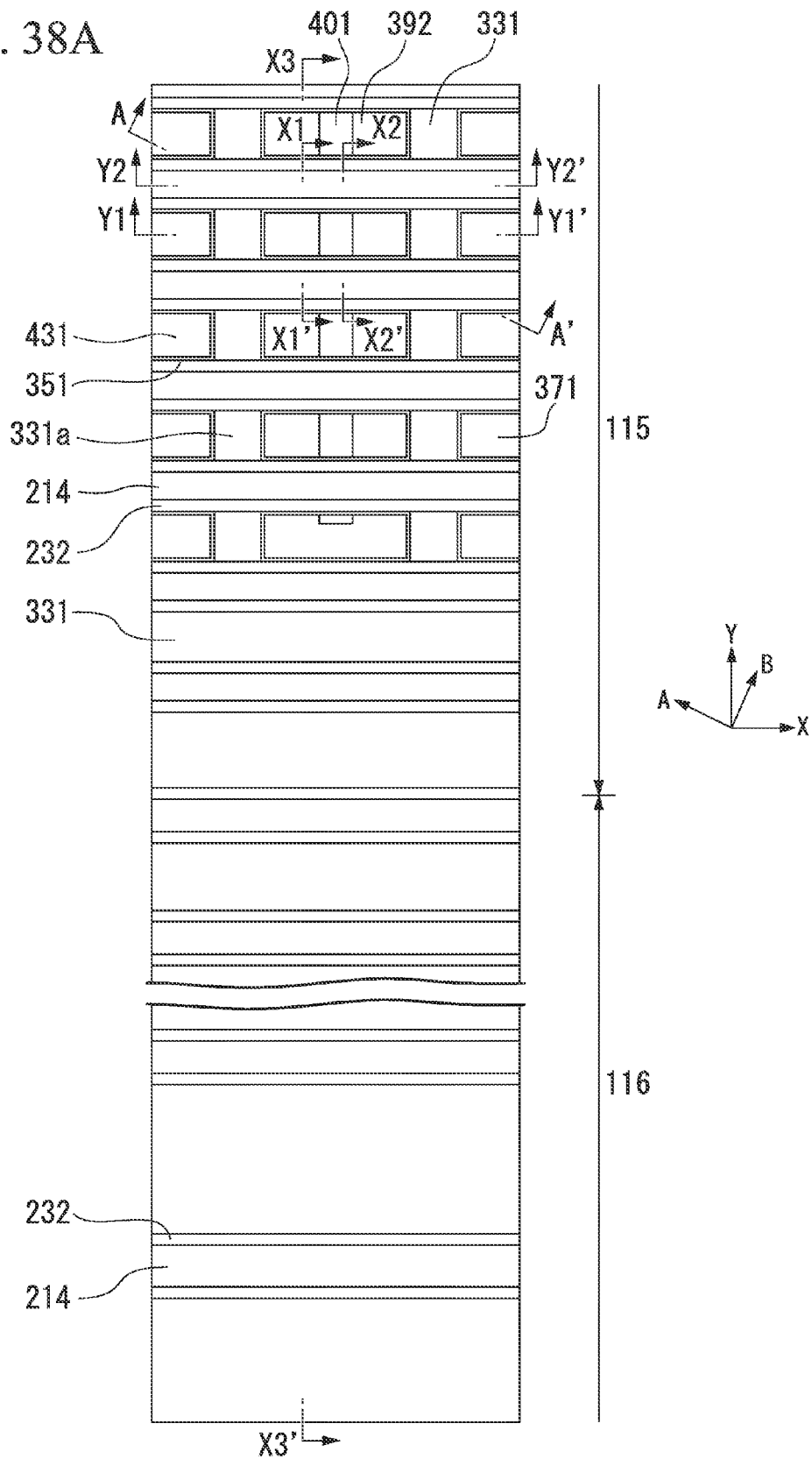
FIG. 38A is a fragmentary plain view of a step, subsequent to the step of FIGS. 37A through 37E, involved in the method of forming the semiconductor device, in accordance with the third preferred embodiment of the present invention.
Figure 38B:
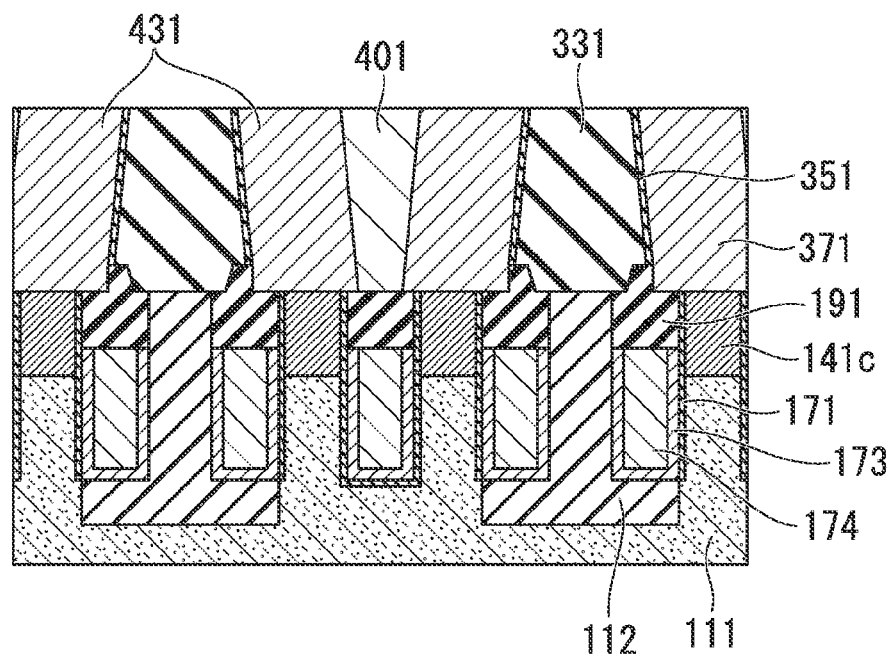
FIG. 38B is a fragmentary cross sectional elevation view of the same step as in FIG. 38A, taken along an Y1-Y1' line of FIG. 38A, in accordance with the third preferred embodiment of the present invention.
Figure 38C:
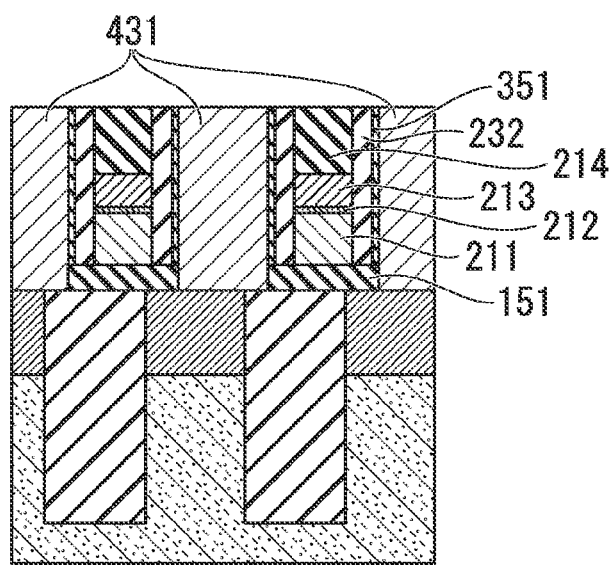
FIG. 38C is a fragmentary cross sectional elevation view of the same step as in FIG. 38A, taken along an X1-X1' line of FIG. 38A, in accordance with the third preferred embodiment of the present invention.
Figure 38D:
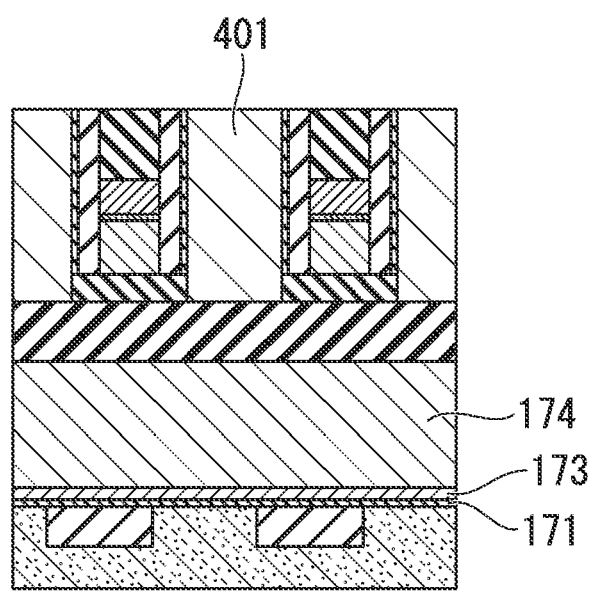
FIG. 38D is a fragmentary cross sectional elevation view of the same step as in FIG. 38A, taken along an X2-X2' line of FIG. 38A, in accordance with the third preferred embodiment of the present invention.
Figure 38E:
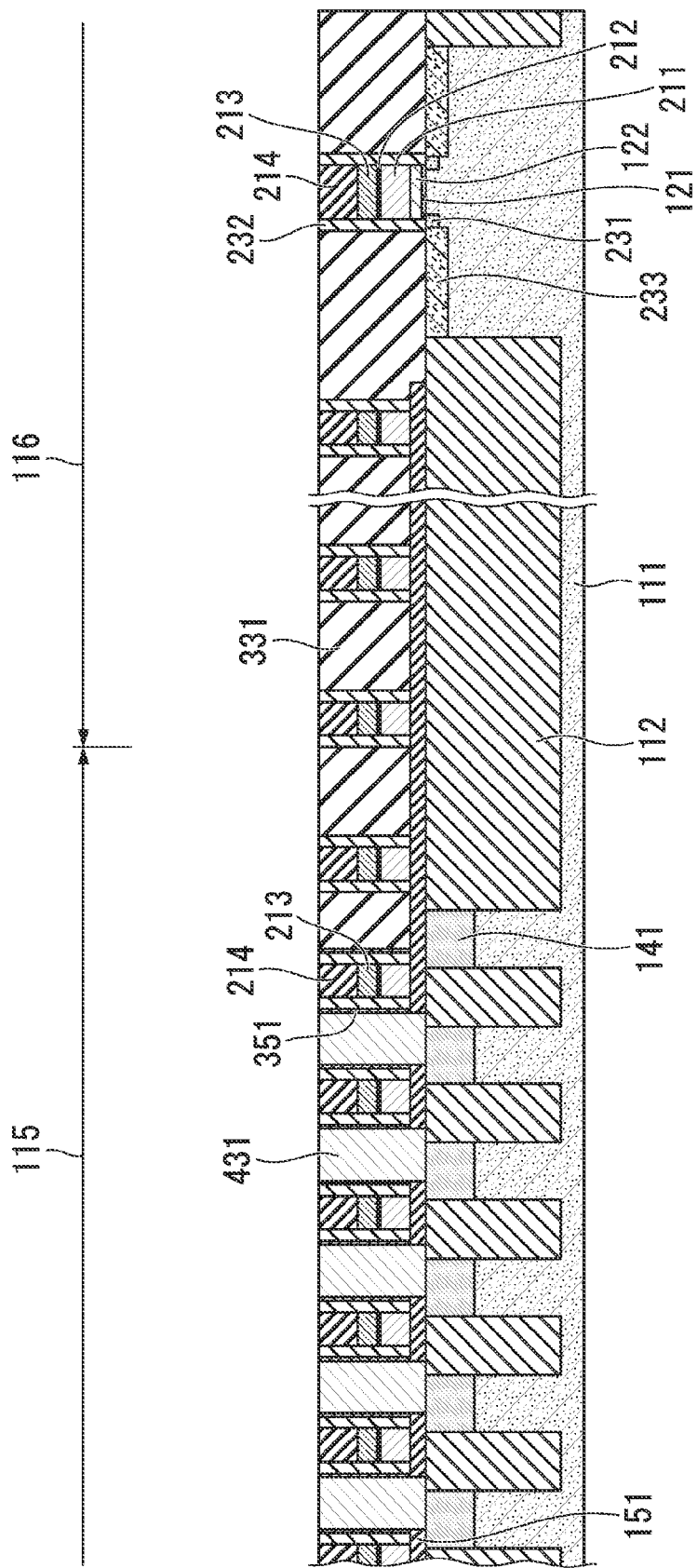

As shown in FIG. 35 to FIG. 35D, the contact conductive film separation trench 391 is buried so as to form the contact separation film (the fourth insulating film) 401. An insulation film can be used as a material of the contact separation film 401. Also, the material of the contact separation film 401 is preferably a material having a polishing rate in the next contact plug formation process step that is approximately the same as the polishing rate of third side wall film 381, and more preferably a material that is the same as the material of the third side wall film 381. This is because, in the next contact plug formation process step, polishing to remove the contact separation film 401 and the third side wall film 381 is performed and, from the standpoint of controllability, it is preferable that these films are formed of materials having equivalent polishing rates. In the method for manufacturing a semiconductor device according to the present embodiment, a silicon nitride film is used as the material of the contact separation film 401, in the same manner as the third side wall film 381. The film thickness of the contact separation film 401 is preferably approximately 100 nm. Also, in the case in which the third side wall film 381 is formed by a silicon oxide film, the contact separation film 401 is preferably formed by a silicon oxide film.

The contact separation film 401 is formed so as to cover over the contact conductive film 392 and the pillar-shaped first interlayer film 331a in the cell region 115, and cover over the first interlayer film 331 in the peripheral circuit region 116.

By CMP with respect to the contact separation film 401, the third side wall film 381, the first interlayer film 331, and the interconnect-shaped contact conductive film 392, polishing is performed using the following described three steps, S1 to S3. By these polishing process steps, a capacitor contact made from the contact conductive film which is separated for each drain diffusion layer 141c is formed.

The step S1 will first be described. The contact separation film 401, as shown in FIG. 36A to 36D, is formed on the overall upper surface. The contact separation film 401 is polished so as to the upper surface of the first interlayer film 331. The film being polished in step S1 is the contact separation film 401. In the method for manufacturing a semiconductor device according to the present embodiment, the material of the contact separation film 401 is a silicon nitride film.

By proceeding through this polishing, the first interlayer film 331 is exposed from the cell region 115 to the peripheral circuit region 116. In the cell region 115, the contact separation film 401 which is buried within the capacitor contact aperture 352 is exposed.

Although a second side wall 351 is formed at the side wall of the first interlayer film 331 of the capacitor contact aperture part 352, because it is a very thin film compared with the other films, it is easily polished. Given this, it will not be specifically referred to in the descriptions of the polishing method of steps S1, S2 and S3. The thickness of the second side wall 351 is preferably approximately 5 nm.

The step S2 will be described. Polishing is done with respect to the first interlayer film 331, the contact separation film 401, and the third side wall film 381, as shown in FIG. 37A to 37E, the polishing being done so as to expose the upper surface of the contact conductive film 392.

The films polished in the step S2 are compound films made of three types of films, these being the first interlayer film 331, the contact separation film 401, and the third side wall film 381. The materials of the compound film in the method for manufacturing a semiconductor device of the present embodiment are two types of films, these being a silicon oxide film and a silicon nitride film.

This polishing is done so that the height of the cell region 115 and the height of the peripheral circuit region 116 are substantially the same height. For this reason, polishing is done under conditions such that the polishing rate with respect to a plurality of types of films polished is approximately the same. In the polishing process step of the present embodiment, conditions are used under which the polishing rate of a silicon oxide film and the polishing rate of a silicon nitride film are approximately the same. Specifically, the ratio between the polishing rate of a silicon oxide film and the polishing rate of a silicon nitride film under such polishing conditions is preferably 1 to 0.6:1 to 0.6.

On the surface of the substrate after polishing, the first interlayer film 331 is formed over the cell region 115 to the peripheral circuit region 116. The contact conductive film 392 and the contact separation film 401 are buried into the inside of the capacitor contact aperture part 352 so as to be exposed at the cell region 115.

Because the polishing conditions in the step S2 can be applied to the polishing in Step 1, steps S1 and S2 can be performed as one step. As a result, it is possible to reduce the time accompanying the transition between steps, and to simplify the control of the polishing conditions, and it is possible to increase productivity of the semiconductor device.

The step S3 will be described. In this step, the main polishing and the over-polishing are performed. By the main polishing, the contact conductive film 392, the first interlayer film 331, and the contact separation film 401 are polished down, so as to expose the upper surface of the bit line capacitor film 214 that had been covered by the interconnect-shaped contact conductive film 392. By the over-polishing, the bit line capacitor film 214 is polished down. By proceeding through these polishing process steps, as shown in FIG. 38A to 38E, a contact conducting film 392 which straddles across the bit lines 224 that had been formed as a continuous film in the Y direction is separated by the bit line capacitor film 214. Also, one contact conducting film 431 is formed for each drain diffusion layer 141c so as to form the capacitor contact.

The film polished in this polishing has substantially the same structure as the film polished in the process step as shown in FIG. 24A to FIG. 24D according to the first embodiment. Although in the process step as shown in FIG. 24A to FIG. 24D the first interlayer film 241 (the pillar-shaped first interlayer film 241a) is formed over the element separation gate trench, in the step S3 of the present embodiment the contact separation film 401 is formed over the element separation gate trench.

A silicon nitride film is used as the material of the contact separation film 401 in the method for manufacturing a semiconductor device according to the present embodiment, and this differs from the silicon oxide film as the material of the pillar-shaped first interlayer film 241a in the method for manufacturing a semiconductor device according to the first embodiment. However, because, in the over-polishing of the polishing process step as shown in FIG. 24A to 24D a silicon oxide film and a silicon nitride film are polished at approximately the same polishing rate, even if the pillar-shaped first interlayer film 241a is changed to the contact separation film 401, it is possible to do the polishing process step of the step S3 under the same conditions as the polishing process steps shown in FIG. 24A to FIG. 24D.

Also, in the case of the material forming the contact separation film 401 is the same material as the pillar-shaped first interlayer film 241a, (for example, a silicon oxide film), the structure of the film polished is substantially the same as the structure of the film polished in the DRAM 1000. Therefore, the step S3 may be performed substantially as the same polishing process step as that shown in FIG. 24A to 24D according to the first embodiment.

In the method for manufacturing a semiconductor device according to the third embodiment, the material of the contact separation film 401 is constituted by the material of the first interlayer film 331 or the material of the bit line capacitor film 214. By virtue of this constitution, the conditions in the polishing process step as shown in FIG. 24A to 24D can be applied to the polishing in the method for manufacturing a semiconductor device according to the present embodiment, erosion therefore being suppressed in the cell region 115.

Moreover, a material of the first interlayer film 331 or the bit line capacitor film 214 is used as the material of the third side wall film 381, thereby enabling each of the steps S1, S2 and S3 to be performed under the same polishing conditions. In this case, it is possible to perform a sequence polishing with the same slurry, thereby enabling elimination of the time for switching slurries, and achieving a reduction of manufacturing cost by virtue of economizing the expenditure for the material cost of the slurry. In the method for manufacturing a semiconductor device according to the present embodiment, a silicon nitride film is used as the third side wall film 381 and the same polishing conditions are used in steps S1 to S3.

Figure 39A:
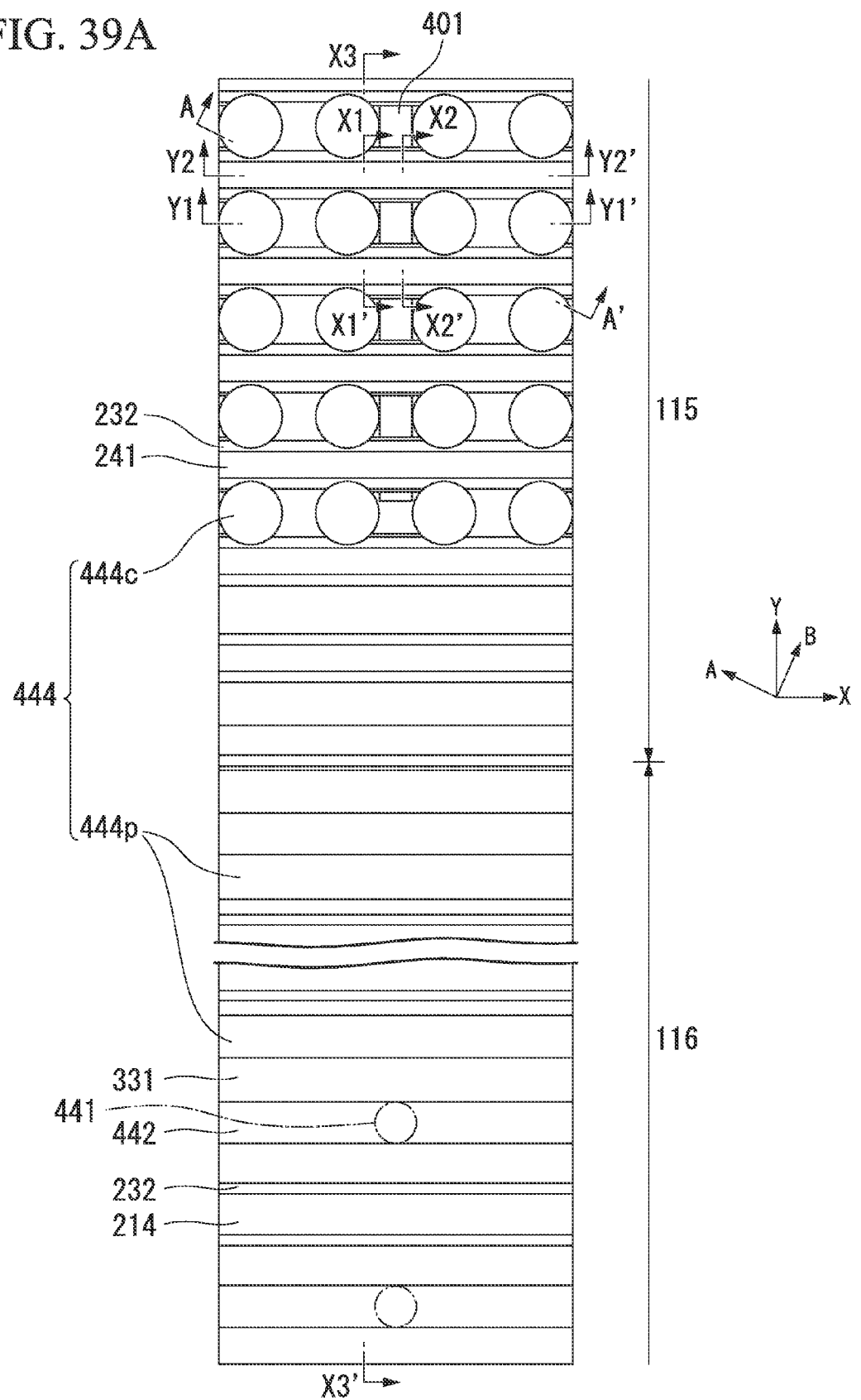
Figure 39B:
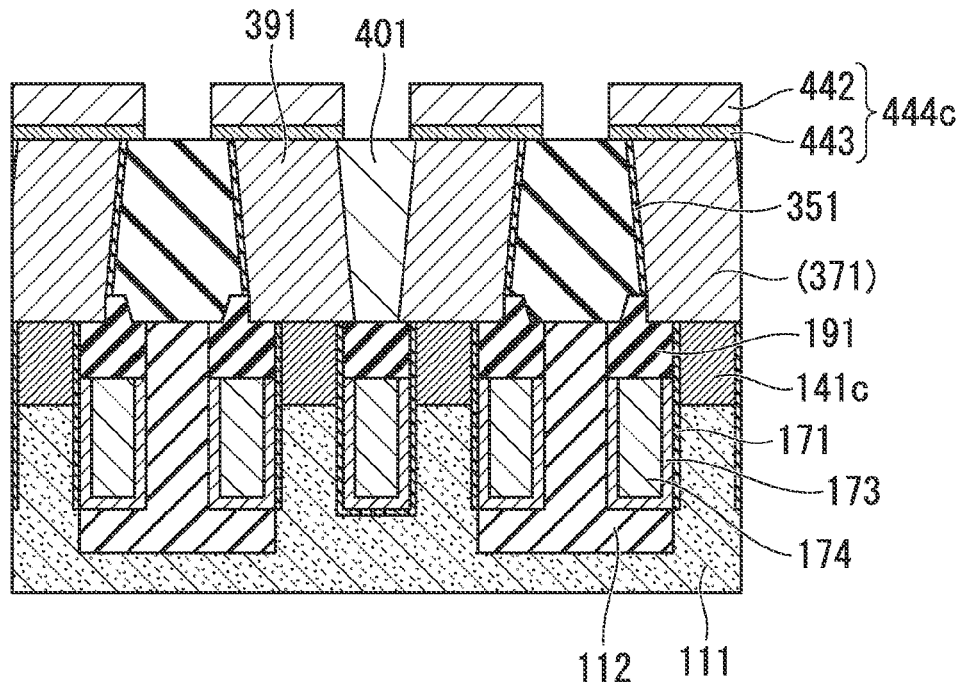
Figure 39C:
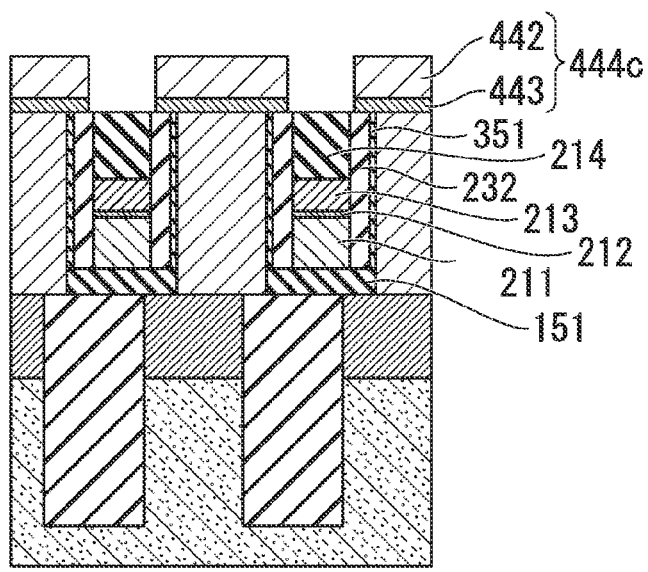

Similar to the same process step in the method for manufacturing a semiconductor device according to the first embodiment as shown in FIG. 20 and thereafter, as shown in FIG. 39A to 39C, a second interconnect 444 made from a peripheral contact plug 441, a second interconnect base film 442, and a second interconnect main interconnect film 443 are formed. By this process step, a DRAM 2000 is completed.

By the above-described manufacturing process step, in the same manner as in the DRAM 1000, global planarization is done over both the cell region 115 and the peripheral circuit region 116 of the DRAM 2000. As a result, it is possible to form the second interconnect with good yield.

EXAMPLES

As an example of the embodiment of the present invention, a DRAM 1000 was manufactured by the method for manufacturing a semiconductor device according to the first embodiment. When this manufacturing was done, a plurality of slurries were prepared with different chemical components. In the polishing process steps shown in FIG. 24A to FIG. 24D, a verification was performed of the influence of these slurries on the step between the cell region and the peripheral circuit region of the DRAM 1000.

In the comparison example and example of the present invention discussed below, the polishing conditions were a platen and head rotational speed of 60 rpm and a pressure of 140 hPa. Colloidal silica particles were used in the polishing agent.

Comparison Example

Materials having the etching rates shown in Table 1 were used as the convention slurry, performing a polishing process as shown in FIG. 24A to 24D. These slurries have a fast polishing rate with respect to a silicon oxide film and a polysilicon film, and a slow polishing rate with respect to a silicon nitride film. The selectivity ratio between a silicon oxide film and a polysilicon film is 1:1.23, and between a silicon nitride film and a polysilicon film is 1:1.49. The slurries used in this comparison example had a relatively large polishing rate with respect to a silicon nitride film.

Example

Using slurries having the etching rates as shown in Table 1, the polishing process steps shown in FIG. 24A to FIG. 24D were performed. The selectivity ratio of these slurries between a silicon oxide film and a polysilicon film is 1:0.19 and between a silicon nitride and a polysilicon film is 1:0.09.

Figure 40:
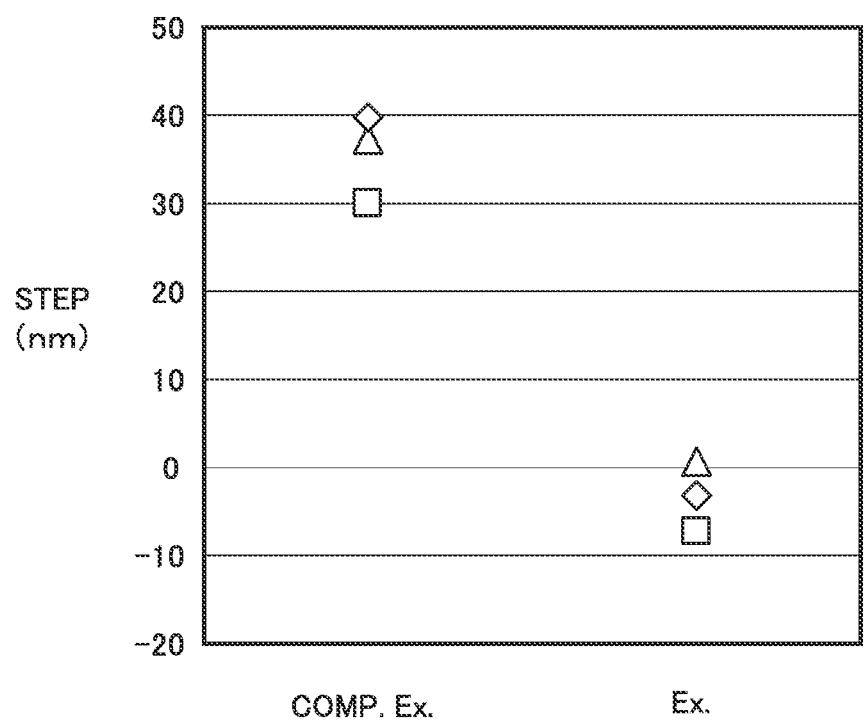

FIG. 40 is a graph showing the step between the cell region and the peripheral circuit region of the DRAM 1000 in the comparison example and the embodiment example after polishing the substrate surface by the process steps shown in FIG. 24A to FIG. 24D. The three plots for the comparison example and the embodiment example show the measured values of the steps on the surface region of the DRAM 1000, diamonds, squares, and triangles indicating the values at the three points at the center, the middle, and the edge.

As shown in FIG. 40, between the cell region and the peripheral circuit region of the DRAM 1000 fabricated by the polishing steps using conventional slurry, a step of approximately 30 to 40 nm occurred. This step is thought to occur because of an erosion phenomenon. In contrast, in the DRAM fabricated by the polishing step using a slurry that satisfies the polishing conditions of the present invention, the step between the cell region and the peripheral circuit region in the DRAM 1000 was -10 to 0 nm.

From these results, it can be seen that, according to the method for manufacturing a semiconductor device according to the present invention, the problem of the occurrence of erosion in the cell region is solved, and there is a noticeable reduction in the step between the cell region and the peripheral circuit region of the semiconductor device.

TABLE 1

| Material | Etching Rate (nm/minute) | | |
|---|---|---|---|
| | SiN | SiO$_2$ | Poly-Si |
| Comparison Example | 53.2 | 64.3 | 79 |
| Embodiment Example | 70.8 | 34.6 | 6.6 |

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A method of forming a semiconductor device, the method comprising:
    forming a first interconnect structure over a semiconductor substrate, the first interconnect structure comprising a first interconnect and a first insulating film, the first insulating film covering the first interconnect;
    forming a second insulating film covering the first interconnect structure and the semiconductor substrate;
    forming a first opening in the second insulating film, the opening exposing the first interconnect structure and the semiconductor substrate;
    forming a first conductive film in the first opening and over the second insulating film; and
    carrying out a chemical mechanical polishing process, to form a first contact plug in the first opening, under condition that a first polishing rate of the first insulating film is greater than a second polishing rate of the first conductive film, and that a third polishing rate of the second insulating film is greater than the second polishing rate of the first conductive film,
    wherein the first interconnect comprises a first bit line, and the first interconnect structure further comprises a second bit line adjacent to the first bit line, and the first opening is positioned between the first and second bit lines.

2. The method according to claim 1, wherein the first polishing rate is substantially the same as the third polishing rate.

3. The method according to claim 1, wherein carrying out the chemical mechanical polishing process comprises:
    carrying out a first chemical mechanical polishing process to polish the second insulating film and the first conductive film to expose the first insulating film, the first chemical mechanical polishing process being carried out under condition that the third polishing rate of the second insulating film is greater than the second polishing rate of the first conductive film;
    carrying out a second chemical mechanical polishing process, after carrying out the first chemical mechanical polishing process, the second chemical mechanical polishing process being carried out to polish the first and second insulating films and the first conductive film, the second chemical mechanical polishing process being carried out under condition that the first polishing rate of the first insulating film is greater than the second polishing rate of the first conductive film, and that the third polishing rate of the second insulating film is greater than the second polishing rate of the first conductive film.

4. The method according to claim 1, further comprising: etching back the first conductive film so that a top surface of the first conductive film is higher than a top surface of the first insulating film and lower than a top surface of the second insulating film, the etching back being carried out before carrying out the chemical mechanical polishing process.

5. The method according to claim 1, wherein the chemical mechanical polishing process is carried out using a polishing agent which includes at least one of polishing particles, a polymer compound, and an inorganic acid.

6. The method according to claim 5, wherein the polishing particles comprise at least one of silica particles, alumina particles, and colloidal particles.

7. The method according to claim 5, wherein the inorganic acid includes one of a nitric acid and a phosphoric acid, and the inorganic acid is in a range of pH from 2 to 3.

8. The method according to claim 1, wherein the first insulating film comprises a silicon nitride film.

9. The method according to claim 1, wherein the second insulating film comprises one of a silicon oxide film and a BPSG film.

10. The method according to claim 9, wherein the silicon oxide film is formed by a chemical vapor deposition method.

11. The method according to claim 9, wherein the silicon oxide film is formed by a spin-on-dielectric method.

12. The method according to claim 1, further comprising:
etching back the first conductive film so that a top surface of the first conductive film is higher than a top surface of the first insulating film and lower than a top surface of the second insulating film;
forming a third insulating film over the first conductive film and the second insulating film;
etching back the third insulating film to form side walls of the third insulating film on side surfaces of the second insulating film;
forming a second opening in the first conductive film to have the first conductive film remain on side walls of the second insulating film, the second opening exposing the semiconductor substrate; and
forming a fourth insulating film in the second opening and over the second insulating film and the side walls of the third insulating film.

13. The method according to claim 12, wherein carrying out the chemical mechanical polishing process to form the contact plug comprises:
carrying out the chemical mechanical polishing process for polishing the second, third and fourth insulating films and the first conductive film to expose the first insulating film, the chemical mechanical polishing process being under conditions that the first polishing rate of the first insulating film, the third polishing rate of the second insulating film, a fourth polishing rate of the third insulating film and a fifth polishing rate of the fourth insulating film are greater than the second polishing rate of the first conductive film.

14. The method according to claim 1, wherein the second insulating film is formed to substantially cover a peripheral region, and partially cover a memory cell region, of the semiconductor substrate.

15. A method of forming a semiconductor device, the method comprising:
preparing a multi-layered structure over a semiconductor substrate, the multi-layered structure comprising first and second patterns of a first insulating film; a second insulating film covering the first pattern of the first insulating film, and a first conductive film covering the second pattern of the first insulating film; and
polishing the second insulating film and the first conductive film under conditions that the first and second insulating films are greater in polishing rate than the first conductive film, to expose the first and second patterns of the first insulating film,
wherein polishing the second insulating film and the first conductive film comprises:
carrying out a first chemical mechanical polishing process to polish the second insulating film and the first conductive film under condition that the second insulating film is greater in polishing rate than the first conductive film; and
carrying out a second chemical mechanical polishing process after carrying out the first chemical mechanical polishing process, the second chemical mechanical polishing process being carried out to polish the first and second insulating films and the first conductive film under condition that the first and second insulating films are greater in polishing rate than the first conductive film.

16. The method according to claim 15, further comprising: etching back the first conductive film so that a top surface of the first conductive film is higher than top surfaces of the first and second patterns of the first insulating film and is lower than a top surface of the second insulating film, etching back the first conductive film being carried out before polishing the second insulating film and the first conductive film.

17. The method according to claim 15, wherein preparing the multi-layered structure comprises:
forming first and second interconnect patterns over the semiconductor substrate, the first interconnect pattern including a first interconnect and the first pattern of the first insulating film, the second interconnect pattern including a second interconnect and the second pattern of the first insulating film, the first and second patterns of the first insulating film covering the first and second interconnects, respectively;
forming the second insulating film over the first and second interconnect patterns and over the semiconductor substrate;
forming a first opening in the second insulating film, the first opening exposing the second interconnect pattern; and
forming the first conductive film in the first opening, the first conductive film covering the second interconnect pattern.

18. The method according to claim 15, wherein the first insulating film comprises a silicon nitride film and the second insulating film comprises one of a silicon oxide film and a BPSG film.

19. The method according to claim 15, wherein preparing the multi-layered structure comprises:
forming the second insulating film to substantially cover a peripheral region, and partially cover a memory cell region, of the semiconductor substrate.

20. A method of forming a semiconductor device, the method comprising:
forming first and second interconnect structures in a memory cell region and a peripheral region respectively of a semiconductor substrate, the first interconnect structure comprising a first interconnect and a first pattern of a first insulating film, the first pattern of the first insulating film covering the first interconnect, the second interconnect structure comprising a second interconnect and a second pattern of the first insulating film, the second pattern of the first insulating film covering the second interconnect;

forming a second insulating film over the first and second interconnect structures and over the semiconductor substrate;

forming a first opening in the second insulating film, the first opening exposing the first interconnect structure and a part of the semiconductor substrate;

forming a first conductive film in the first opening and over the second insulating film;

etching back the first conductive film to remove the first conductive film over the second insulating film and to have the first conductive film remain in the first opening, so that a top surface of the first conductive film is higher than top surfaces of the first and second interconnect structures and lower than a top surface of the second insulating film;

forming a third insulating film over the first conductive film and over the second insulating film;

etching back the third insulating film to form side walls of the third insulating film on side wall surfaces of the second insulating film;

selectively removing the first conductive film by using the side walls of the third insulating film as masks to have the first conductive film remain on side wall surfaces of the second insulating film to expose a part of the semiconductor substrate and to form a second opening in the first conductive film;

forming a fourth insulating film in the second opening and over the second insulating film; and carrying out a chemical mechanical polishing process to polish the second, third and fourth insulating films and the first conductive film to expose the first and second patterns of the first insulating films, to form a contact plug in the first opening, the chemical mechanical polishing process being carried out under conditions that the first, second, third and fourth insulating films are greater in polishing rate than the first conductive film.

* * * * *